US 012153299B2

(12) United States Patent
Morinaga et al.

(10) Patent No.: US 12,153,299 B2
(45) Date of Patent: Nov. 26, 2024

(54) LIQUID CRYSTAL PANEL

(71) Applicant: Sharp Display Technology Corporation, Kameyama (JP)

(72) Inventors: Junichi Morinaga, Kameyama (JP); Hikaru Yoshino, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 63 days.

(21) Appl. No.: 18/083,239

(22) Filed: Dec. 16, 2022

(65) Prior Publication Data

US 2023/0205016 A1 Jun. 29, 2023

(30) Foreign Application Priority Data

Dec. 24, 2021 (JP) ................. 2021-210185

(51) Int. Cl.
*G02F 1/1333* (2006.01)
*G02F 1/1335* (2006.01)
*G02F 1/1337* (2006.01)
*G02F 1/1339* (2006.01)
(Continued)

(52) U.S. Cl.
CPC .. *G02F 1/133357* (2021.01); *G02F 1/133345* (2013.01); *G02F 1/133512* (2013.01); *G02F 1/1337* (2013.01); *G02F 1/13394* (2013.01); *G02F 1/1343* (2013.01);
(Continued)

(58) Field of Classification Search
CPC ......... G02F 1/134372; G02F 1/136286; G02F 1/1337; G02F 1/133357; G02F 2201/48; G02F 1/13392; G02F 1/13394; G02F 1/13396; G02F 1/133512; G02F 1/136209; H01L 27/124

See application file for complete search history.

(56) References Cited

U.S. PATENT DOCUMENTS 9,618,805 B2    4/2017  Woo et al.
2001/0033354 A1  10/2001  Kodate et al.
(Continued)

FOREIGN PATENT DOCUMENTS

JP    2001330841 A    11/2001

*Primary Examiner* — Jia X Pan
(74) *Attorney, Agent, or Firm* — ScienBiziP, P.C.

(57) ABSTRACT

A liquid crystal panel includes an array substrate, a counter substrate disposed to face the array substrate, and a liquid crystal layer sandwiched between the array substrate and the counter substrate, in which the array substrate is provided with a plurality of pixel electrodes aligned at intervals in a plane of the array substrate, a common electrode disposed to overlap the plurality of pixel electrodes, an insulating film disposed on an upper layer side of the common electrode, and an alignment film disposed on an upper layer side of the insulating film, a light blocking portion and a spacer are provided in the counter substrate, the light blocking portion separating the plurality of pixel electrodes, the spacer being disposed to overlap the light blocking portion and protruding to the liquid crystal layer side from the counter substrate, the alignment film is connected to the common electrode directly or via another member through an opening provided in the insulating film, and the opening is disposed at a position that does not overlap the spacer and overlaps the light blocking portion in the insulating film.

12 Claims, 30 Drawing Sheets

(51) Int. Cl.
  *G02F 1/1343*   (2006.01)
  *G02F 1/1362*   (2006.01)
(52) U.S. Cl.
  CPC .. *G02F 1/134372* (2021.01); *G02F 1/136209* (2013.01); *G02F 1/136286* (2013.01)

(56) References Cited

U.S. PATENT DOCUMENTS

| | | | |
|---|---|---|---|
| 2016/0202570 A1* | 7/2016 | Liu | G02F 1/1333 349/123 |
| 2016/0313614 A1* | 10/2016 | Woo | G02F 1/133345 |
| 2019/0227391 A1* | 7/2019 | Kamitani | G02F 1/136286 |
| 2020/0159354 A1* | 5/2020 | Yoshida | G02F 1/1333 |

\* cited by examiner

LIQUID CRYSTAL PANEL

CROSS-REFERENCE TO RELATED APPLICATIONS

This application claims the benefit of priority to Japanese Patent Application Number 2021-210185 filed on Dec. 24, 2021. The entire contents of the above-identified application are hereby incorporated by reference.

BACKGROUND

Technical Field

The techniques described herein relate to a liquid crystal panel.

In the related art, a liquid crystal display device disclosed in JP 2001-330841 A is known as an example of a liquid crystal display device. The liquid crystal display device disclosed in JP 2001-330841 A includes a common wiring line, a gate wiring line, a source wiring line, and an alignment film in an outer peripheral region of a liquid crystal cell. The alignment film is insulated from the gate wiring line and the source wiring line with an insulating film interposed therebetween. The common wiring line includes a common potential exposed portion via an opening formed in the insulating film, and is electrically connected to the alignment film. Since a common potential close to an average potential of a cell is supplied to the alignment film, a screen display failure and degradation caused by impurity ions remaining on the surface or inside the alignment film can be prevented.

SUMMARY

In the liquid crystal display device disclosed in JP 2001-330841 A described above, the opening is formed in the insulating film for electrically connecting the common potential exposed portion of the common wiring line to the alignment film. The alignment film includes a first portion in contact with the common potential exposed portion and a second portion layered on the insulating film, and a step is formed between the first portion and the second portion. When such a step is generated in the alignment film, an alignment failure occurs in liquid crystal molecules, and there is a concern that a display failure due to the alignment failure may occur.

The techniques described in this specification have been made based on the above-described circumstances, and an object thereof is to suppress a display failure.

(1) A liquid crystal panel according to the technique described in the present specification includes an array substrate, a counter substrate disposed to face the array substrate, and a liquid crystal layer sandwiched between the array substrate and the counter substrate, in which the array substrate is provided with a plurality of pixel electrodes aligned at intervals in a plane of the array substrate, a common electrode disposed to overlap the plurality of pixel electrodes, an insulating film disposed on an upper layer side of the common electrode, and an alignment film disposed on an upper layer side of the insulating film, a light blocking portion and a spacer are provided in at least one of the array substrate and the counter substrate, the light blocking portion separating the plurality of pixel electrodes, the spacer being disposed to overlap the light blocking portion and protruding to the liquid crystal layer side from at least one of the array substrate and the counter substrate, the alignment film is connected to the common electrode directly or via another member through an opening provided in the insulating film, and the opening is disposed at a position that does not overlap the spacer and overlaps the light blocking portion in the insulating film.

(2) Further, in addition to (1), in the liquid crystal panel, the array substrate may be provided with a plurality of thin film transistors aligned at intervals in a first direction and a second direction intersecting the first direction, a plurality of first wiring lines extending in the first direction and aligned at intervals in the second direction, and a plurality of second wiring lines extending in the second direction to intersect each of the plurality of first wiring lines and aligned at intervals in the first direction, the plurality of pixel electrodes may be aligned at intervals in the first direction and the second direction and connected to the plurality of thin film transistors, each of the plurality of first wiring lines may be connected to the plurality of thin film transistors aligned in the first direction, each of the plurality of the second wiring lines may be connected to the plurality of thin film transistors aligned in the second direction, the spacer may be disposed to overlap an intersection between a first wiring line of the plurality of first wiring lines and a second wiring line of the plurality of second wiring lines, and the number of the spacers installed may be smaller than the number of the intersections, and the opening may overlap at least one of the first wiring line and the second wiring line, may be disposed to be aligned with the spacer in at least one of the first direction and the second direction, and the number of the openings installed may be equal to or less than a number obtained by subtracting the number of the spacers installed from the number of the intersections.

(3) Further, in addition to (2), in the liquid crystal panel, the number of the openings installed may be a number obtained by subtracting the number of the spacers installed from the number of the intersections.

(4) Further, in addition to (2) or (3), in the liquid crystal panel, the plurality of spacers may be disposed for each of the intersections among a plurality of the intersections aligned in the first direction, and may be disposed for each of the intersections among the plurality of intersections aligned in the second direction.

(5) Further, in addition to any one of (2) to (4), in the liquid crystal panel, the light blocking portion may include a first light blocking portion extending in the first direction and overlapping each of the plurality of thin film transistors, the first wiring line, the spacer, and the opening, and a second light blocking portion extending in the second direction, overlapping the second wiring line, and having a width smaller than a width of the first light blocking portion.

(6) Further, in addition to any one of (1) to (5), in the liquid crystal panel, each of the plurality of pixel electrodes may be disposed on a lower layer side of the alignment film and on the upper layer side of the insulating film.

(7) Further, in addition to (6), in the liquid crystal panel, each of the plurality of pixel electrodes may include a portion of a transparent electrode film, and the array substrate may be provided with a connection electrode as the other member, the connection electrode including a portion of the transparent electrode film which is separate from each of the plurality of pixel electrodes, being in contact with the alignment film, and being connected to the common electrode through the opening.

(8) Further, in addition to (7), in the liquid crystal panel, the plurality of pixel electrodes may be disposed side by side at intervals in a first direction and a second direction intersecting the first direction, and the connection electrode may be positioned between two pixel electrodes of the plurality of pixel electrodes adjacent to each other in one direction of the first direction and the second direction, and not disposed between two pixel electrodes of the plurality of pixel electrodes adjacent to each other in the other direction of the first direction and the second direction.

(9) Further, in addition to (7), in the liquid crystal panel, the plurality of pixel electrodes may be disposed side by side at intervals in a first direction and a second direction intersecting the first direction, and the connection electrode may include an electrode main body positioned between two pixel electrodes of the plurality of pixel electrodes adjacent to each other in one direction of the first direction and the second direction and connected to the common electrode through the opening, and an extending portion positioned between two pixel electrodes of the plurality of pixel electrodes adjacent to each other in the other direction of the first direction and the second direction and extending from the electrode main body.

(10) Further, in addition to (9), in the liquid crystal panel, the insulating film may include a first opening and a second opening as the openings, the first opening being positioned between the two pixel electrodes adjacent to each other in the one direction of the first direction and the second direction, the second opening being positioned between the two pixel electrodes adjacent to each other in the one direction of the first direction and the second direction and disposed at a position spaced apart from the first opening in the one direction of the first direction and the second direction, the connection electrode may include a first electrode main body and a second electrode main body as the electrode main bodies, the first electrode main body being disposed to overlap the first opening and connected to the common electrode through the first opening, the second electrode main body being disposed to overlap the second opening and connected to the common electrode through the second opening, and the extending portion may be connected to the first electrode main body and the second electrode main body.

(11) Further, in addition to (9) or (10), in the liquid crystal panel, the spacer may be provided to protrude to the liquid crystal layer side from the counter substrate, the array substrate may be provided with a first flattening film disposed on a lower layer side of the common electrode, and a second flattening film disposed on the lower layer side of the alignment film and on upper layer sides of each of the plurality of pixel electrodes and the connection electrode, the first flattening film may have a film thickness larger than a film thickness of the insulating film and be disposed to overlap the spacer, the common electrode, and each of the plurality of pixel electrodes, and the second flattening film may have a film thickness larger than the film thickness of the insulating film and be disposed to overlap the spacer and the extending portion.

(12) Further, in addition to (9) or (10), in the liquid crystal panel, the common electrode may include a plurality of position detection electrodes disposed side by side at intervals in the first direction and the second direction, the array substrate may be provided with a first wiring line positioned between the two pixel electrodes adjacent to each other in the second direction and extending in the first direction, the first wiring line may be disposed on a lower layer side than the common electrode and positioned between two position detection electrodes of the plurality of position detection electrodes adjacent to each other in the second direction, and the extending portion may be positioned between the two position detection electrodes adjacent to each other in the second direction and disposed to overlap the first wiring line.

(13) Further, in addition to (12), in the liquid crystal panel, the electrode main body may be disposed not to overlap one of the two position detection electrodes adjacent to each other in the second direction and to overlap the other position detection electrode of the two position detection electrodes, and may be connected to the other position detection electrode.

(14) Further, in addition to (12) or (13), in the liquid crystal panel, the spacer may be provided to protrude to the liquid crystal layer side from the counter substrate, the array substrate may be provided with a first flattening film disposed on the lower layer side of the common electrode, and a second flattening film disposed on the lower layer side of the alignment film and on upper layer sides of each of the plurality of pixel electrodes and the connection electrode, the first flattening film may have a film thickness larger than a film thickness of the insulating film and may be disposed to overlap the spacer, the common electrode, and each of the plurality of pixel electrodes, the second flattening film may have a film thickness larger than the film thickness of the insulating film and may be disposed to overlap the spacer and the extending portion, and the first wiring line may be disposed on a lower layer side than the first flattening film.

(15) Further, in addition to any one of (6), (7), (8), (9), (10), (12), and (13), in the liquid crystal panel, the spacer may be provided to protrude to the liquid crystal layer side from the counter substrate, the array substrate may be provided with a flattening film disposed on a lower layer side of the common electrode, and the flattening film may include a first thick film portion and a second thick film portion, the first thick film portion having a film thickness larger than a film thickness of the insulating film, being disposed not to overlap the spacer, and being disposed to overlap the common electrode and each of the plurality of pixel electrodes, the second thick film portion having a film thickness larger than the film thickness of the first thick film portion and being disposed to overlap the spacer.

(16) Further, in addition to any one of (6) to (10), in the liquid crystal panel, the spacer may be provided to protrude to the liquid crystal layer side from the counter substrate, the array substrate may be provided with a first flattening film disposed on a lower layer side of the common electrode, and a second flattening film disposed on the lower layer side of the alignment film and on an upper layer side of each of the plurality of pixel electrodes, the first flattening film may have a film thickness larger than a film thickness of the insulating film and may be disposed to overlap the spacer, the common electrode, and each of the plurality of pixel electrodes, and the second flattening film may have a film thickness larger than the film thickness of the insulating film and may be disposed to overlap the spacer.

According to the techniques described in the present specification, a display failure can be suppressed.

BRIEF DESCRIPTION OF DRAWINGS

The disclosure will be described with reference to the accompanying drawings, wherein like numbers reference like elements.

DESCRIPTION OF EMBODIMENTS

First Embodiment

A first embodiment will be described with reference to FIG. 1 to FIG. 15. In the present embodiment, a liquid crystal display device 10 is exemplified. Note that an X axis, a Y axis, and a Z axis are illustrated in part of each drawing, and each axial direction is illustrated to represent a direction in each drawing.

Figure 1:
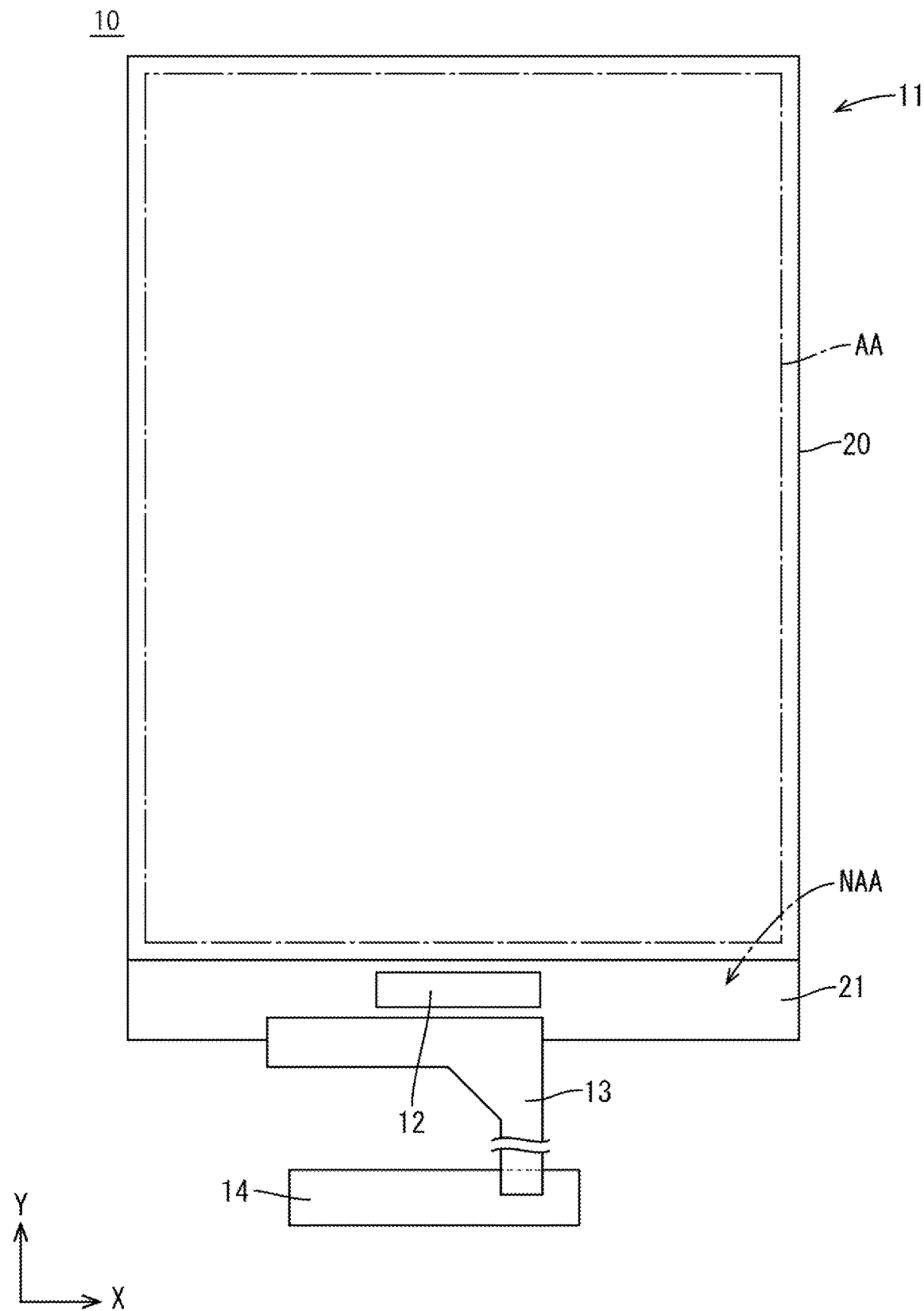
FIG. 1 is a schematic plan view illustrating a connection configuration between a liquid crystal panel, a flexible substrate, and a control circuit board constituting a liquid crystal display device according to a first embodiment.

FIG. 1 is a schematic plan view illustrating a connection configuration between a liquid crystal panel 11, a flexible substrate 13, and a control circuit board 14 constituting the liquid crystal display device 10. As illustrated in FIG. 1, the liquid crystal display device 10 includes at least the liquid crystal panel 11 and a backlight device (illumination device) that irradiates the liquid crystal panel 11 with light. A driver 12 for performing display driving and the flexible substrate 13 are mounted on the liquid crystal panel 11 with an anisotropic conductive film (ACF) interposed therebetween. A control circuit board (signal supply source) 14 that supplies various input signals from the outside to the driver 12 is connected to the flexible substrate 13. The configuration of the backlight device is as known, and includes, for example, a light source such as an LED, an optical member that converts light from the light source into planar light by applying an optical effect to the light from the light source, and the like.

In the liquid crystal panel 11, a center portion is set as a display region (active area) AA in which images can be displayed, as illustrated in FIG. 1. In the liquid crystal panel 11, an outer peripheral portion surrounding the display region AA is set as a non-display region (non-active area) NAA having a frame-like shape (picture frame shape) when viewed in a plan view. Note that, in FIG. 1, a dot-dash line represents the contour of the display region AA, and a region outside the dot-dash line is the non-display region NAA. The liquid crystal panel 11 is formed by bonding a pair of substrates 20 and 21 together. Out of the pair of substrates 20 and 21, the substrate on the front side (front face side) is a counter substrate (CF substrate) 20. Out of the pair of substrates 20 and 21, the substrate on the rear side (back face side) is an array substrate (active matrix substrate) 21. The counter substrate 20 and the array substrate 21 respectively include substantially transparent glass substrates 20GS and 21GS, and various films are layered on the inner surface sides of the glass substrates 20GS and 21GS. Note that polarizers are bonded to outer face sides of both the substrates 20 and 21, respectively. Note that, in the non-display region NAA of the array substrate 21, a pair of gate circuit portions are provided sandwiching the display region AA from both sides in the X-axis direction, but are not illustrated in the drawing. The gate circuit portions are each configured to supply a scanning signal to a gate wiring line 26 described later, and monolithically provided to the array substrate 21.

Figure 2:
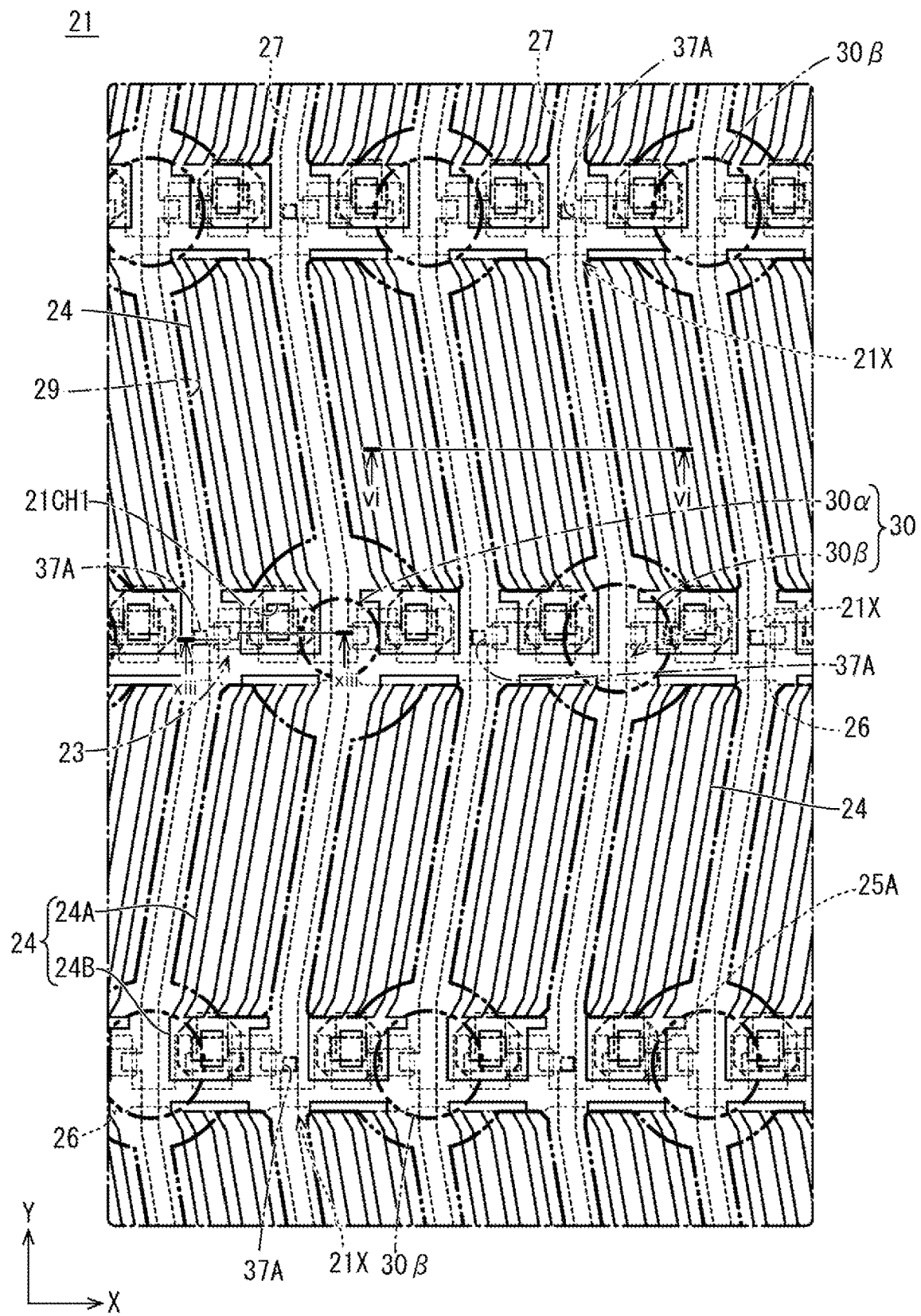
FIG. 2 is a plan view illustrating a pixel array in a display region of an array substrate constituting the liquid crystal panel.
Figure 3:
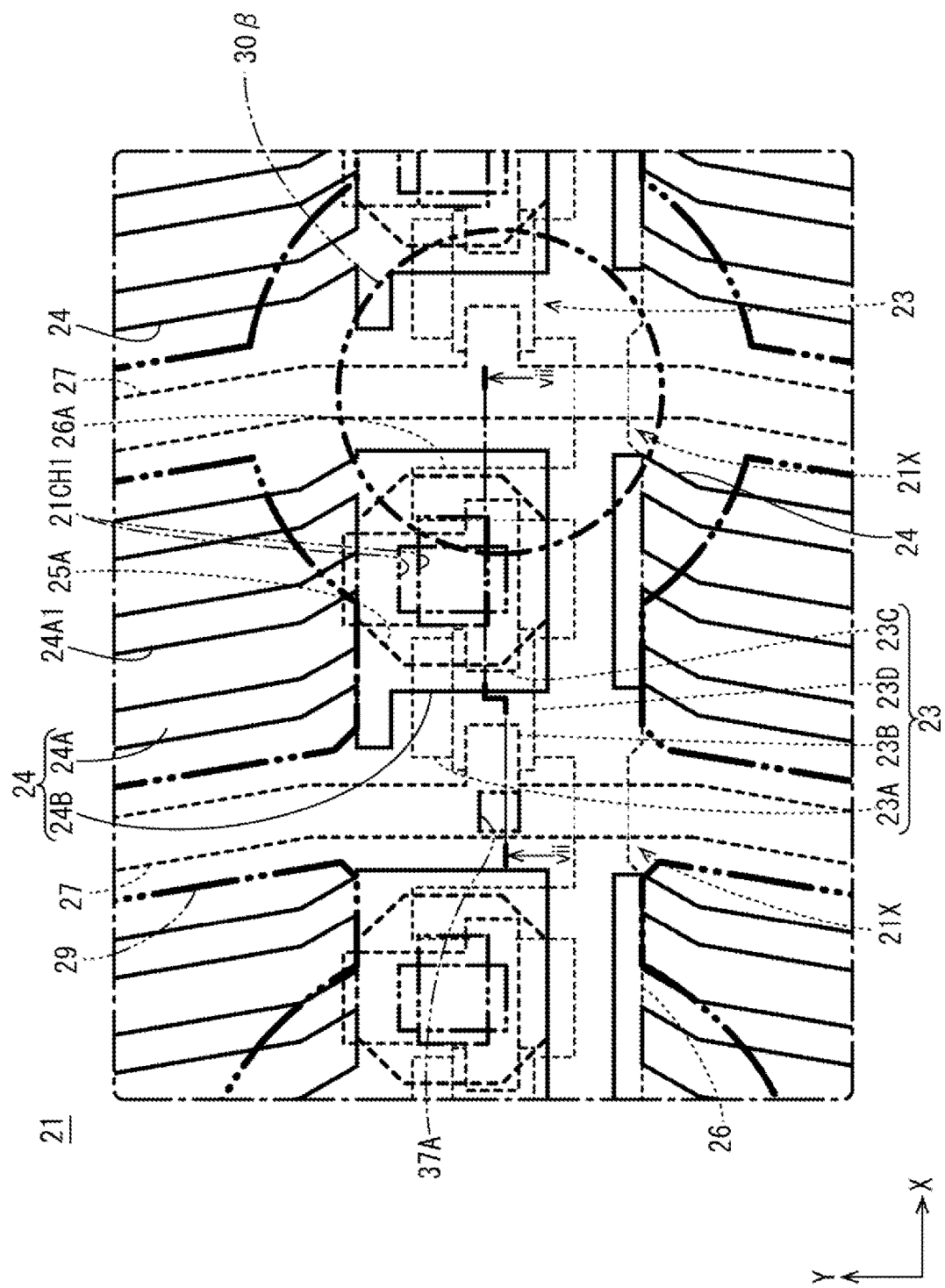
FIG. 3 is an enlarged plan view of a part (the vicinity of a TFT) of FIG. 2.

FIG. 2 is a plan view illustrating a pixel array in the display region AA of the array substrate 21 constituting the liquid crystal panel 11. FIG. 3 is an enlarged plan view of a part (the vicinity of a TFT 23) of FIG. 2. As illustrated in FIG. 2, a plurality of TFTs (thin film transistors, switching elements) 23 and a plurality of pixel electrodes 24 are provided side by side on an inner surface side of the display region AA of the array substrate 21 with intervals therebetween in the plane of the array substrate 21. The plurality of the TFTs 23 and the plurality of pixel electrodes 24 are provided side by side in a matrix with intervals therebetween in the X-axis direction (first direction) and the Y-axis direction (second direction) intersecting the X-axis direction. The gate wiring lines (first wiring lines, scanning wiring lines) 26 and source wiring lines (second wiring lines, signal wiring lines) 27, which are formed in a lattice pattern, are disposed around and surround the TFT 23 and the pixel electrode 24. The gate wiring line 26 extends substantially linearly in the X-axis direction, and a plurality of gate wiring lines 26 are disposed side by side in the Y-axis direction at intervals so as to sandwich the pixel electrode 24 therebetween. The line width of the gate wiring line 26 changes depending on the position thereof in the X-axis direction. The source wiring line 27 extends substantially in the Y-axis direction while being repeatedly bent into a zigzag shape. A plurality of source wiring lines 27 are disposed side by side at intervals in the X-axis direction so as to sandwich the pixel electrode 24 therebetween. The gate wiring line 26 and the source wiring line 27 intersect each other, and the number of intersections 21X thereof is a value obtained by multiplying the number of gate wiring lines 26 installed by the number of source wiring lines 27 installed. As illustrated in FIG. 3, the gate wiring line 26 is connected to gate electrodes 23A provided in the plurality of TFTs 23 aligned in the X-axis direction. The source wiring line 27 is connected to source electrodes 23B provided in the plurality of TFTs 23 aligned in the Y-axis direction. The TFTs 23 are driven based on various signals respectively supplied to the gate wiring lines 26 and the source wiring lines 27, and the supply of potentials to the pixel electrodes 24, connected to drain electrodes 23C of the TFTs 23, is controlled with the driving of the TFTs 23. The TFT 23 is disposed to be sandwiched between the pixel electrode 24 and the gate wiring line 26, which are connected to the TFT 23, in the Y-axis direction. Note that the plurality of TFTs 23 include those positioned on the right side in FIG. 2 and FIG. 3 with respect to the source wiring line 27 to be connected thereto, and those positioned on the left side in the same drawings. Two of the TFTs 23 positioned on the right side in FIG. 2 and FIG. 3 with respect to the source wiring line 27 to be connected thereto and two of the TFTs 23 positioned on the left side in the same drawings are aligned side by side in the Y-axis direction. Further, all of the TFTs 23 are positioned on the lower side in FIG. 2 and FIG. 3 with respect to the pixel electrodes 24 to be connected thereto.

Figure 4:
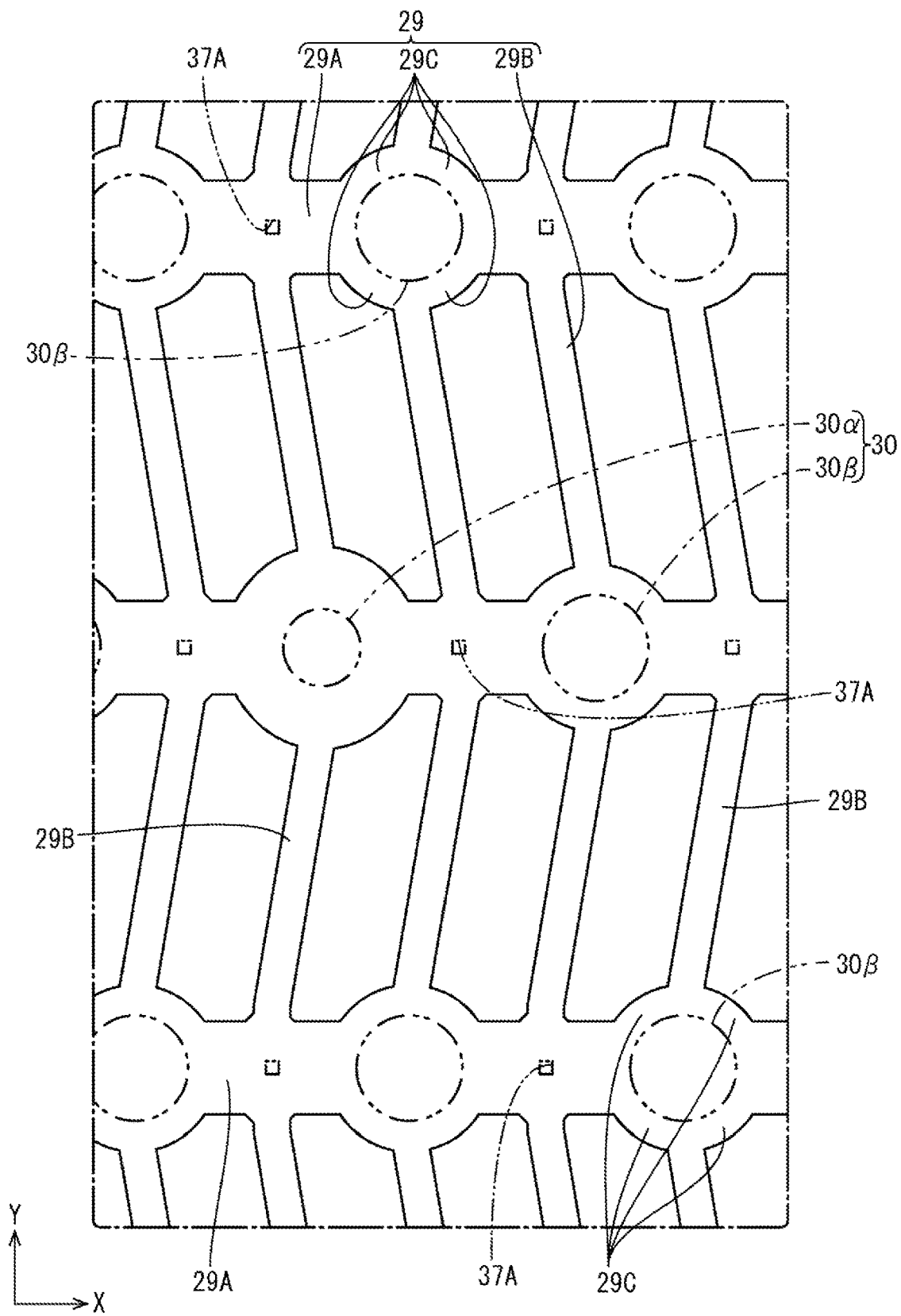
FIG. 4 is a plan view illustrating a pixel array in a display region of a counter substrate constituting the liquid crystal panel.
Figure 5:
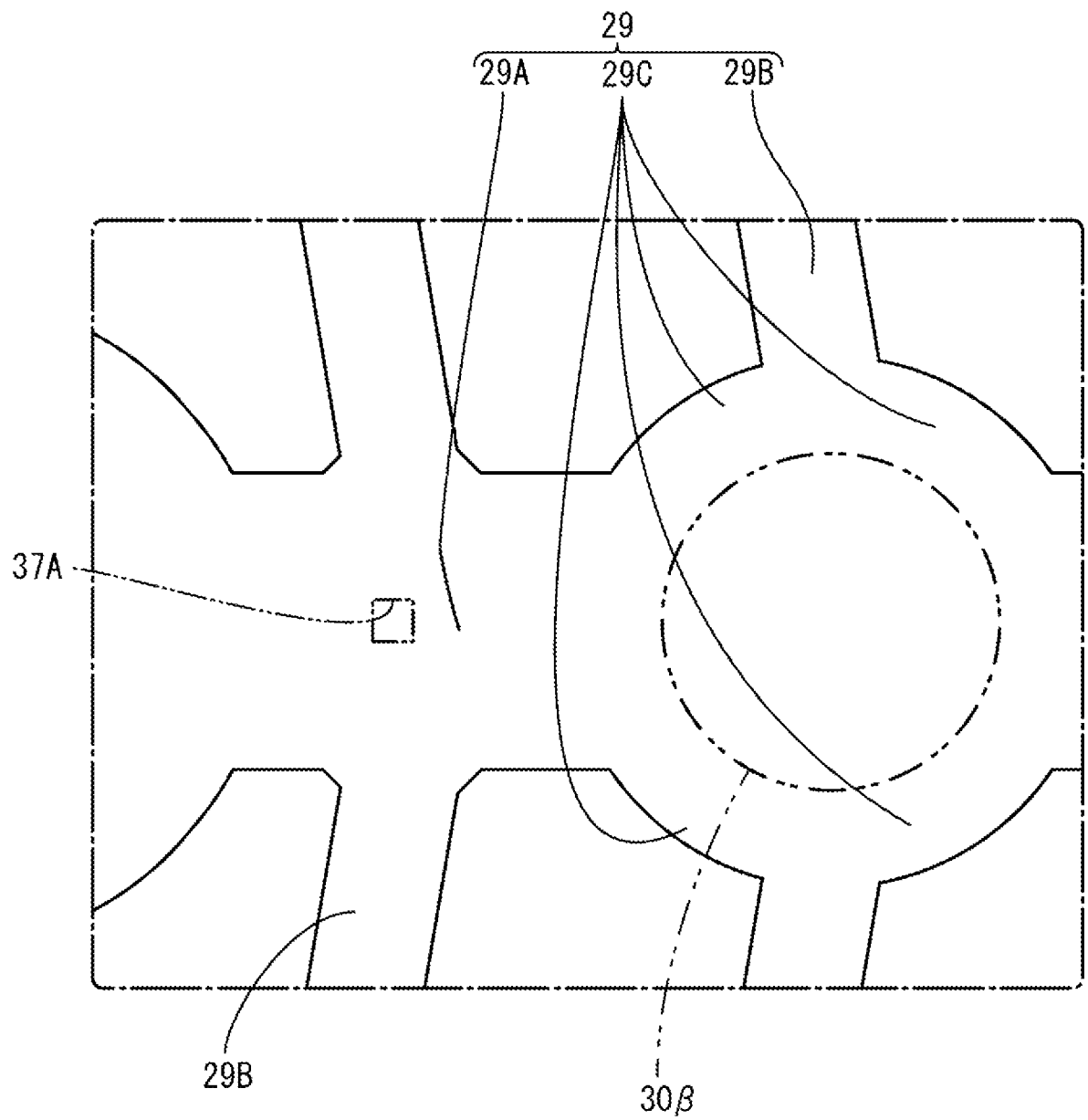
FIG. 5 is an enlarged plan view illustrating a part (the vicinity of a spacer) of FIG. 4.

FIG. 4 is a plan view illustrating a pixel array in the display region AA of the counter substrate 20 constituting the liquid crystal panel 11. FIG. 5 is an enlarged plan view of a part (the vicinity of a spacer 30) of FIG. 4. As illustrated in FIG. 4, a light blocking portion (an inter-pixel light blocking portion, a black matrix) 29 and the spacer 30 are provided on the inner surface side of the counter substrate 20 in the display region AA. The light blocking portion 29 includes, for example, a light blocking material (for example, a material containing a pigment such as a carbon black in a photosensitive resin material such as an acrylic or polyimide) having excellent light blocking properties of, for example, an optical density (OD) value being 3 or greater, preferably 4 or greater. The light blocking portion 29 can block light emitted from the backlight device or the like. In the display region AA, the light blocking portion 29 has a planar shape being in a substantially lattice pattern, and separates adjacent pixel electrodes 24. The light blocking portion 29 is disposed to overlap at least the gate wiring line 26 and the source wiring line 27 on the array substrate 21 side when viewed in a plan view. The light blocking portion 29 includes a first light blocking portion 29A extending in the X-axis direction and a second light blocking portion 29B extending in the Y-axis direction and intersecting the first light blocking portion 29A. Intersections of the first light blocking portion 29A and the second light blocking portion 29B are continuous with each other. The first light blocking portion 29A is wider than the second light blocking portion 29B. The first light blocking portion 29A is disposed to overlap at least the TFT 23, the gate wiring line 26, and the spacer 30 (see FIG. 2). The second light blocking portion 29B is narrower than the first light blocking portion 29A. The second light blocking portion 29B is disposed to overlap at least the source wiring line 27. In the plane of the counter substrate 20, a region surrounded by the first light blocking portion 29A and the second light blocking portion 29B is positioned to overlap most of the pixel electrode 24 and most of a color filter 28. The above-described region transmits transmission light of the pixel electrode 24 and the color filter 28, and emits light to the outside of the liquid crystal panel 11. Note that the light blocking portion 29 is also provided in the non-display region NAA of the counter substrate 20, and is disposed in a solid form over substantially the entire region in the non-display region NAA.

The spacer 30 is used to maintain an interval between the pair of substrates 20 and 21. As illustrated in FIG. 4 and FIG. 5, the spacer 30 has a substantially circular planar shape. The spacer 30 is disposed to overlap the intersection 21X between the gate wiring line 26 and the source wiring line 27 provided in the array substrate 21 (see FIG. 2). The spacer 30 is disposed to overlap an intersection between the first light blocking portion 29A and the second light blocking portion 29B constituting the light blocking portion 29. Thus, it is possible to suitably prevent light leakage that may occur in the vicinity of the spacer 30 due to the intersection between the first light blocking portion 29A and the second light blocking portion 29B. The number of spacers 30 installed is less than the number of intersections 21X between the gate wiring lines 26 and the source wiring lines 27 (the intersections between the first light blocking portions 29A and the second light blocking portions 29B). Specifically, the plurality of spacers 30 are arranged for each intersection 21X among the plurality of intersections 21X aligned in the X-axis direction. The plurality of spacers 30 are arranged for each intersection 21X among the plurality of intersections 21X aligned in the Y-axis direction. In this manner, the plurality of spacers 30 are arranged in a planar manner in a checkerboard (staggered) pattern in the plane of the counter substrate 20. Thus, the number of spacers 30 installed is approximately half the total number of intersections 21X between the gate wiring lines 26 and the source wiring lines 27. In this manner, the plurality of spacers 30 being deflected in the plate surfaces of the array substrate 21 and the counter substrate 20 is avoided, and thus an interval between the array substrate 21 and the counter substrate 20 can be maintained more stably. The spacer 30 includes two types spacers, that is, a first spacer (main spacer) 30a and a second spacer (sub-spacer) 30B. Note that, in the following description, when the spacers 30 are distinguished from each other, a suffix "a" is appended to the reference numeral of the first spacer, and a suffix "B" is appended to the reference numeral of the second spacer, and when the spacers 30 are collectively referred to without distinction, a suffix is not appended to a reference numeral. The first spacer 30a has a diameter dimension smaller than that of the second spacer 30B. The number of first spacers 30a installed is smaller than the number of second spacers 30β installed. A difference between the first spacer 30a and the second spacer 30β will be described later. Note that the light blocking portion 29 includes a third light blocking portion 29C that is continuous with the intersection between the first light blocking portion 29A and the second light blocking portion 29B. The third light blocking portion 29C has a substantially fan shape that is concentric with the spacer 30. Four third light blocking portions 29C are continuous with each other at the intersection between the first light blocking portion 29A and the second light blocking portion 29B. The four third light blocking portions 29C have a substantially circular shape corresponding to the planar shape of the spacer 30, and the diameter dimension thereof is larger than the diameter dimension of the spacer 30. Although most of the third light blocking portion 29C does not overlap the spacer 30, a portion thereof overlaps the spacer 30. The third light blocking portion 29C can more suitably prevent light leakage that may occur in the vicinity of the spacer 30. The third light blocking portion 29C includes one third light blocking portion 29Cα overlapping the first spacer 30α and the other third light blocking portion 29Cβ overlapping the second spacer 30B. The one third light blocking portion 29Cα has a diameter dimension larger than that of the other third light blocking portion 29CB. Note that, in FIG. 2 and FIG. 3, the light blocking portion 29 and the spacer 30 are illustrated by a thick alternating two dots-dashed line.

Figure 6:
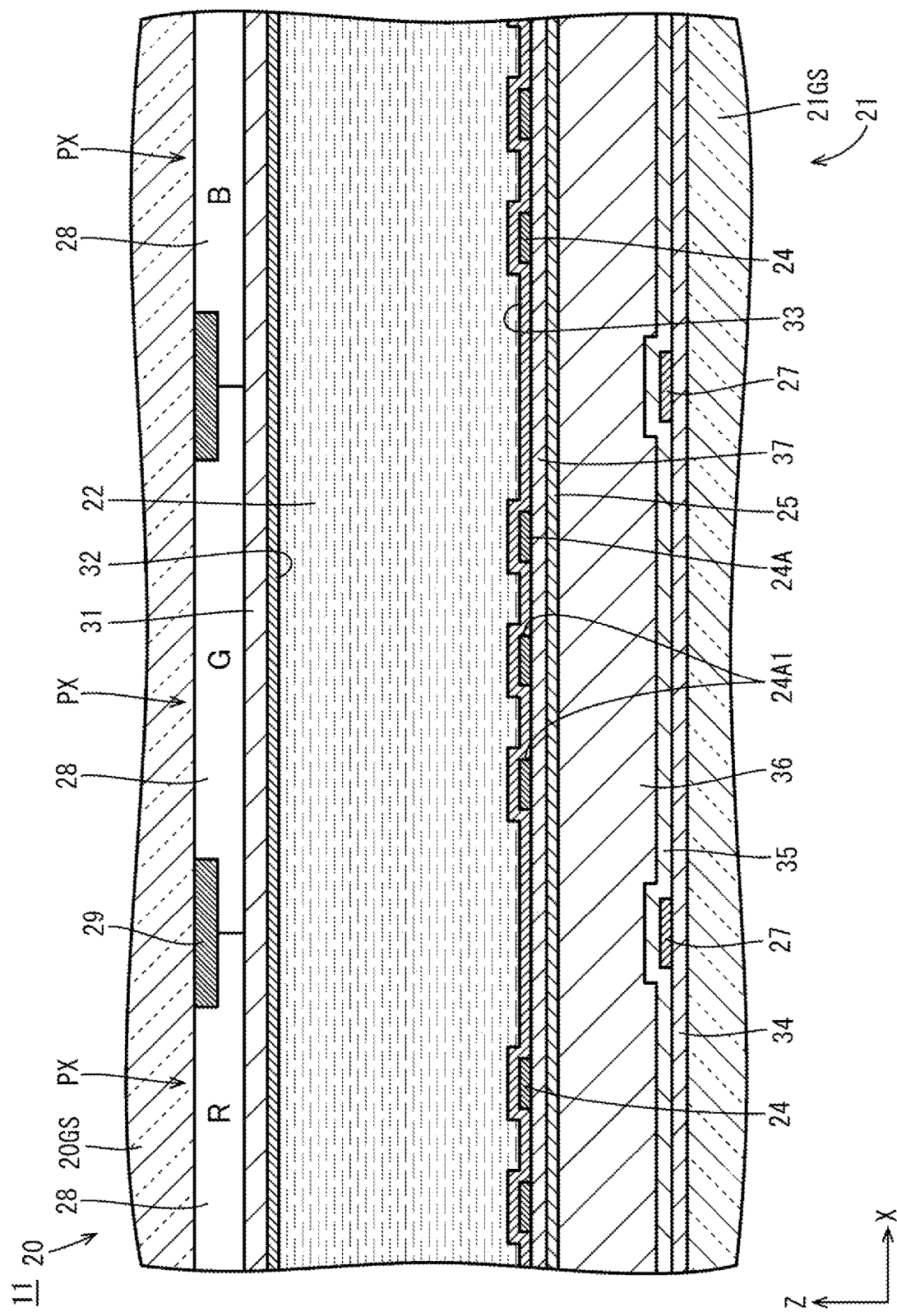
FIG. 6 is a cross-sectional view of the liquid crystal panel taken along line vi-vi in FIG. 2.

FIG. 6 is a cross-sectional view of the liquid crystal panel 11 in the vicinity of a center portion of the pixel electrode 24 (a pixel PX) (a cross-sectional view taken along line vi-vi in FIG. 2). As illustrated in FIG. 6, the liquid crystal panel 11 includes a liquid crystal layer (medium layer) 22 that is disposed between the pair of substrates 20 and 21 and containing liquid crystal molecules, which are substances having optical characteristics that change in accordance with application of an electrical field. The three-color color filters 28 exhibiting blue (B), green (G), and red (R) are provided in the display region AA on an inner surface side of the counter substrate 20 constituting the liquid crystal panel 11. The plurality of color filters 28 exhibiting colors different from each other are arranged side by side so as to be adjacent to each other in the extension direction of the gate wiring line 26 (X-axis direction). The plurality of color filters 28 that exhibit colors different from each other extend along the extension direction of the source wiring line 27 (generally the Y-axis direction). In this manner, the plurality of color filters 28 exhibiting colors different from each other are arrayed in a stripe pattern as a whole. The color filters 28 are arranged to overlap the pixel electrodes 24 on the array substrate 21 side when viewed in a plan view. The color filters 28 exhibiting colors different from each other are disposed such that boundaries thereof (color boundaries) overlap the source wiring line 27. In this liquid crystal panel 11, the R, G, and B color filters 28 aligned in the X-axis direction and three pixel electrodes 24 facing the color filters 28 respectively constitute three-color pixels PX. Then, in the liquid crystal panel 11, a display pixel capable of color display with predetermined gray scale is configured by the R, G, and B three-color pixels PX adjacent to each other in the X-axis direction. An arrangement pitch of the pixels PX in the Y-axis direction is, for example, approximately three times an arrangement pitch of the pixels PX in the X-axis direction. The light blocking portion 29 is disposed to separate the color filters 28 adjacent to each other. Specifically, the first light blocking portion 29A separates two color filters 28 adjacent to each other in the Y-axis direction. The second light blocking portion 29B separates two color filters 28 adjacent to each other in the X-axis direction. An overcoat film 31 disposed in a solid form over substantially the entire region of the counter substrate 20 is provided for flattening on the upper layer side (liquid crystal layer 22 side) of the color filter 28.

Next, the pixel electrode 24 and a common electrode 25 provided in the array substrate 21 will be described with reference to FIG. 6. On the inner surface side of the display region AA of the array substrate 21, as illustrated in FIG. 6, the common electrode 25 is formed on the lower layer side than the pixel electrodes 24 so as to overlap all of the pixel electrodes 24. The common electrode 25 extends over substantially the entire display region AA. A common wiring line is connected to the common electrode 25, and a common potential signal (reference potential signal) having a common potential (reference potential) is supplied by the common wiring line. The flexible substrate 13 is connected to the common wiring line, and a common potential signal is supplied from the control circuit board 14 (see FIG. 1). When the pixel electrode 24 is charged with the driving of the TFT 23, a potential difference is generated between the pixel electrode 24 and the common electrode 25 overlapping each other. Then, a fringe electrical field (oblique electrical field) including a component in a normal direction with respect to the plate surface of the array substrate 21 in addition to a component along the plate surface of the array substrate 21 is generated between the pixel electrodes 24 and the common electrode 25. By using the fringe electrical field, the alignment state of the liquid crystal molecules contained in the liquid crystal layer 22 can be controlled. In other words, the operation mode of the liquid crystal panel 11 according to the present embodiment is a fringe field switching (FFS) mode.

Alignment films 32 and 33 for aligning liquid crystal molecules contained in the liquid crystal layer 22 are provided on the innermost surfaces of the counter substrate 20 and the array substrate 21, respectively, as illustrated in FIG. 6. Specifically, the alignment film 32 is provided on the upper layer side (the liquid crystal layer 22 side) of the overcoat film 31 in the counter substrate 20. The alignment film 32 is provided in a solid form on the innermost surface of the counter substrate 20. The alignment film 33 is provided on the upper layer side of the pixel electrode 24 in the array substrate 21. The alignment film 33 is provided in a solid form on the innermost surface of the array substrate 21. The alignment films 32 and 33 are photo-alignment films that allow alignment regulating force to be imparted to the liquid crystal molecules by performing photo-alignment treatment on the surfaces thereof.

Figure 7:
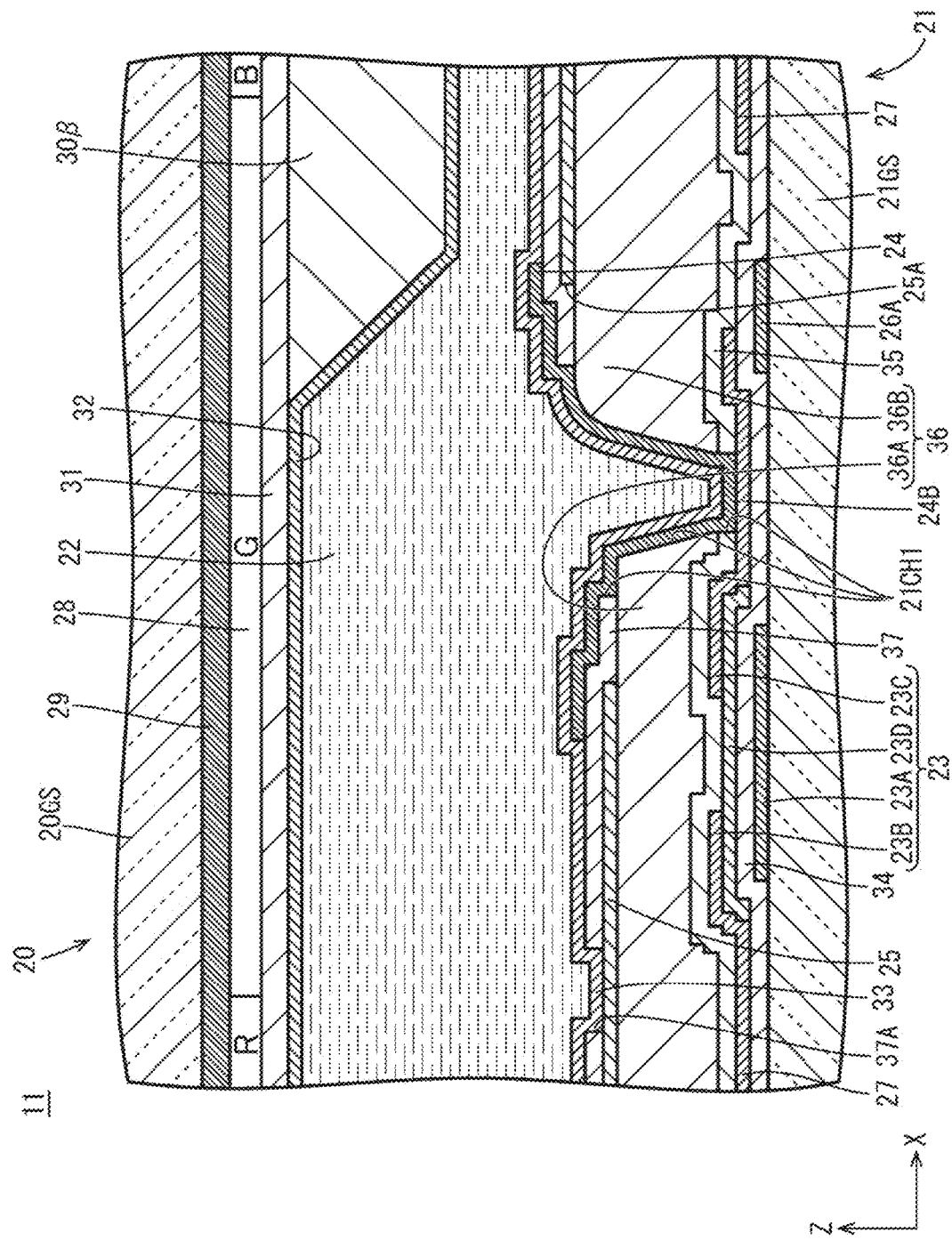
FIG. 7 is a cross-sectional view of the liquid crystal panel taken along line vii-vii in FIG. 3.

Here, various films layered on the inner surface side of the array substrate 21 will now be described with reference to FIG. 6 and FIG. 7. FIG. 7 is a cross-sectional view of the liquid crystal panel 11 in the vicinity of the TFT 23 and the second spacer 30β (a cross-sectional view taken along line vii-vii in FIG. 3). As illustrated in FIG. 7, in the array substrate 21, a first metal film, a gate insulating film 34, a semiconductor film, a second metal film, a first interlayer insulating film 35, a flattening film 36, a first transparent electrode film, a second interlayer insulating film (insulating film) 37, a second transparent electrode film, and the alignment film 33 are layered in this order from the lower layer side (the glass substrate 21GS side). The first metal film and the second metal film are each a single layer film made of one type of metal material selected from copper, titanium, aluminum, molybdenum, tungsten, and the like, or a layered film or alloy made of different types of metal materials, and thus have conductivity and light blocking properties. The first metal film constitutes the gate wiring line 26, the gate electrode 23A of the TFT 23, and the like. The second metal film constitutes the source wiring line 27, the source electrode 23B and the drain electrode 23C of the TFT 23, and the like. The semiconductor film is constituted by a thin film using, for example, an oxide semiconductor, amorphous silicon as the material thereof, and constitutes a channel portion 23D of the TFT 23, and the like. The first transparent electrode film and the second transparent electrode film are made of a transparent electrode material (for example, indium tin oxide (ITO), indium zinc oxide (IZO), or the like). The first transparent electrode film and the second transparent electrode film have a film thickness of, for example, approximately 0.05 μm to 0.1 μm. The first transparent electrode film constitutes the common electrode 25 and the like. The second transparent electrode film constitutes the pixel electrode 24 and the like. The alignment film 33 is as described above.

The gate insulating film 34, the first interlayer insulating film 35, and the second interlayer insulating film 37 are each made of an inorganic material such as silicon nitride ($SiN_x$) or silicon oxide ($SiO_2$). The gate insulating film 34, the first interlayer insulating film 35, and the second interlayer insulating film 37 have a film thickness of, for example, approximately 0.2 μm to 0.7 μm, which is generally larger than those of the first transparent electrode film and the second transparent electrode film. The flattening film 36 is made of, for example, an organic material such as PMMA (acrylic resin) and has photosensitivity. The flattening film 36 has a film thickness of, for example, approximately 1 μm to 3 μm, which is much larger than the film thicknesses of the gate insulating film 34, the first interlayer insulating film 35, and the second interlayer insulating film 37. The flattening film 36 flattens the inner surface of the array substrate 21 (the surface on the liquid crystal layer 22 side). The gate insulating film 34 maintains an insulated state between the first metal film on the lower layer side and the semiconductor film and the second metal film on the upper layer side. For example, the intersection 21X between the gate wiring line 26 constituted by the first metal film and the source wiring line 27 constituted by the second metal film is maintained in an insulated state by the gate insulating film 34. In addition, an overlapping area between the gate electrode 23A constituted by the first metal film and the channel portion 23D constituted by the semiconductor film are maintained in an insulated state by the gate insulating film 34. The first interlayer insulating film 35 and the flattening film 36 maintain an insulated state between the semiconductor film and the second metal film on the lower layer side and the first transparent electrode film on the upper layer side. For example, an overlapping area between the source wiring line 27 constituted by the second metal film and the common electrode 25 constituted by the first transparent electrode film is maintained in an insulated state by the first interlayer insulating film 35 and the flattening film 36. The second interlayer insulating film 37 maintains an insulated state between the first transparent electrode film on the lower layer side and the second transparent electrode film on the upper layer side. For example, an overlapping area between the common electrode 25 constituted by the first transparent electrode film and the pixel electrode 24 constituted by the second transparent electrode film is maintained in the insulated state by the second interlayer insulating film 37. A first contact hole 21CH1 is formed in the first interlayer insulating film 35, the flattening film 36, and the second interlayer insulating film 37 by simultaneously boring a hole thereinto. The first contact hole 21CH1 is disposed at a position overlapping both the drain electrode 23C constituted by the second metal film and a portion of the pixel electrode 24 constituted by the second transparent electrode film (a contact portion 24B to be described later) in the first interlayer insulating film 35, the flattening film 36, and the second interlayer insulating film 37. The drain electrode 23C and the pixel electrode 24 are connected through the first contact hole 21CH1.

Figure 8:
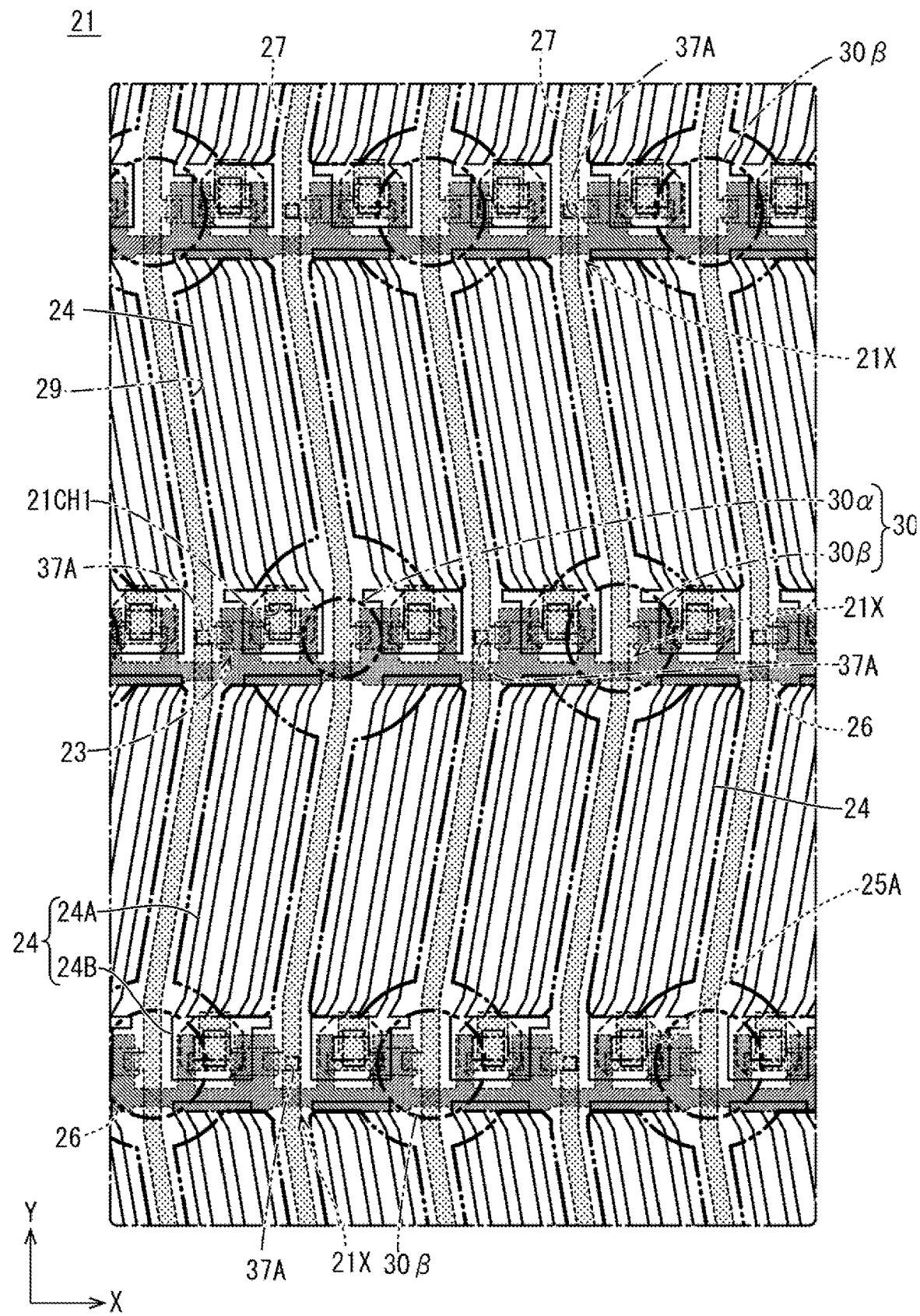
FIG. 8 is a plan view illustrating the same range as in FIG. 2, and a plan view illustrating first metal films and second metal films with different levels of shading.
Figure 9:
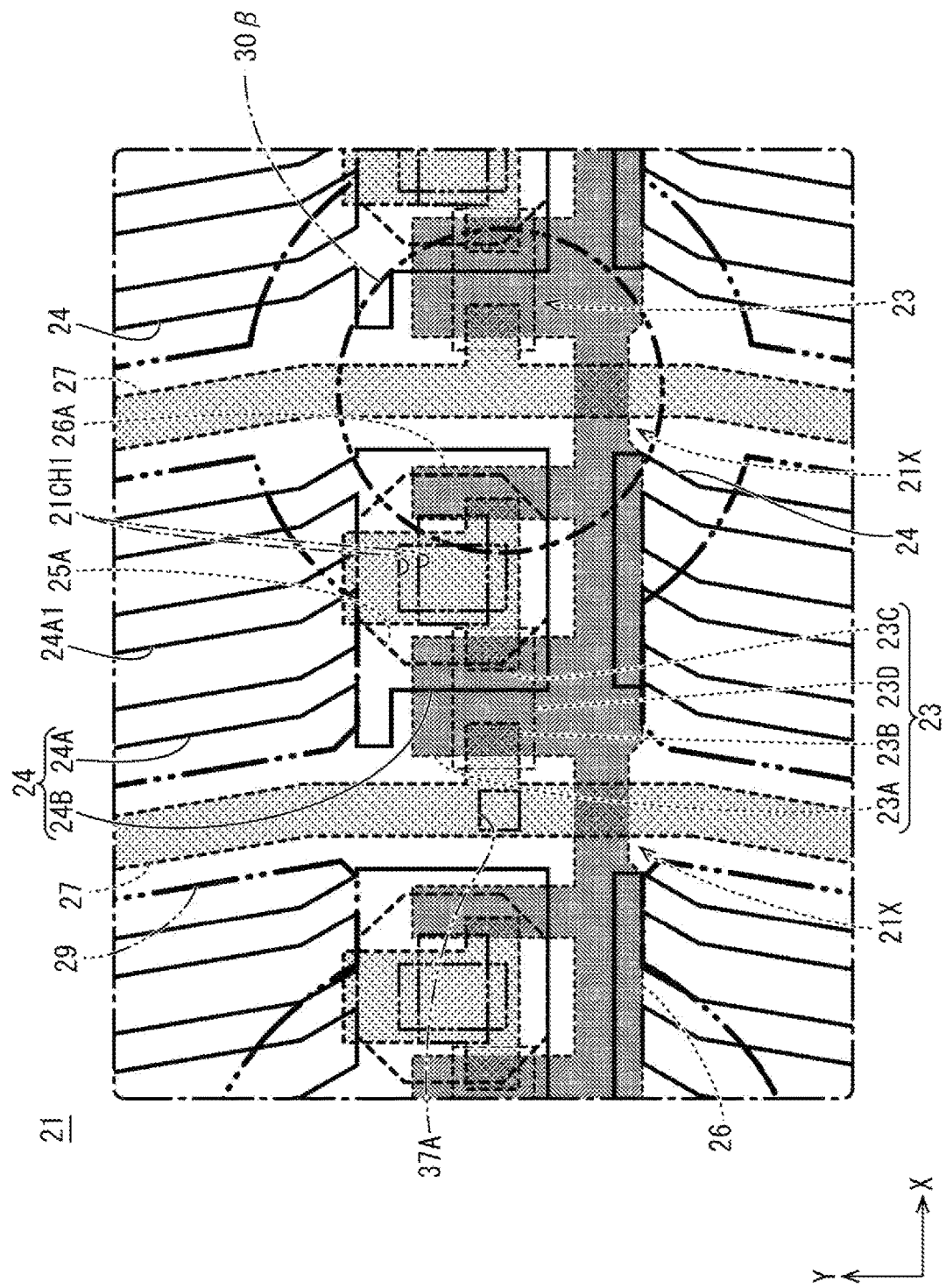
FIG. 9 is a plan view illustrating the same range as in FIG. 3, and a plan view illustrating a first metal film and second metal films with different levels of shading.

Next, the TFT 23 will be described with reference to FIG. 7 to FIG. 9. FIG. 8 is a plan view illustrating the same range as in FIG. 2, and is a plan view illustrating the first metal films (the gate electrodes 23A and the like) and the second metal films (the source electrodes 23B, the drain electrodes 23C, and the like) with different levels of shading. FIG. 9 is a plan view illustrating the same range as FIG. 3, and is a plan view illustrating the first metal film (the gate electrode 23A and the like) and the second metal films (the source electrodes 23B, the drain electrodes 23C, and the like) with different levels of shading. As illustrated in FIG. 7 to FIG. 9, the TFT 23 includes the gate electrode 23A. The gate electrode 23A is constituted by a portion of the gate wiring line 26 (in the vicinity of the intersection 21X between the gate wiring line 26 and the source wiring line 27). The gate electrode 23A is formed by partially widening the gate wiring line 26. The gate electrode 23A drives the TFT 23 based on a scanning signal supplied to the gate wiring line 26. The TFT 23 is disposed on the right side illustrated in FIG. 8 and FIG. 9 with respect to the source wiring line 27 to be connected thereto. The TFT 23 includes the source electrode 23B. The source electrode 23B includes a portion of the source wiring line 27 to be connected thereto (the intersection 21X between the source wiring line 27 and the gate wiring line 26). The source electrode 23B is formed by partially widening the source wiring line 27. The source electrode 23B is disposed at one end of the TFT 23 in the X-axis direction (the left end illustrated in FIG. 8 and FIG. 9). In the source electrode 23B, substantially the entire region thereof overlaps a portion of the gate electrode 23A and is connected to the channel portion 23D. The TFT 23 includes the drain electrode 23C. The drain electrode 23C is disposed at a position spaced apart from the source electrode 23B, that is, at the other end of the TFT 23 in the X-axis direction (the right end illustrated in FIG. 8 and FIG. 9). The drain electrode 23C is disposed to overlap a portion of the gate electrode 23A, and the portion overlapping the gate electrode 23A is connected to the channel portion 23D. The center portion of the drain electrode 23C is connected to the pixel electrode 24. Note that an end portion of the drain electrode 23C on a side opposite to a connection portion with the channel portion 23D overlaps a widened portion 26A of the gate wiring line 26. The widened portion 26A has a width equal to or less than that of the gate electrode 23A. The widened portion 26A is provided to prevent capacitance between the gate wiring line 26 and the drain electrode 23C (that is, the pixel electrode 24) from fluctuating even when the drain electrode 23C is displaced in the X-axis direction with respect to the gate wiring line 26 during the manufacturing of the array substrate 21.

As illustrated in FIG. 7 to FIG. 9, the TFT 23 includes the channel portion 23D. The channel portion 23D overlaps the gate electrode 23A with the gate insulating film 34 interposed therebetween. The channel portion 23D overlaps a portion of the gate electrode 23A and extends in the X-axis direction. A portion on one end side of the channel portion 23D is connected to the source electrode 23B. A portion on the other end side of the channel portion 23D is connected to the drain electrode 23C. In addition, when the TFT 23 is turned on based on a scanning signal supplied to the gate electrode 23A, an image signal (data signal) supplied to the source wiring line 27 is supplied from the source electrode 23B to the drain electrode 23C via the channel portion 23D. As a result, the pixel electrode 24 is charged to the potential based on the image signal.

Figure 10:
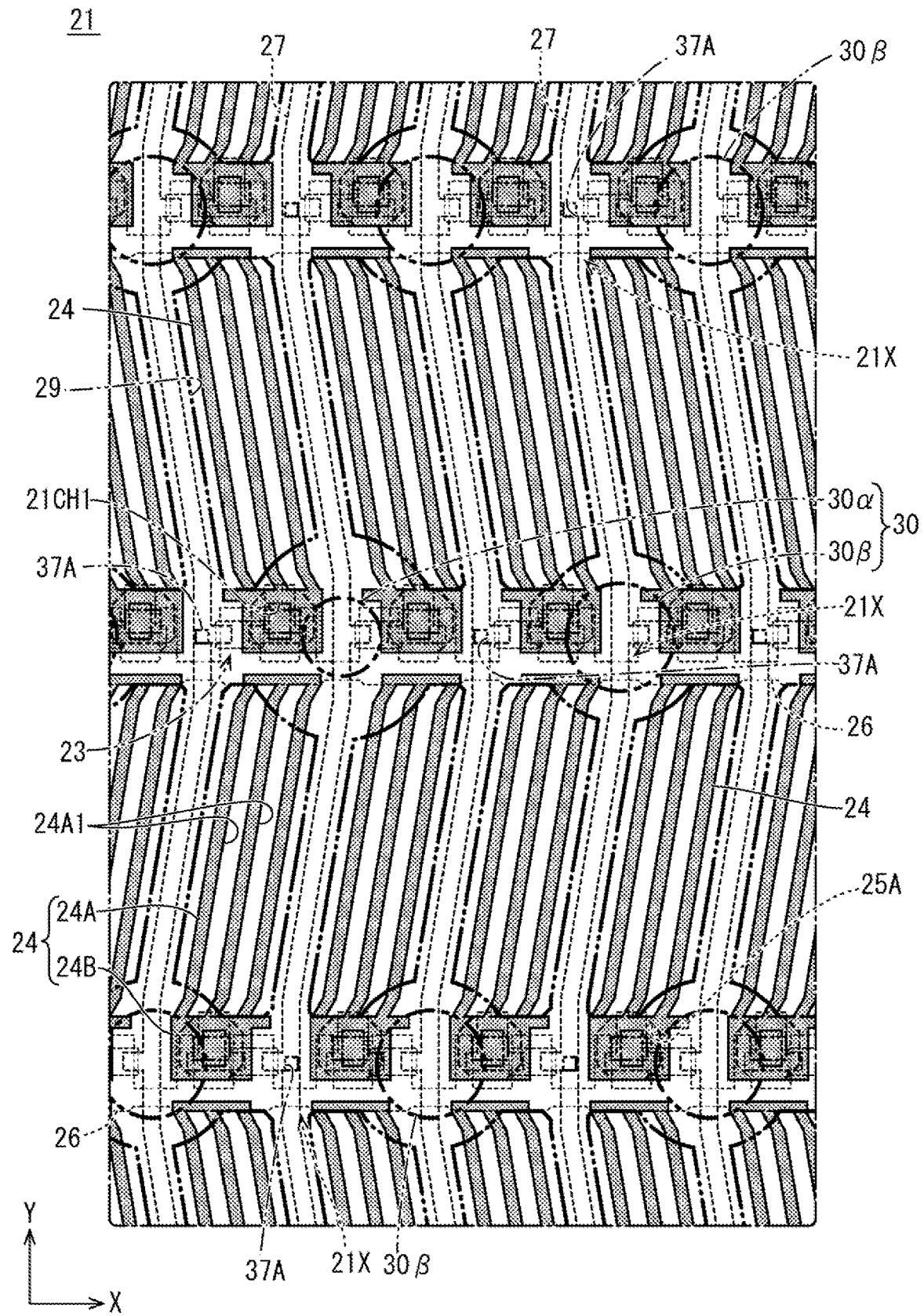
FIG. 10 is a plan view illustrating the same range as in FIG. 2, and a plan view illustrating second transparent electrode films with shading.
Figure 11:
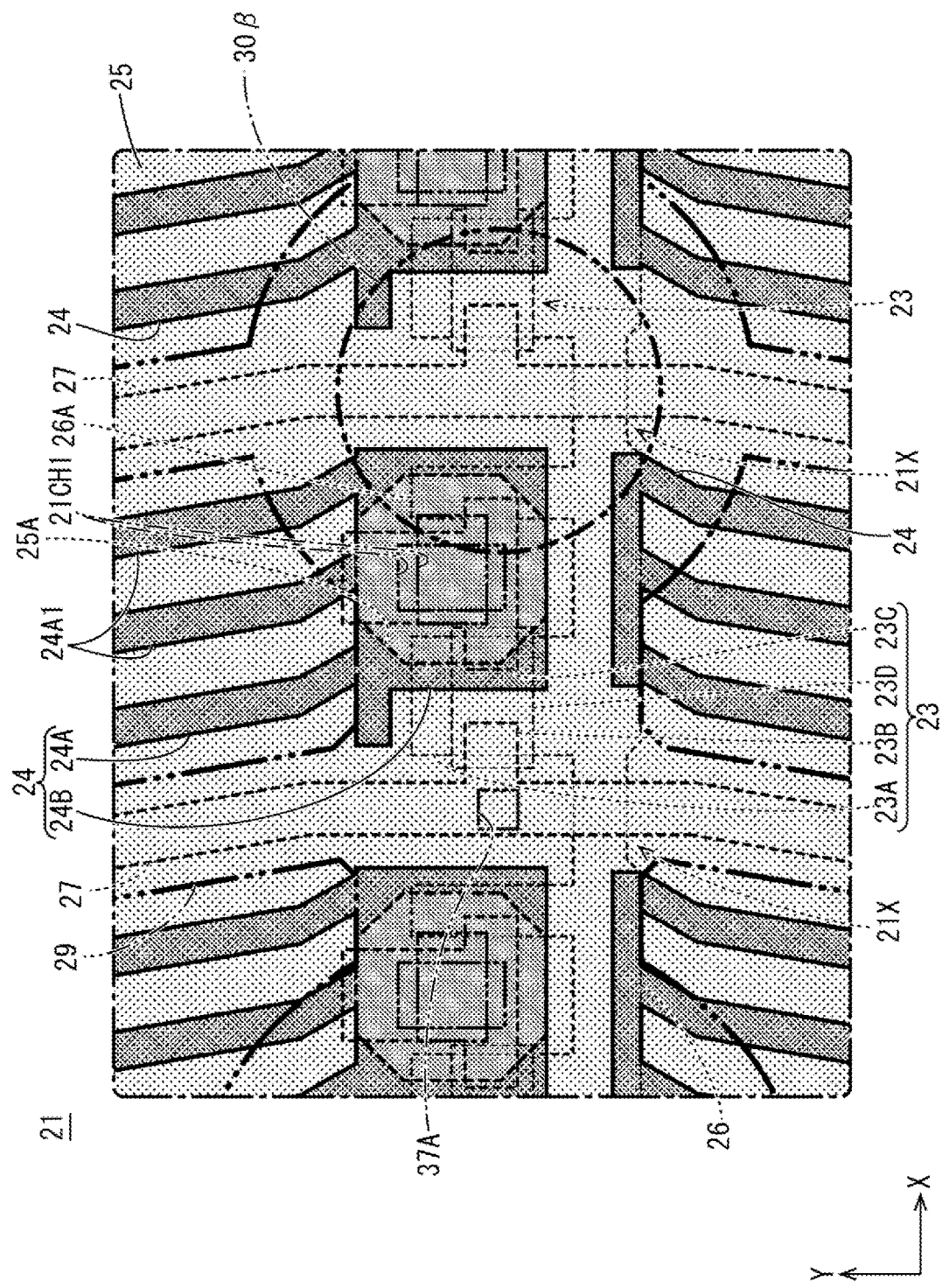
FIG. 11 is a plan view illustrating the same range as in FIG. 3, and a plan view illustrating a first transparent electrode film and second transparent electrode films with shading.

The pixel electrode 24 will be described with reference to FIG. 7, FIG. 10, and FIG. 11. FIG. 10 is a plan view illustrating the same range as in FIG. 2, and is a plan view illustrating second transparent electrode films (the pixel electrodes 24 and the like) with shading. FIG. 11 is a plan view illustrating the same range as in FIG. 3, and is a plan view illustrating a first transparent electrode film (the common electrode 25 and the like) and second transparent electrode films with different levels of shading. As illustrated in FIG. 10 and FIG. 11, the pixel electrode 24 includes a pixel electrode main body 24A having a planar shape being a substantially rectangular shape which is vertically long. The long side of the pixel electrode main body 24A extends along the source wiring line 27. Specifically, both side edges of the pixel electrode main body 24A in the longitudinal direction are slightly inclined relative to the Y-axis direction. A plurality of slits 24A1 (two slits in FIG. 10, FIG. 11, and the like) which extend in the long side direction thereof (substantially the Y-axis direction) are formed in the pixel electrode main body 24A. Note that a specific number of slits 24A1 installed, and the shape, formation range, and the like thereof can be appropriately changed other than those illustrated in the drawings. In addition, the pixel electrode 24 includes the contact portion 24B protruding to one side in the Y-axis direction from the pixel electrode main body 24A. The contact portion 24B protrudes from the pixel electrode main body 24A in a downward direction in FIG. 10 and FIG. 11, and is disposed to overlap a portion of the drain electrode 23C. As illustrated in FIG. 7, the contact portion 24B is connected to the drain electrode 23C through the first contact hole 21CH1.

Figure 12:
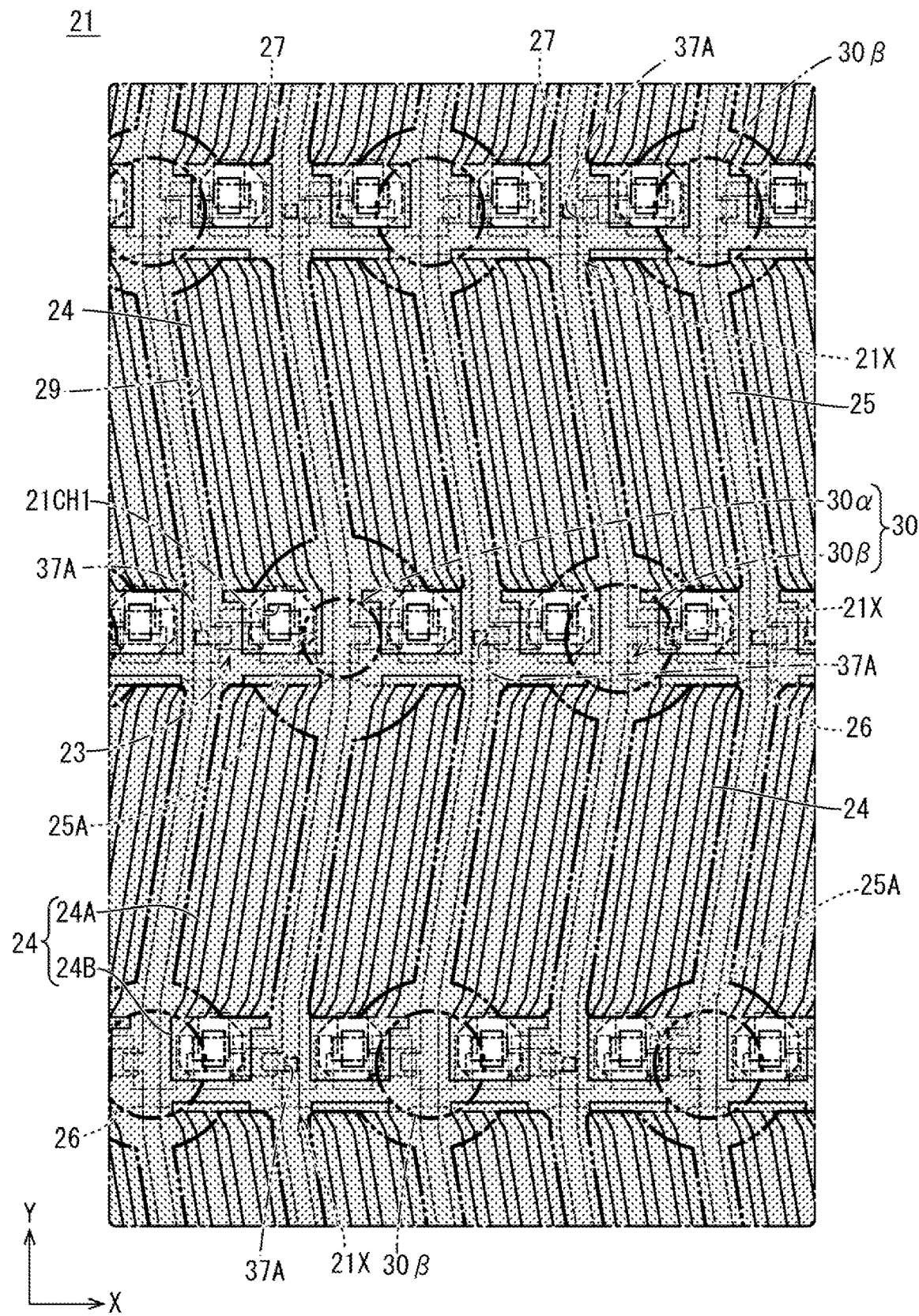
FIG. 12 is a plan view illustrating the same range as in FIG. 2, and a plan view illustrating a first transparent electrode film with shading.

The common electrode 25 will be described with reference to FIG. 7, FIG. 11, and FIG. 12. FIG. 12 is a plan view illustrating the same range as in FIG. 2, and is a plan view illustrating the first transparent electrode film (the common electrode 25 and the like) with shading. As illustrated in FIG. 11 and FIG. 12, the common electrode 25 is disposed in a solid form over substantially the entire region of the display region AA. In the common electrode 25, an opening 25A is partially formed. A plurality of openings 25A are formed at positions in the common electrode 25 which overlap the plurality of TFTs 23 (particularly the drain electrodes 23C and the first contact hole 21CH1), respectively. The plurality of openings 25A are arranged side by side at intervals in a matrix in the X-axis direction and the Y-axis direction in the common electrode 25. As illustrated in FIG. 7, the common electrode 25 is prevented from being short-circuited to the pixel electrode 24 by the openings 25A.

Figure 13:
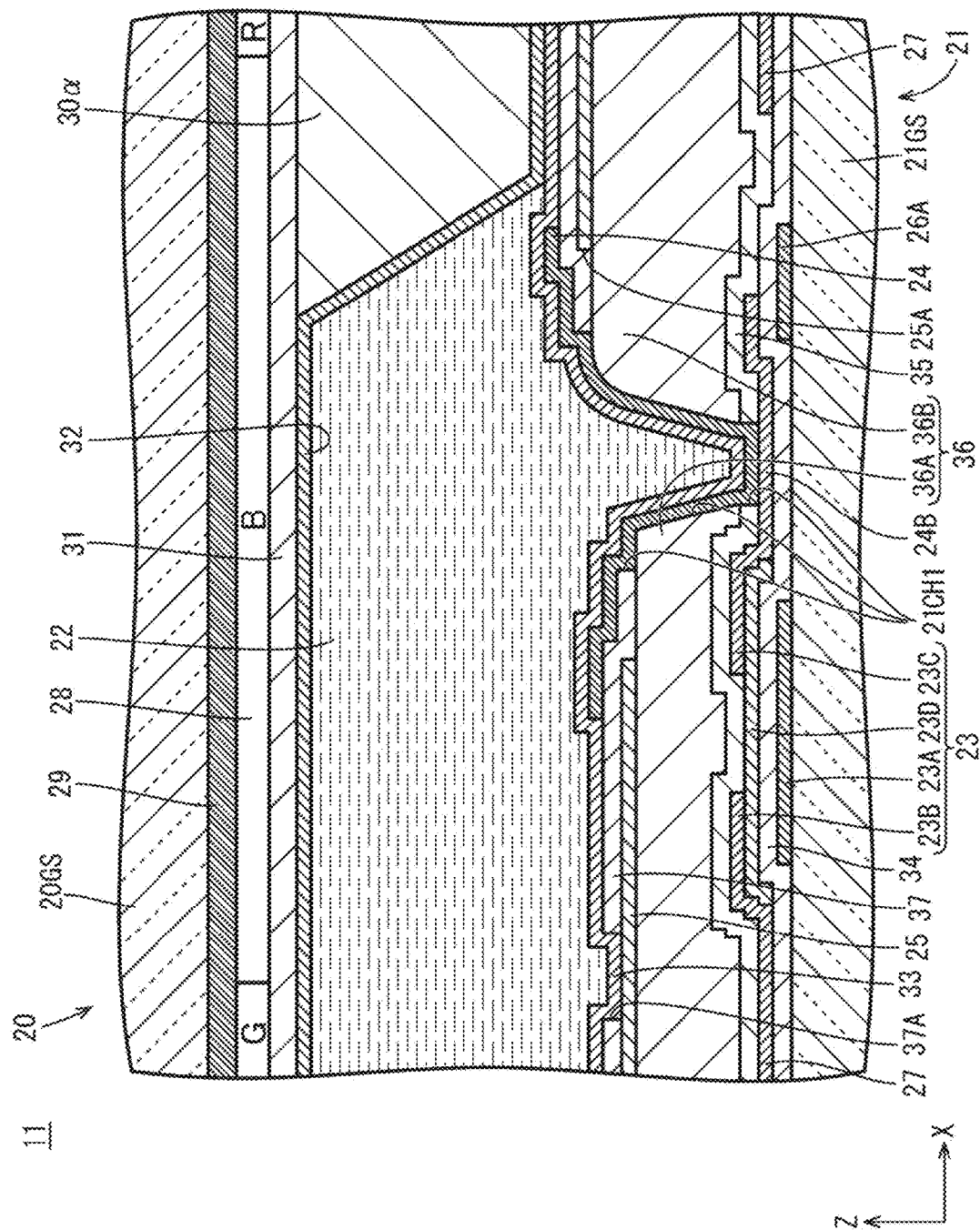
FIG. 13 is a cross-sectional view of the liquid crystal panel taken along line xiii-xiii in FIG. 2.

The spacer 30 of the counter substrate 20 will be described with reference to FIG. 7 and FIG. 13. FIG. 13 is a cross-sectional view of the liquid crystal panel 11 in the vicinity of the TFT 23 and the first spacer 30a (a cross-sectional view taken along line xiii-xiii in FIG. 2). As illustrated in FIG. 7 and FIG. 13, the spacer 30 protrudes in the Z-axis direction (the normal direction of the plate surface of the counter substrate 20) toward the array substrate 21 side (the liquid crystal layer 22 side to be described below) from the counter substrate 20. Specifically, the spacer 30 is made of a resin material, protrudes in the Z-axis direction toward the liquid crystal layer 22 side from the surface of the overcoat film 31 in the display region AA of the counter substrate 20, and a protrusion tip end face thereof faces the array substrate 21. The spacer 30 has a slightly tapered cylindrical shape as a whole (see FIG. 2 and FIG. 3). As illustrated in FIG. 13, the first spacer 30a has a dimension of protrusion from the counter substrate 20 which is larger than that of the second spacer 30B. In the first spacer 30a, a protrusion tip end face thereof is in contact with the alignment film 33 on the array substrate 21 side. Thereby, the pair of substrates 20 and 21 are configured to maintain an interval (cell gap) corresponding to the thickness of the liquid crystal layer 22. On the other hand, as illustrated in FIG. 7, the second spacer 30β has a dimension of protrusion from the counter substrate 20 which is smaller than that of the first spacer 30a. A clearance is formed between the protrusion tip end face of the second spacer 30B and the alignment film 33 on the array substrate 21 side. When external force is applied to press any one of the pair of substrates 20 and 21 inward from the outside, deflection (deformation) is allowed for any one of the pair of substrates 20 and 21 by the degree of clearance between the second spacer 30B provided in the counter substrate 20 and the alignment film 33 on the array substrate 21 side. However, when any one of the pair of substrates 20 and 21 deflects in some degree, the protrusion tip end face of the second spacer 30 is brought into contact with the alignment film 33 on the array substrate 21 side. Thereby, further deflection of any one of the pair of substrates 20 and 21 is regulated. In this manner, the thickness of the liquid crystal layer 22 can be maintained by the first spacer 30a and the second spacer 30B.

In the vicinity of the spacer 30 having the above-described configuration, an alignment failure occurs in the liquid crystal molecules contained in the liquid crystal layer 22, and there is a concern that a display failure due to the alignment failure may occur. In this regard, the spacer 30 is disposed to overlap the light blocking portion 29. Specifically, an intersection between the first light blocking portion 29A and the second light blocking portion 29B in the light blocking portions 29 is arranged in the spacer 30 in an overlapping manner. In addition, the third light blocking portion 29C of the light blocking portion 29 is arranged to surround the periphery of the spacer 30. By blocking light in the vicinity of the spacer 30 by such a light blocking portion 29, a display failure due to the spacer 30 is unlikely to be visually recognized.

The flattening film 36 of the array substrate 21 is described with reference to FIG. 7 and FIG. 13. As illustrated in FIG. 7 and FIG. 13, the flattening film 36 includes a first thick film portion 36A and a second thick film portion 36B having a film thickness larger than that of the first thick film portion 36A. The first thick film portion 36A has a film thickness larger than that of the second interlayer insulating film 37, but has a film thickness smaller than that of the second thick film portion 36B. The first thick film portion 36A occupies a large portion of the flattening film 36 excluding a portion overlapping each of the plurality of spacers 30. The first thick film portion 36A is disposed not to overlap the spacer 30 and is disposed to overlap the common electrode 25 and the pixel electrode 24. Since the second thick film portion 36B has a film thickness larger than that of the first thick film portion 36A, a portion of the alignment film 33 which overlaps the second thick film portion 36B is disposed to protrude to the liquid crystal layer 22 side in the Z-axis direction more than the portion of the alignment film 33 which overlaps the first thick film portion 36A. A plurality of the second thick film portions 36B are disposed at intervals in the X-axis direction and the Y-axis direction. The plurality of second thick film portions 36B are disposed to overlap the plurality of spacers 30, respectively. In this manner, the second thick film portion 36B is arranged in a planar manner in a checkerboard pattern in the plane of the array substrate 21, and is adapted to the planar arrangement of the spacers 30. Thus, the number of second thick film portions 36B installed is the same as the number of spacers 30 installed. Since the second thick film portion 36B is constituted by the portion of the flattening film 36 which overlaps the spacer 30, the planar shape thereof is substantially circular. The second thick film portion 36B has a size (a diameter dimension) equivalent to that of a protrusion base end portion of the spacer 30 (a portion having a maximum diameter dimension) when viewed in a plan view. Thus, the second thick film portion 36B can receive the protrusion tip end face of the spacer 30 through the alignment film 33 over substantially the entire region. Thereby, the deflection of the array substrate 21 or the counter substrate 20 can be regulated. Additionally, the second thick film portion 36B is disposed to overlap the intersection 21X between the gate wiring line 26 and the source wiring line 27.

In the array substrate 21 according to the present embodiment, an opening 37A is provided in the second interlayer insulating film 37 positioned on the lower layer side of the alignment film 33 and on the upper layer side of the common electrode 25 as illustrated in FIG. 7 and FIG. 13. The alignment film 33 is connected to the common electrode 25 on the lower layer side through the opening 37A of the second interlayer insulating film 37. In this manner, impurity ions, that is, charge, are less likely to remain on the surface and inside the alignment film 33, thereby making it unlikely to cause a display failure such as an afterimage, image sticking, or flickering due to the charge remaining in the alignment film 33. Note that "the alignment film 33 is connected to the common electrode 25 on the lower layer side through the opening 37A of the second interlayer insulating film 37" means that charge can be moved between the alignment film 33 and the common electrode 25 in a region overlapping the opening 37A of the second interlayer insulating film 37 when viewed from the Z-axis direction. Thus, "the alignment film 33 is connected to the common electrode 25 on the lower layer side through the opening 37A of the second interlayer insulating film 37" also includes a configuration in which the alignment film 33 is indirectly connected to the common electrode 25 via another member (connection electrode 40) through the opening 37A of the second interlayer insulating film 37 as described in detail in a third embodiment to be described later, in addition to a configuration in which the alignment film 33 is directly brought into contact with the common electrode 25 through the opening 37A of the second interlayer insulating film 37 as illustrated in FIG. 7. Note that "another member" mentioned here refers to a conductive member having conductivity. Incidentally, the second interlayer insulating film 37 according to the present embodiment is disposed to be sandwiched between the pixel electrode 24 on the upper layer side and the common electrode 25 on the lower layer side in the Z-axis direction. For this reason, the film thickness of the second interlayer insulating film 37 is a size suitable for maintaining a sufficiently high strength of an electrical field generated between the pixel electrode 24 and the common electrode 25, and is much smaller than the film thickness of a typical flattening film. On the other hand, the film thickness of the second interlayer insulating film 37 is generally larger than the film thicknesses of the pixel electrode 24 and the common electrode 25. Here, a step is generated between a portion of the alignment film 33 which is brought into contact with the common electrode 25 through the opening 37A of the second interlayer insulating film 37 and a portion of the alignment film 33 which is disposed on the upper layer side of the second interlayer insulating film 37. The size of the step depends on the film thickness of the second interlayer insulating film 37. Since the film thickness of the second interlayer insulating film 37 is set as described above, it is unavoidable that an alignment failure occurs to a certain extent in the liquid crystal molecules contained in the liquid crystal layer 22 due to the step mentioned above in the vicinity of the opening 37A. In other words, there is a concern that a display failure may occur in the vicinity of the opening 37A of the second interlayer insulating film 37 due to an alignment failure of the liquid crystal molecules.

Consequently, as illustrated in FIG. 5, FIG. 7, and FIG. 13, in the second interlayer insulating film 37 according to the present embodiment, the opening 37A is disposed at a position that does not overlap the spacer 30 but overlaps the light blocking portion 29 of the counter substrate 20. In this manner, even when an alignment failure occurs in the liquid crystal molecules due to the step of the alignment film 33 in the vicinity of the opening 37A of the second interlayer insulating film 37, light passing through the vicinity of the opening 37A can be blocked by the light blocking portion 29. This can make it less likely to visually recognize a display failure such as a bright dot defect (light leakage) caused by an alignment failure of the liquid crystal molecules generated in the vicinity of the openings 37A. Furthermore, the second interlayer insulating film 37 is disposed at a position where the opening 37A does not overlap the spacer 30, and thus the flatness of the surface of the array substrate 21 which faces the spacer 30 is secured. Thereby, a contact area between the alignment film 33 of the array substrate 21 and the spacer 30 is sufficiently secured, and thus the function of the spacer 30 (cell thickness maintenance function) is sufficiently exhibited. Moreover, the load of the spacer 30 is less likely to be applied to the portion of the alignment film 33 in the vicinity of the opening 37A of the second interlayer insulating film 37. Thus, cutting of the alignment film 33 due to the interference of the spacer 30 is less likely to occur. Thereby, the alignment film 33 being cut in the vicinity of the opening 37A of the second interlayer insulating film 37 is avoided, and thus an electrical connection state between the alignment film 33 and the common electrode 25 is easily maintained through the opening 37A of the second interlayer insulating film 37. As described above, charge is less likely to remain in the alignment film 33.

In FIG. 11 and FIG. 12, the opening 37A of the second interlayer insulating film 37 is illustrated by an alternating two dots-dashed line. As illustrated in FIG. 11 and FIG. 12, in the second interlayer insulating film 37, the opening 37A is positioned between two pixel electrodes 24 adjacent to each other in the X-axis direction, and is not disposed between two pixel electrodes 24 adjacent to each other in the Y-axis direction. In the second interlayer insulating film 37, the opening 37A is disposed to overlap the source wiring line 27. Specifically, in the second interlayer insulating film 37, the opening 37A is disposed to overlap a portion of the source wiring line 27 which is widened by the source electrode 23B, and is disposed to be adjacent to the source electrode 23B in the X-axis direction. In the second interlayer insulating film 37, the opening 37A is disposed on the upper side in FIG. 11 and FIG. 12 with respect to the intersection 21X between the gate wiring line 26 and the source wiring line 27, that is, disposed to be adjacent to the TFT 23 side to be connected to the gate wiring line 26 and the source wiring line 27, which constitute the intersection 21X in the Y-axis direction. In the second interlayer insulating film 37, the opening 37A is disposed to be aligned with the spacer 30 in the X-axis direction. Specifically, in the second interlayer insulating film 37, the arrangement of the opening 37A is set such that a straight line connecting the center of the opening 37A when viewed in a plan view and the center of the spacer 30 when viewed in a plan view is substantially parallel to the X-axis direction. In the second interlayer insulating film 37, the number of openings 37A installed is set to be a number obtained by subtracting the number of spacers 30 installed from the number of intersections 21X between the gate wiring lines 26 and the source wiring lines 27 (approximately half of the total number of intersections 21X between the gate wiring lines 26 and the source wiring lines 27). In other words, in the vicinity of the intersections 21X between the gate wiring lines 26 and the source wiring lines 27, the spacers 30 and the openings 37A of the second interlayer insulating film 37 are evenly arranged, and there are no intersections 21X in which the spacer 30 or the opening 37A is not disposed. In this manner, it can be said that the spacer 30 and the opening 37A of the second interlayer insulating film 37 are disposed so as to be complementary in the plane of the array substrate 21. Thereby, the number of spacers 30 installed and the number of openings 37A installed of the second interlayer insulating film 37 can be sufficiently secured. More specifically, in the second interlayer insulating film 37, the plurality of openings 37A are disposed for each intersection 21X among the plurality of intersections 21X aligned in the X-axis direction. In the second interlayer insulating film 37, the plurality of openings 37A are disposed for each intersection 21X among the plurality of intersections 21X aligned in the Y-axis direction. In this manner, in the second interlayer insulating film 37, the plurality of openings 37A are arranged in a planar manner in a checkerboard pattern in the plane of the array substrate 21. In this manner, in the second interlayer insulating film 37, the plurality of openings 37A being deflected in the plate surface of the array substrate 21 is avoided, and thus charge accumulated in the alignment film 33 can be uniformly removed.

Further, as illustrated in FIG. 5, FIG. 11, and FIG. 12, the first light blocking portion 29A of the light blocking portion 29 is disposed to overlap with the opening 37A of the second interlayer insulating film 37 in addition to the TFT 23, the gate wiring line 26, and the spacer 30. Specifically, the first light blocking portion 29A extending in the X-axis direction is disposed to overlap the plurality of spacers 30 and the plurality of openings 37A aligned alternately in the X-axis direction. The first light blocking portion 29A overlapping the plurality of openings 37A is wider than the second light blocking portion 29B. Thus, even when a positional deviation occurs in the opening 37A in the Y-axis direction when the opening 37A is provided in the second interlayer insulating film 37, there is increasing certainty that a relationship in which the opening 37A overlaps the first light blocking portion 29A is maintained. In the present embodiment, the opening 37A of the second interlayer insulating film 37 is disposed to overlap an intersection between the first light blocking portion 29A and the second light blocking portion 29B. Thus, it can be said that the opening 37A of the second interlayer insulating film 37 is also disposed to overlap the second light blocking portion 29B in addition to the first light blocking portion 29A.

The present embodiment has the above-described structure, and a manufacturing method for the array substrate 21 constituting the liquid crystal panel 11 will be subsequently described. The manufacturing method for the array substrate 21 according to the present embodiment includes at least a first step in which the first metal film is formed and patterned, a second step in which the gate insulating film 34 is formed, a third step in which the semiconductor film is formed and patterned, a fourth step in which the second metal film is formed and patterned, a fifth step in which the first interlayer insulating film 35 is formed, a sixth step in which the flattening film 36 is formed and patterned, a seventh step in which the first transparent electrode film is formed and patterned, an eighth step in which the second interlayer insulating film 37 is formed and patterned, a ninth step in which the second transparent electrode film is formed and patterned, and a tenth step in which the alignment film 33 is formed to perform photo-alignment treatment. Hereinafter, the sixth step will be described using FIG. 14 and FIG. 15.

Figure 14:
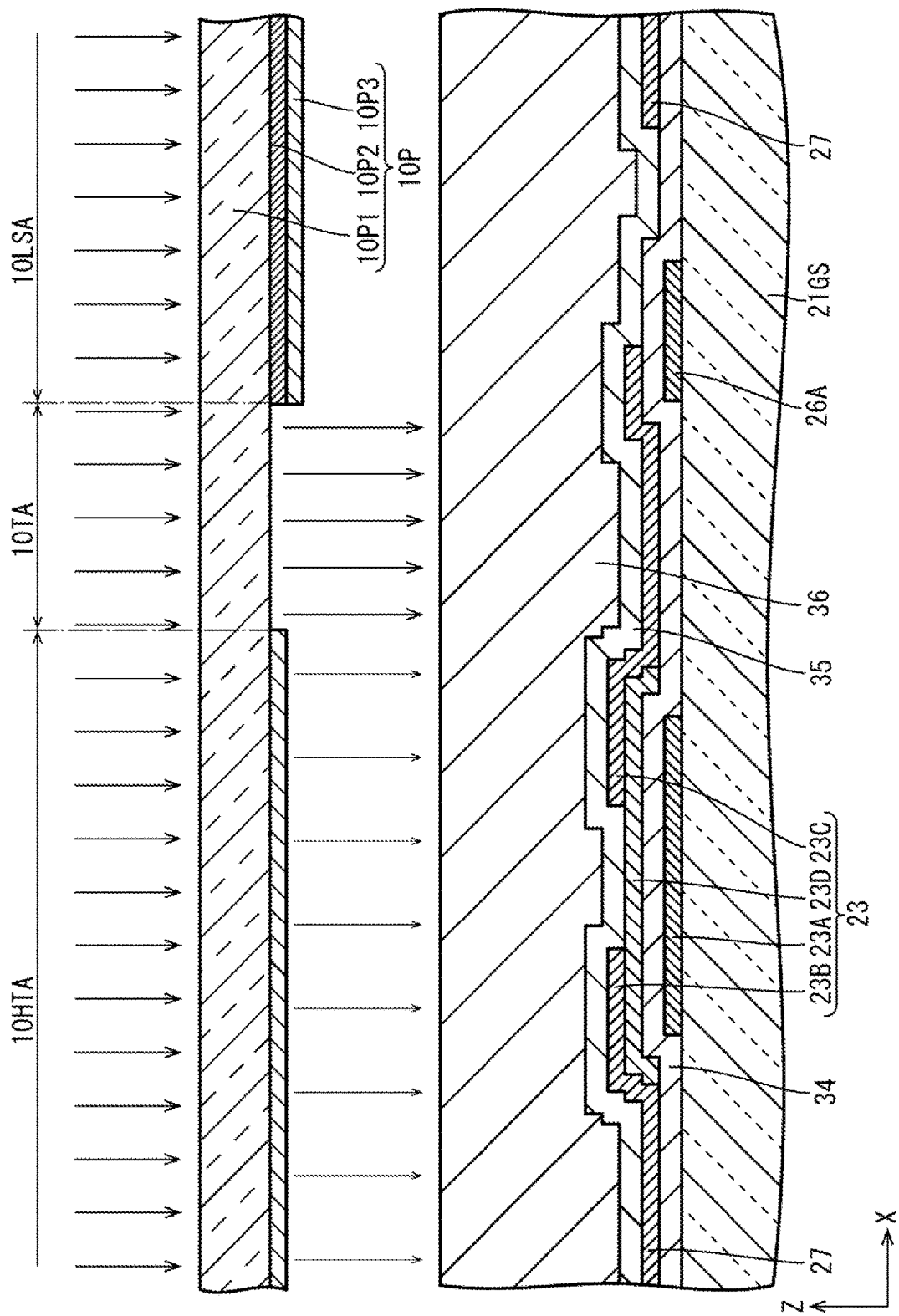
FIG. 14 is a cross-sectional view of the same cutting position as in FIG. 7 illustrating a state where a sixth step included in a manufacturing method for an array substrate is performed, and a formed flattening film is exposed.
Figure 15:
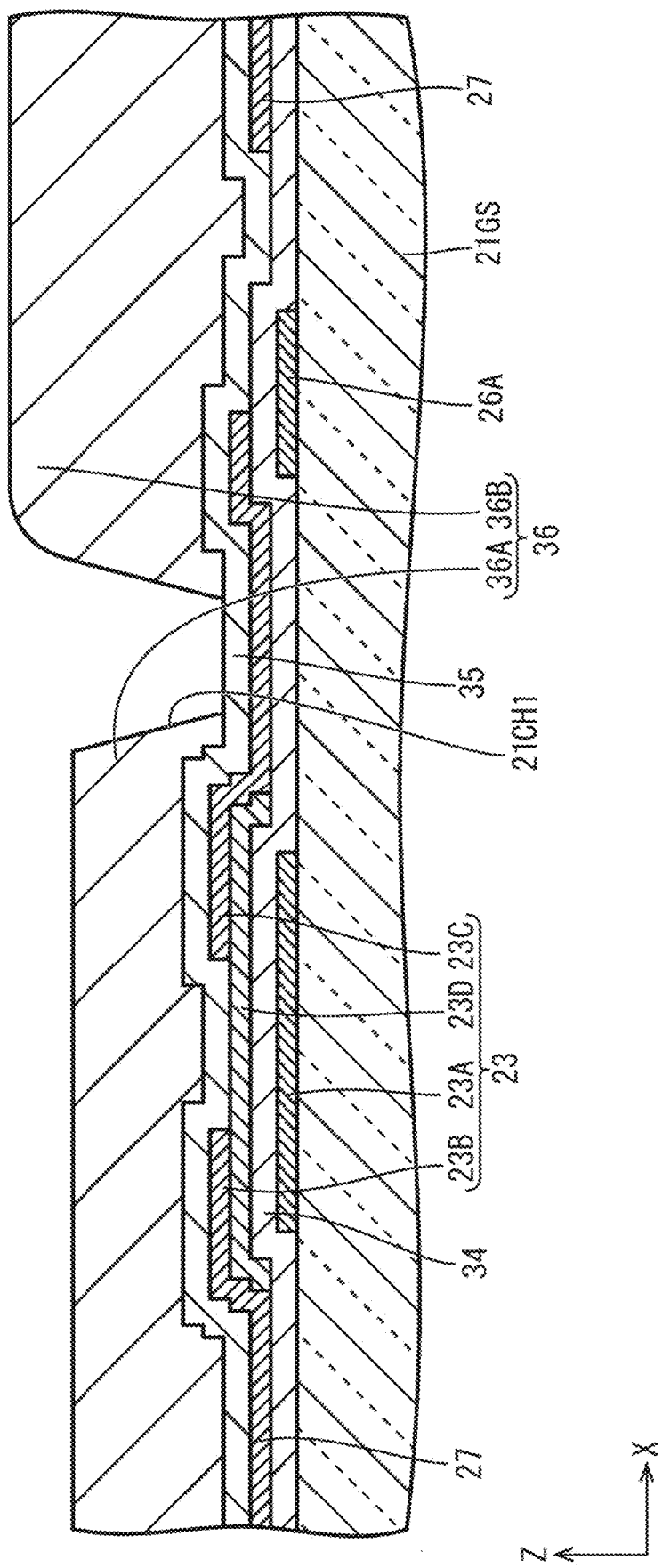
FIG. 15 is a cross-sectional view of the same cutting position as in FIG. 7 illustrating a state where the sixth step included in the manufacturing method for the array substrate is performed, and the exposed flattening film is developed.

FIG. 14 is a cross-sectional view of the same cutting position as in FIG. 7 illustrating a state where the sixth step included in the manufacturing method for the array substrate 21 is performed, and the formed flattening film 36 is exposed. FIG. 15 is a cross-sectional view of the same cutting position as in FIG. 7 illustrating a state where the sixth step included in the manufacturing method for the array substrate 21 is performed, and the exposed flattening film 36 is developed. In the sixth step, as illustrated in FIG. 14, the flattening film 36 having a solid form is formed on the upper layer side of the first interlayer insulating film 35. A positive photosensitive material is used as the material of the flattening film 36. Thus, the formed flattening film 36 is exposed using an exposure device and a photomask 10P without a resist film being layered on the upper layer side.

Here, the photomask 10P will be described. The photomask 10P used here is a so-called halftone mask. The photomask 10P includes a transparent base material 10P1 having a sufficiently high light transmittance, a light blocking film 10P2 formed on the plate surface of the base material 10P1, and a semi-transmissive film 10P3 formed on the plate surface of the base material 10P1 and partially layered on the light blocking film 10P2. The light blocking film 10P2 blocks exposure light emitted from a light source of the exposure device, and the transmittance of the exposure light is approximately 0%. The semi-transmissive film 10P3 transmits the exposure light emitted from the light source of the exposure device with a predetermined transmittance. In the semi-transmissive film 10P3, the transmittance of the exposure light is higher than the transmittance of exposure light in the light blocking film 10P2, and is, for example, approximately 10% to 70%. The light blocking film 10P2 and the semi-transmissive film 10P3 are patterned in a predetermined distribution pattern in the plane of the base material 10P1. The light blocking film 10P2 is selectively disposed at a position overlapping a portion of the flattening film 36 in which the second thick film portion 36B is to be formed. The semi-transmissive film 10P3 is selectively disposed at least at a position overlapping a portion of the flattening film 36 in which the first thick film portion 36A is to be formed. In the present embodiment, the semi-transmissive film 10P3 is also disposed at a position overlapping the light blocking film 10P2. In other words, the semi-transmissive film 10P3 is disposed at a position overlapping a portion other than a portion of the flattening film 36 in which the first contact hole 21CH1 is to be formed. The photomask 10P includes a light blocking region 10LSA that blocks exposure light, a transmissive region 10TA that transmits exposure light, and a semi-transmissive region 10HTA that allows semi-transmission of exposure light, based on the patterns of the light blocking film 10P2 and the semi-transmissive film 10P3. The light blocking region 10LSA matches the formation range of the light blocking film 10P2. The transmissive region 10TA matches an overlapping range between a non-formation range of the light blocking film 10P2 and a non-formation range of the semi-transmissive film 10P3. The transmissive region 10TA is disposed to overlap a portion of the flattening film 36 in which the first contact hole 21CH1 is to be formed. The semi-transmissive region 10HTA matches an overlapping range between a non-formation range of the light blocking film 10P2 and a formation range of the semi-transmissive film 10P3. Note that, in FIG. 14, exposure light emitted to the flattening film 36 is represented by a downward arrow.

In the sixth step, when exposure light emitted from the light source of the exposure device is emitted to the flattening film 36 via the photomask 10P having the above-described configuration, the flattening film 36 is selectively exposed to the light. Specifically, in the flattening film 36, a portion which overlaps the transmissive region 10TA of the photomask 10P is exposed over the entire depth. In the flattening film 36, an upper face side portion (upper layer side portion) in a portion overlapping the semi-transmissive region 10HTA of the photomask 10P is selectively exposed, and a bottom face side portion (lower layer side portion) is selectively not exposed. In the flattening film 36, a portion overlapping the light blocking region 10LSA of the photomask 10P is not exposed. When the flattening film 36 selectively exposed in this manner is developed, the exposed portion of the flattening film 36 is selectively removed in accordance with the amount of exposed light, as illustrated in FIG. 15. Specifically, in the flattening film 36, a portion overlapping the transmissive region 10TA of the photomask 10P is removed over the entire depth, resulting in the first contact hole 21CH1. In the flattening film 36, the upper face side portion in the portion overlapping the semi-transmissive region 10HTA of the photomask 10P is selectively removed, and the bottom face side portion is selectively left, resulting in the first thick film portion 36A. In the flattening film 36, a portion overlapping the light blocking region 10LSA of the photomask 10P remains over the entire depth, resulting in the second thick film portion 36B having a film thickness larger than that of the first thick film portion 36A. The flattening film 36 is patterned using the photomask 10P.

Note that, in order to form the first contact hole 21CH1 in the first interlayer insulating film 35, the first interlayer insulating film 35 may be etched using the flattening film 36 patterned as described above as a mask. Besides that, in the eighth step, when the second interlayer insulating film 37 is etched to form the opening 37A and the first contact hole 21CH1, the first interlayer insulating film 35 can also be etched to form the first contact hole 21CH1 of the first interlayer insulating film 35. When the latter method is adopted, the drain electrode 23C can be protected by the first interlayer insulating film 35 during at least the seventh step, in addition to reducing the number of times of etching.

As described above, the liquid crystal panel 11 of the present embodiment includes the array substrate 21, the counter substrate 20 disposed to face the array substrate 21, and the liquid crystal layer 22 sandwiched between the array substrate 21 and the counter substrate 20. The array substrate 21 is provided with the plurality of pixel electrodes 24 aligned at intervals in the plane of the array substrate 21, the common electrode 25 disposed to overlap the plurality of pixel electrodes 24, the second interlayer insulating film (insulating film) 37 disposed on the upper layer side of the common electrode 25, and the alignment film 33 disposed on the upper layer side of the second interlayer insulating film 37. At least one of the array substrate 21 and the counter substrate 20 is provided with the light blocking portion 29 separating the plurality of pixel electrodes 24, and the spacer 30 that is disposed to overlap the light blocking portion 29 and protrudes to the liquid crystal layer 22 side from at least one of the array substrate 21 and the counter substrate 20. The alignment film 33 is connected to the common electrode 25 directly through the opening 37A provided in the second interlayer insulating film 37 or via another member. In the second interlayer insulating film 37, the opening 37A is disposed at a position that does not overlap the spacer 30 but overlaps the light blocking portions 29.

According to such a configuration, the alignment state of the liquid crystal layer 22 is controlled using an electrical field generated between the plurality of pixel electrodes 24 and the common electrode 25 overlapping each other. Thereby, an image is displayed. Further, in a case where external force is applied to the array substrate 21 or the counter substrate 20, the deflection of the array substrate 21 or the counter substrate 20 can be regulated by the spacer 30. Thereby, an interval between the array substrate 21 and the counter substrate 20, that is, the thickness of the liquid crystal layer 22, is maintained. The alignment film 33 is connected to the common electrode 25 directly or via another member through the opening 37A of the second interlayer insulating film 37, and thus charge is less likely to remain in the alignment film 33. Thereby, a display failure is less likely to occur due to the remaining charge in the alignment film 33.

Here, a step is generated between a portion of the alignment film 33 which is connected to the common electrode 25 directly or via another member through the opening 37A of the second interlayer insulating film 37, and a portion of the alignment film 33 which is disposed on the upper layer side of the second interlayer insulating film 37. For this reason, in the vicinity of the opening 37A of the second interlayer insulating film 37, an alignment failure occurs in the liquid crystal molecules contained in the liquid crystal layer 22, and there is a concern that a display failure due to the alignment failure may occur.

In this regard, in the second interlayer insulating film 37, the opening 37A is provided at a position overlapping the light blocking portion 29, and thus, even when an alignment failure occurs in the liquid crystal molecules in the vicinity of the opening 37A, a display failure due to the alignment failure can be less likely to be visually recognized. Furthermore, in the second interlayer insulating film 37, the opening 37A is disposed at a position that does not overlap the spacer 30, and thus the flatness of the surface of any one of the array substrate 21 and the counter substrate 20 which faces the spacer 30 is secured. Thereby, a contact area between the spacer 30 and any one of the array substrate 21 and the counter substrate 20 is sufficiently secured, and thus the function of the spacer 30 is sufficiently exhibited. Moreover, a load from the spacer 30 is less likely to be applied to a portion of the alignment film 33 in the vicinity of the opening 37A of the second interlayer insulating film 37, and thus cutting due to the spacer 30 is less likely to occur. Thereby, an electrical connection state between the alignment film 33 and the common electrode 25 is easily maintained through the opening 37A of the second interlayer insulating film 37, and charge is less likely to remain in the alignment film 33. In addition, an alignment failure occurs in the liquid crystal molecules contained in the liquid crystal layer 22 in the vicinity of the spacer 30, and there is a concern that a display failure due to the alignment failure may occur. In this regard, the spacer 30 is disposed to overlap the light blocking portion 29, and thus a display failure due to the spacer 30 can be less likely to be visually recognized.

In addition, the array substrate 21 is provided with the plurality of TFTs (thin film transistors) 23 aligned at intervals in a first direction and a second direction that intersects the first direction, the plurality of gate wiring lines (first wiring lines) 26 that extend in the first direction and are aligned at intervals in the second direction, and the plurality of source wiring lines (second wiring lines) 27 that extend in the second direction to intersect the gate wiring lines 26 and are aligned at intervals in the first direction. The plurality of pixel electrodes 24 are aligned at intervals in the first direction and the second direction and connected to the plurality of TFTs 23. The gate wiring lines 26 are connected to the plurality of TFTs 23 aligned in the first direction. The source wiring lines 27 are connected to the plurality of TFTs 23 aligned in the second direction. The spacer 30 is disposed to overlap the intersection 21X between the gate wiring line 26 and the source wiring line 27, and the number of spacers 30 installed is smaller than the number of intersections 21X. The opening 37A overlaps at least one of the gate wiring line 26 and the source wiring line 27, is disposed to be aligned with the spacer 30 in at least one of the first direction and the second direction, and the number of openings 37A installed is equal to or less than a number obtained by subtracting the number of spacers 30 installed from the number of intersections 21X. In this manner, in the second interlayer insulating film 37, the opening 37A overlaps at least one of the gate wiring line 26 and the source wiring line 27, and is aligned with the spacer 30 in at least one of the first direction and the second direction, the spacer 30 being disposed to overlap the intersection 21X between the gate wiring line 26 and the source wiring line 27. The number of openings 37A installed in this manner is equal to or less than a number obtained by subtracting the number of spacers 30 installed from the number of intersections 21X between the plurality of gate wiring lines 26 and the plurality of source wiring lines 27. Thereby, the number of spacers 30 installed and the number of openings 37A installed of the second interlayer insulating film 37 can be sufficiently secured.

In addition, the number of openings 37A installed is a number obtained by subtracting the number of spacers 30 installed from the number of intersections 21X. In this manner, the spacers 30 and the openings 37A of the second interlayer insulating film 37 are disposed so as to be complementary in the plane of the array substrate 21. Thereby, the number of spacers 30 installed and the number of openings 37A installed of the second interlayer insulating film 37 can be sufficiently secured.

In addition, the plurality of spacers 30 are disposed for each intersection 21X among the plurality of intersections 21X aligned in the first direction, and are disposed for each intersection 21X among the plurality of intersections 21X aligned in the second direction. In this manner, the plurality of spacers 30 and the plurality of openings 37A of the second interlayer insulating film 37 are arranged in a planar manner in a checkerboard pattern. The plurality of spacers 30 being deflected in the plate surfaces of the array substrate 21 and the counter substrate 20 is avoided, and thus an interval between the array substrate 21 and the counter substrate 20 can be maintained more stably. In the second interlayer insulating film 37, the plurality of openings 37A being deflected in the plate surface of the array substrate 21 is avoided, and thus charge accumulated in the alignment film 33 can be uniformly removed.

In addition, the light blocking portion 29 includes the first light blocking portion 29A extending in the first direction and overlapping the TFT 23, the gate wiring line 26, the spacer 30, and the opening 37A, and the second light blocking portion 29B extending in the second direction, overlapping the source wiring line 27, and having a width smaller than that of the first light blocking portion 29A. In this manner, the first light blocking portion 29A overlapping the opening 37A of the second interlayer insulating film 37 is wider than the second light blocking portion 29B. Thus, even when a positional deviation occurs in the opening 37A at the time of providing the opening 37A in the second interlayer insulating film 37, there is increasing certainty that a relationship in which the opening 37A overlaps the first light blocking portion 29A is maintained.

In addition, the pixel electrode 24 is disposed on the lower layer side of the alignment film 33 and on the upper layer side of the second interlayer insulating film 37. In this manner, the second interlayer insulating film 37 is disposed to be sandwiched between the pixel electrode 24 on the upper layer side and the common electrode 25 on the lower layer side. For this reason, the film thickness of the second interlayer insulating film 37 is a size suitable for maintaining a sufficiently high strength of an electrical field generated between the pixel electrode 24 and the common electrode 25, and is much smaller than the film thickness of a typical flattening film. On the other hand, the film thickness of the second interlayer insulating film 37 is generally larger than the film thicknesses of the pixel electrode 24 and the common electrode 25. Here, a step generated between a portion of the alignment film 33 which is connected to the common electrode 25 directly or via another member through the opening 37A of the second interlayer insulating film 37 and a portion of the alignment film 33 which is disposed on the upper layer side of the second interlayer insulating film 37 depends on the film thickness of the second interlayer insulating film 37. Since the film thickness of the second interlayer insulating film 37 is set as described above, it is unavoidable that an alignment failure occurs to a certain extent in the liquid crystal molecules in the vicinity of the opening 37A. In this regard, in the second interlayer insulating film 37, the opening 37A is provided at a position overlapping the light blocking portion 29, and thus, even when an alignment failure occurs in the liquid crystal molecules in the vicinity of the opening 37A, a display failure due to the alignment failure can be less likely to be visually recognized.

In addition, the spacer 30 is provided to protrude to the liquid crystal layer 22 side from the counter substrate 20, and the array substrate 21 is provided with the flattening film 36 disposed on the lower layer side of the common electrode 25. The flattening film 36 includes the first thick film portion 36A and the second thick film portion 36B. The first thick film portion 36A has a film thickness larger than that of the second interlayer insulating film 37, is disposed not to overlap the spacer 30, and is disposed to overlap the common electrode 25 and the pixel electrode 24. The second thick film portion 36B has a film thickness larger than that of the first thick film portion 36A and is disposed to overlap the spacer 30. In this manner, a portion of the alignment film 33 which overlaps the second thick film portion 36B of the flattening film 36 is disposed to protrude to the liquid crystal layer 22 side more than the portion of the alignment film 33 which overlaps the first thick film portion 36A. The spacer 30 protruding from the counter substrate 20 to the liquid crystal layer 22 side is received by a portion of the alignment film 33, provided in the array substrate 21, which overlaps the second thick film portion 36B when external force is applied to the array substrate 21 or the counter substrate 20. Thereby, the deflection of the array substrate 21 or the counter substrate 20 can be regulated. Furthermore, in one flattening film 36, a portion overlapping the spacer 30 is selectively set as the second thick film portion 36B, and thus it is not necessary to provide two flattening films.

Second Embodiment

A second embodiment will be described with reference to FIG. 16. In the second embodiment, a change of a film layered on the inner surface side of an array substrate 121 is described. Note that repetitive descriptions of structures, actions, and effects similar to those of the first embodiment described above will be omitted.

Figure 16:
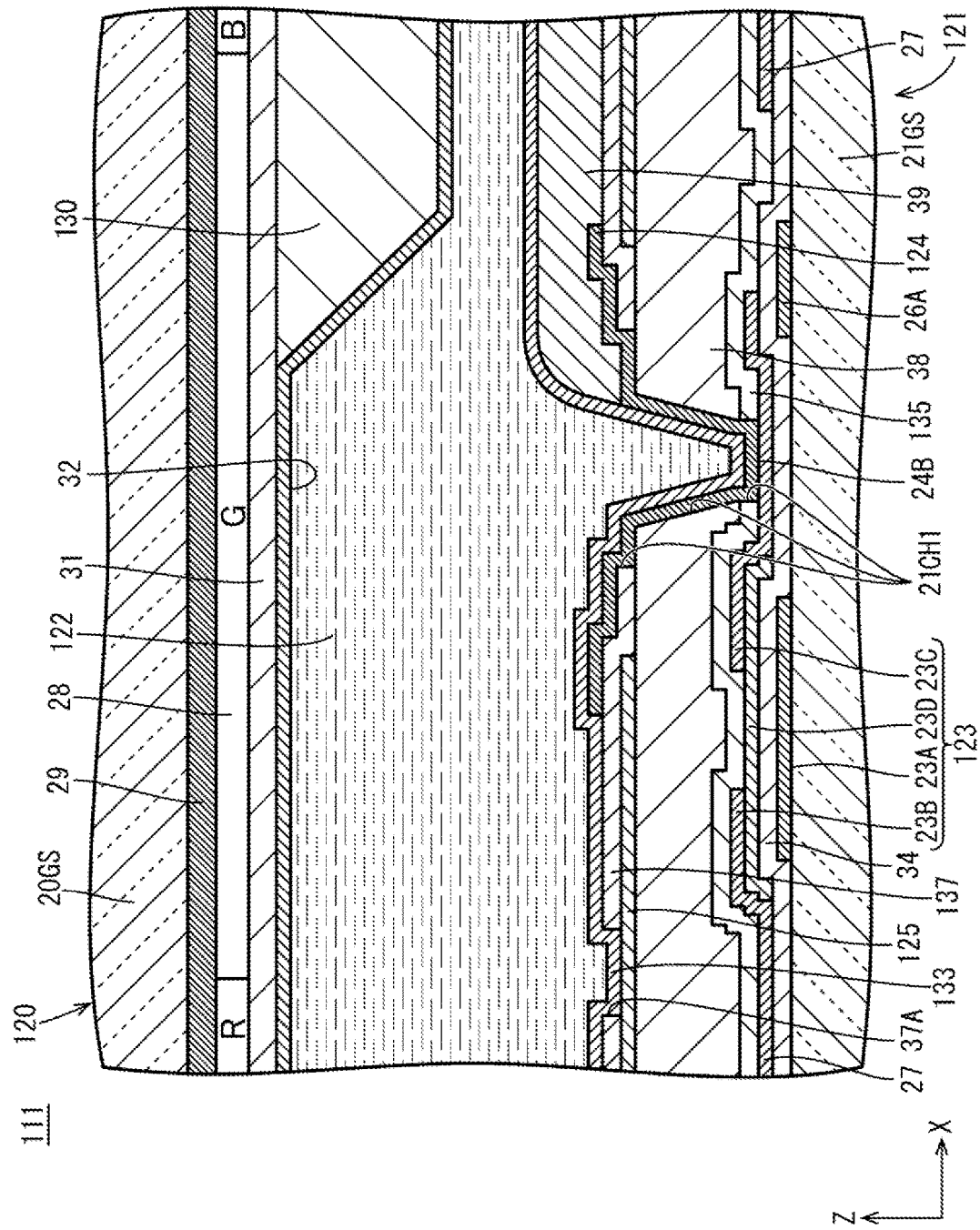
FIG. 16 is a cross-sectional view of the vicinity of a TFT and the vicinity of a second spacer (the same position as in FIG. 7) in a liquid crystal panel according to a second embodiment.

FIG. 16 is a cross-sectional view of the vicinity of a TFT 123 and the vicinity of a spacer 130 (the same position as in FIG. 7) in a liquid crystal panel 111. As illustrated in FIG. 16, the array substrate 121 according to the present embodiment is provided with a first flattening film 38 and a second flattening film 39. The first flattening film 38 is disposed on the upper layer side of a first interlayer insulating film 135 and on the lower layer side of a common electrode 125 constituted by a first transparent electrode film. The second flattening film 39 is disposed on the lower layer side of an alignment film 133 and on the upper layer side of a pixel electrode 124 constituted by a second transparent electrode film. Note that, in the present embodiment, the flattening film 36 (see FIG. 7) described above in the first embodiment is removed in accordance with the installation of the first flattening film 38 and the second flattening film 39.

Both the first flattening film 38 and the second flattening film 39 are formed of an organic material such as PMMA (acrylic resin), and have photosensitivity. The formation range of the first flattening film 38 in the surface of the array substrate 121 is the same as the formation range of the flattening film 36 described in the first embodiment. Thus, the first flattening film 38 is disposed to overlap the spacer 130, the common electrode 125, and the pixel electrode 124. Additionally, in the first flattening film 38, the first contact hole 21CH1 is provided in communication with the first interlayer insulating film 135 and a second interlayer insulating film 137. The first flattening film 38 has a film thickness which is larger than that of the second interlayer insulating film 137 and is equivalent to the film thickness of the first thick film portion 36A (see FIG. 7) described above in the first embodiment. The first flattening film 38 has a substantially uniform film thickness over the entire region in the plane of the array substrate 121 regardless of a positional relationship with the spacer 130.

The second flattening film 39 is disposed to overlap the spacer 130. Specifically, the second flattening film 39 is disposed to be distributed to a plurality of positions spaced apart from each other at intervals in the X-axis direction and the Y-axis direction and is disposed to overlap each of the plurality of spacers 130. In this manner, the second flattening film 39 is arranged in a planar manner in a checkerboard pattern in the plane of the array substrate 121 and is adapted to the planar arrangement of the spacer 130. That is, the formation range of the second flattening film 39 in the plane of the array substrate 121 is the same as the formation range of the second thick film portion 36B (see FIG. 7) described in the first embodiment. The formation range of the second flattening film 39 when viewed in a plan view has a substantially circular shape similar to that of the spacer 130. The second flattening film 39 has a film thickness larger than that of the second interlayer insulating film 137. The film thickness of the second flattening film 39 is equivalent to a size obtained by subtracting the film thickness of the first thick film portion 36A from the film thickness of the second thick film portion 36B described above in the first embodiment. Such a second flattening film 39 is disposed to overlap the first flattening film 38. Thus, a portion of the alignment film 133 which overlaps the second flattening film 39 is disposed to protrude to a liquid crystal layer 122 side in the Z-axis direction more than a portion which overlaps the first flattening film 38 but does not overlap the second flattening film 39. With such a configuration, the second flattening film 39 can receive a protrusion tip end face of the spacer 130 through the alignment film 133 over substantially the entire region. Thereby, the deflection of the array substrate 121 or a counter substrate 120 can be regulated. Furthermore, since the second flattening film 39 is disposed on the lower layer side of the alignment film 133 and on the upper layer side of the pixel electrode 124, the second flattening film 39 can protect the pixel electrode 124 and the common electrode 125 from force applied when the spacer 130 comes into contact with the portion of the alignment film 133 which overlaps the second flattening film 39. Thereby, the pixel electrode 124 and the common electrode 125 are less likely to be damaged. In addition, the flatness of the second flattening film 39 overlapping the spacer 130 is high as compared to a case where the film thickness of one flattening film 36 is partially different as in the first embodiment. Thereby, the spacer 130 can be stably received by the second flattening film 39.

As described above, according to the present embodiment, the spacer 130 is provided to protrude to the liquid crystal layer 122 side from the counter substrate 120. The array substrate 121 is provided with the first flattening film 38 disposed on the lower layer side of the common electrode 125, and the second flattening film 39 disposed on the lower layer side of the alignment film 133 and on the upper layer side of the pixel electrode 124. The first flattening film 38 has a film thickness larger than that of the second interlayer insulating film 137 and is disposed to overlap the spacer 130, the common electrode 125, and the pixel electrode 124. The second flattening film 39 has a film thickness larger than that of the second interlayer insulating film 137 and is disposed to overlap the spacer 130. In this manner, the second flattening film 39 is disposed to overlap the spacer 130 and the first flattening film 38. Thus, a portion of the alignment film 133 which overlaps the second flattening film 39 is disposed to protrude to the liquid crystal layer 122 side more than a portion of the alignment film 133 that does not overlap the second flattening film 39 but overlaps the first flattening film 38. The spacer 130 protruding from the counter substrate 120 to the liquid crystal layer 122 side is received by a portion of the alignment film 133, provided in the array substrate 121, which overlaps the second flattening film 39 when external force is applied to the array substrate 121 or the counter substrate 120. Thereby, the deflection of the array substrate 121 or the counter substrate 120 can be regulated. Furthermore, since the second flattening film 39 is disposed on the upper layer side of the pixel electrode 124, the second flattening film 39 can protect the pixel electrode 124 and the common electrode 125 from force applied when the spacer 130 comes into contact with the portion of the alignment film 133 which overlaps the second flattening film 39. Thereby, the pixel electrode 124 and the common electrode 125 are less likely to be damaged. In addition, the flatness of the second flattening film 39 overlapping the spacer 130 is high as compared to a case where the film thickness of one flattening film is partially different. Thereby, the spacer 130 can be stably received by the second flattening film 39.

Third Embodiment

A third embodiment will be described with reference to FIG. 17 to FIG. 19. In the third embodiment, a configuration obtained by adding a connection electrode 40 to the configuration described above in the second embodiment is described. Note that redundant descriptions of structures, actions, and effects similar to those of the second embodiment described above will be omitted.

Figure 17:
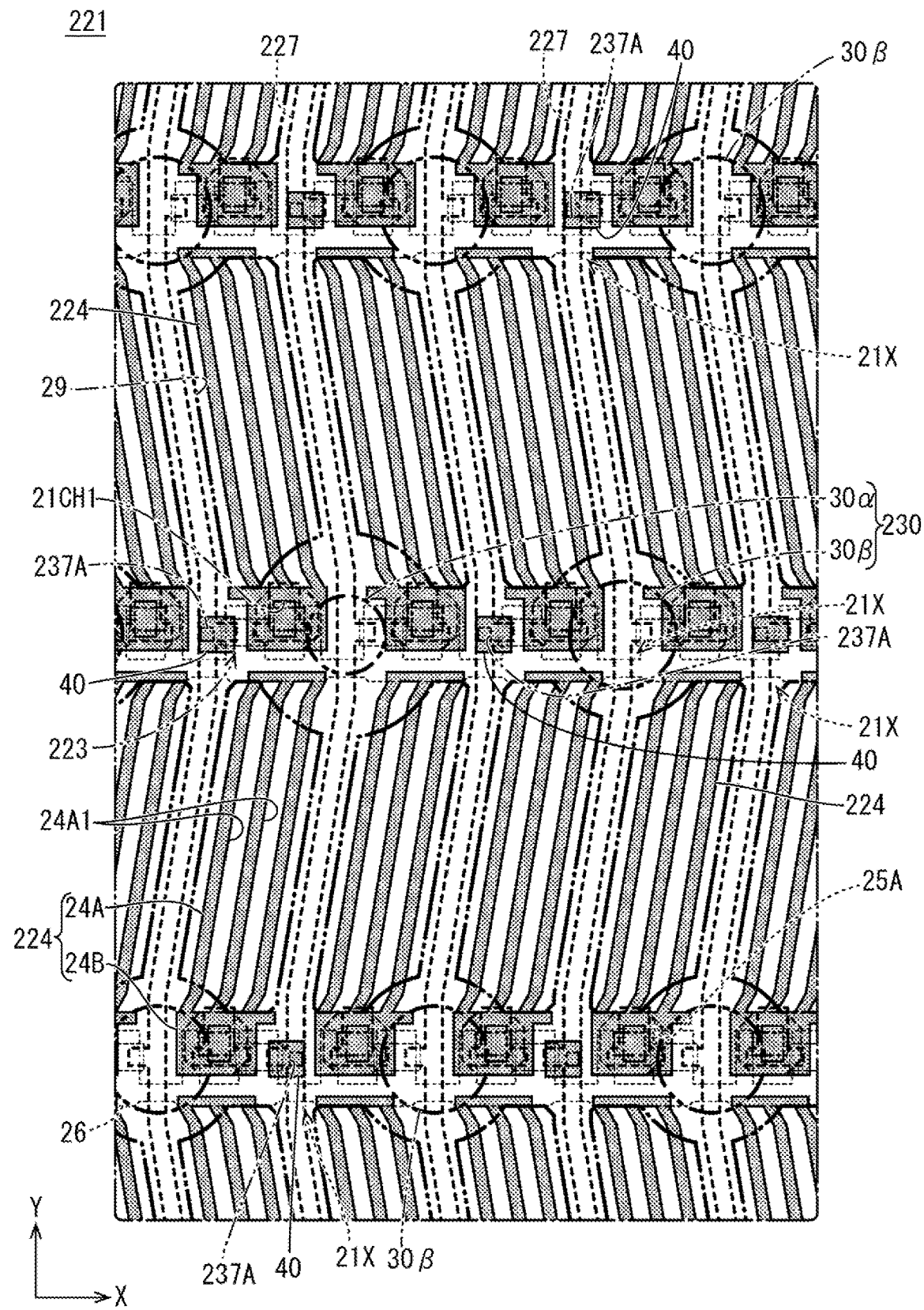
FIG. 17 is a plan view illustrating a pixel array in a display region of an array substrate according to a third embodiment, and is a plan view illustrating second transparent electrode films with shading.

FIG. 17 is a plan view illustrating a pixel array in the display region AA of an array substrate 221, and is a plan view illustrating second transparent electrode films (pixel electrodes 224 and the like) with shading. FIG. 18 is an enlarged plan view of the vicinity of a TFT 223 of the array substrate 221 (the same range as in FIG. 11), and is a plan view illustrating a first transparent electrode film (a common electrode 225 and the like) and second transparent electrode films with different levels of shading. FIG. 19 is a cross-sectional view of the vicinity of the TFT 223 and a spacer 230 (a cross-sectional view taken along line xix-xix in FIG. 18) in a liquid crystal panel 211.

Figure 18:
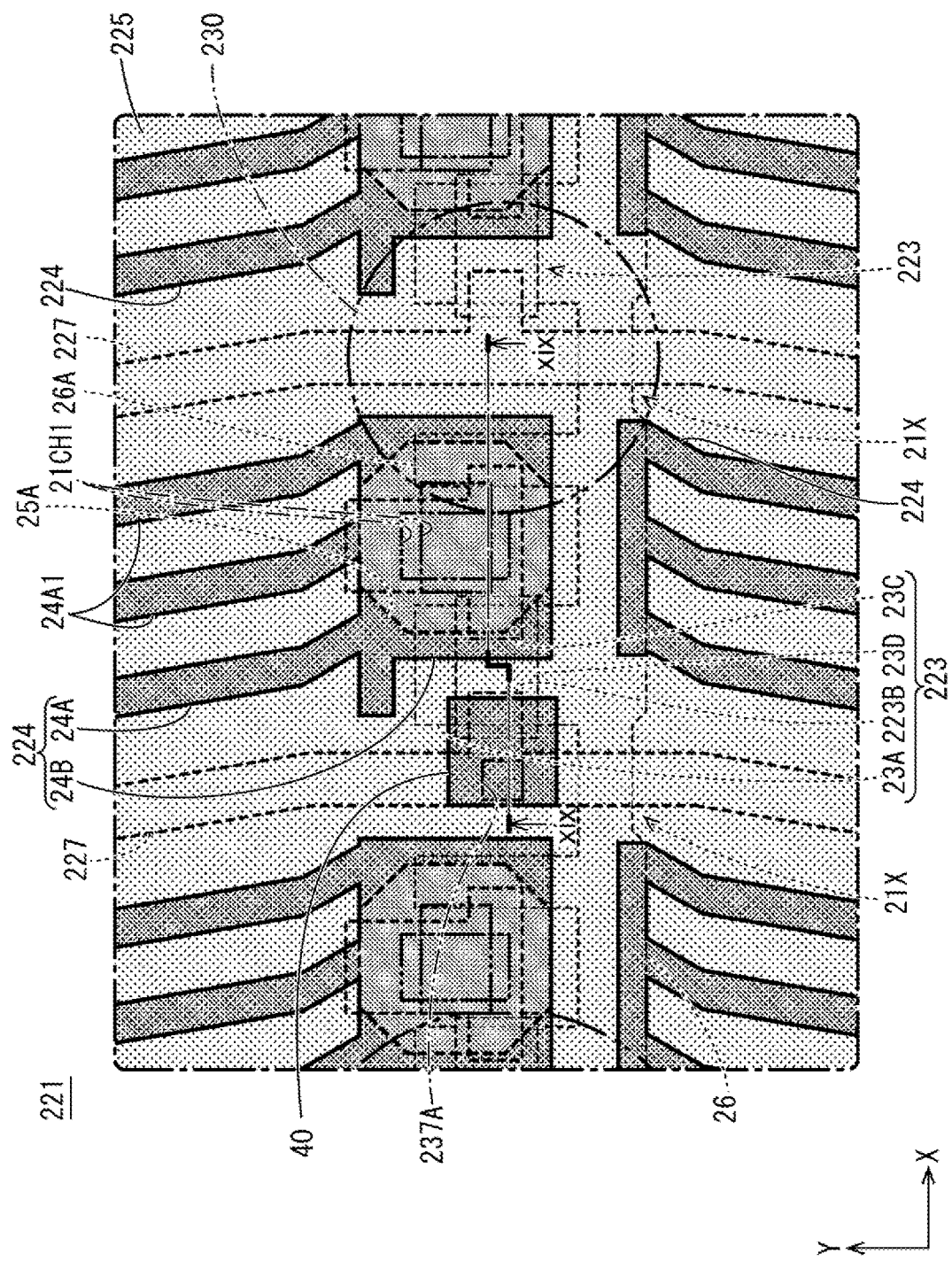
FIG. 18 is an enlarged plan view of the vicinity of a TFT (the same range as in FIG. 11) of the array substrate, and is a plan view illustrating a first transparent electrode film and second transparent electrode films with different levels of shading.
Figure 19:
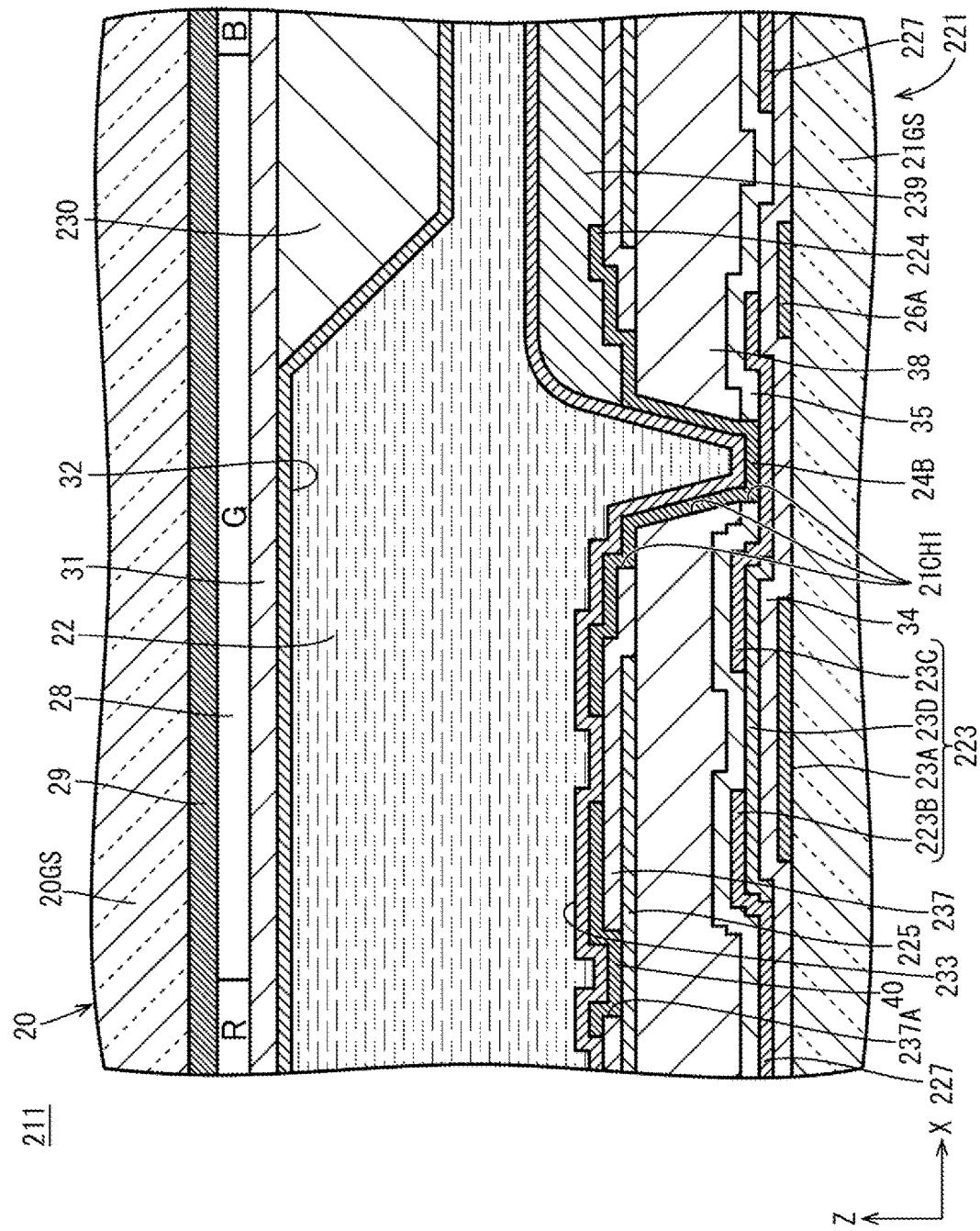
FIG. 19 is a cross-sectional view of a liquid crystal panel taken along line xix-xix in FIG. 18.

As illustrated in FIG. 17 to FIG. 19, the array substrate 221 according to the present embodiment is provided with a connection electrode (another member) 40 connected to the common electrode 225. The connection electrode 40 is constituted by a portion separate from the pixel electrode 224 in the second transparent electrode film. That is, the connection electrode 40 is positioned on the lower layer side of a second flattening film 239 and on the upper layer side of a second interlayer insulating film 237. The connection electrode 40 is disposed not to overlap the second flattening film 239 but to overlap an opening 237A of the second interlayer insulating film 237. The entire region of the connection electrode 40 that does not overlap the second flattening film 239 is in contact with an alignment film 233. In addition, the connection electrode 40 that overlaps the opening 237A of the second interlayer insulating film 237 is connected to the common electrode 225 on the lower layer side through the opening 237A. That is, the alignment film 233 is connected to the common electrode 225 indirectly via the connection electrode 40 which is another member. Thereby, charge on the surface and inside the alignment film 233 can be allowed to flow to the common electrode 225 through the connection electrode 40. A contact area between the connection electrode 40 and the alignment film 233 can be expanded in accordance with the formation range of the connection electrode 40 irrespective of the range of the opening 237A of the second interlayer insulating film 237, and thus charge is less likely to remain in the alignment film 233. In particular, a preferable result is obtained in a case where the number of spacers 230 installed is increased, and the number of openings 237A installed is decreased.

As illustrated in FIG. 17, a plurality of connection electrodes 40 are provided to individually overlap all of the openings 237A provided in the second interlayer insulating film 237. The number of connection electrodes 40 installed is equal to the number of openings 237A installed in the second interlayer insulating film 237. The plurality of connection electrodes 40 have a planar arrangement in the plane of the array substrate 221 which is the same as the planar arrangement of the plurality of openings 237A in the second interlayer insulating film 237. The connection electrode 40 is positioned between two pixel electrodes 224 adjacent to each other in the X-axis direction, and is not disposed between two pixel electrodes 224 adjacent to each other in the Y-axis direction. As illustrated in FIG. 18 and FIG. 19, the connection electrode 40 is disposed not to overlap the second flattening film 239 and the spacer 230 and is disposed to overlap a source wiring line 227 and a source electrode 223B. As illustrated in FIG. 18, the connection electrode 40 has a rectangular shape when viewed in a plan view, and dimensions thereof (formation range when viewed in a plan view) in the X-axis direction and the Y-axis direction are larger than dimensions of the opening 237A of the second interlayer insulating film 237 in the X-axis direction and the Y-axis direction. The connection electrode 40 overlaps the entire region of the opening 237A of the second interlayer insulating film 237, and also overlaps the peripheral edge portion of the opening 237A. The connection electrode 40 is disposed to be aligned with the spacer 230 in the X-axis direction. The connection electrode 40 is disposed such that a straight line connecting the center of the connection electrode 40 when viewed in a plan view and the center of the spacer 230 when viewed in a plan view is substantially parallel to the X-axis direction. In this manner, the connection electrode 40 is limited to being disposed to be sandwiched between two pixel electrodes 224 adjacent to each other in the X-axis direction. Thus, the connection electrode 40 constituted by a portion of the second transparent electrode film which is separate from the pixel electrode 224 is less likely to be short-circuited to the pixel electrode 224.

As described above, according to the present embodiment, the pixel electrode 224 is constituted by a portion of the second transparent electrode film (transparent electrode film). Further, the connection electrode 40 which is constituted by a portion of the second transparent electrode film which is separate from the pixel electrode 224, brought into contact with the alignment film 233, and connected to the common electrode 225 through the opening 237A is provided in the array substrate 221 as another member. In this manner, the connection electrode 40 that is brought into contact with the alignment film 233 is connected to the common electrode 225 through the opening 237A. Thus, charge of the alignment film 233 can be allowed to flow to the common electrode 225 through the connection electrode 40. A contact area between the connection electrode 40 and the alignment film 233 can be expanded in accordance with the formation range of the connection electrode 40 irrespective of the range of the opening 237A of the second interlayer insulating film 237, and thus charge is less likely to remain in the alignment film 233. In particular, a preferable result is obtained in a case where the number of spacers 230 installed is increased, and the number of openings 237A installed is decreased.

In addition, the plurality of pixel electrodes 224 are disposed side by side at intervals in the first direction and the second direction intersecting the first direction. The connection electrode 40 is positioned between two pixel electrodes 224 adjacent to each other in one direction of the first direction and the second direction and is not disposed between two pixel electrodes 224 adjacent to each other in the other direction out of the first direction and the second direction. In this manner, the connection electrodes 40 are limited to being disposed to be sandwiched between two pixel electrodes 224 adjacent to each other in one direction of the first direction and the second direction. Thus, the connection electrode 40 constituted by a portion of the second transparent electrode film which is separate from the pixel electrode 224 is less likely to be short-circuited to the pixel electrode 224.

Fourth Embodiment

A fourth embodiment will be described with reference to FIG. 20 to FIG. 23. In the fourth embodiment, a change of a configuration of a connection electrode 340 from the above-described third embodiment is described. Note that redundant descriptions of structures, actions, and effects similar to those of the second and third embodiments described above will be omitted.

Figure 20:
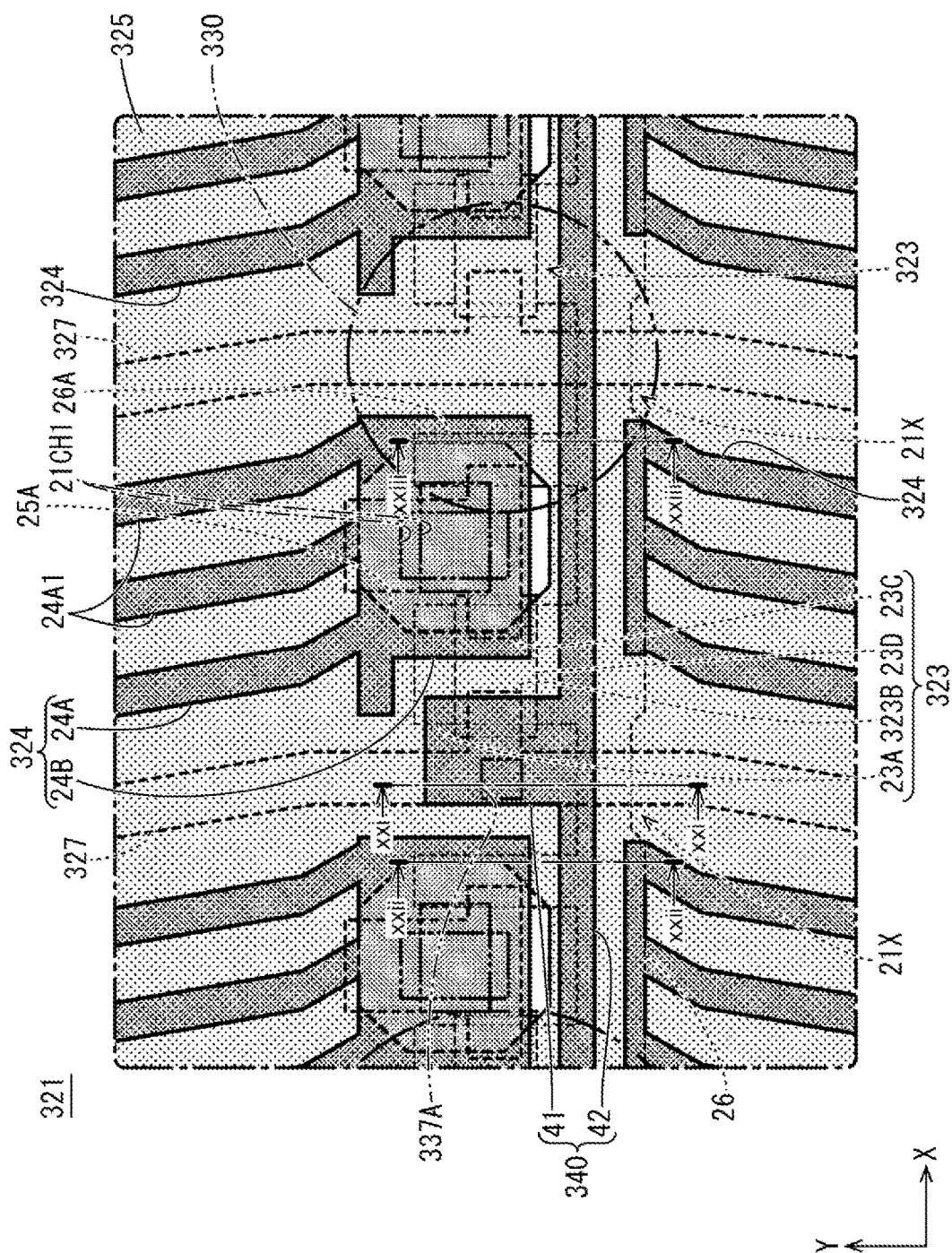
FIG. 20 is an enlarged plan view of the vicinity of a TFT (the same range as in FIG. 11) of an array substrate according to a fourth embodiment, and is a plan view illustrating a first transparent electrode film and second transparent electrode films with different levels of shading.
Figure 21:
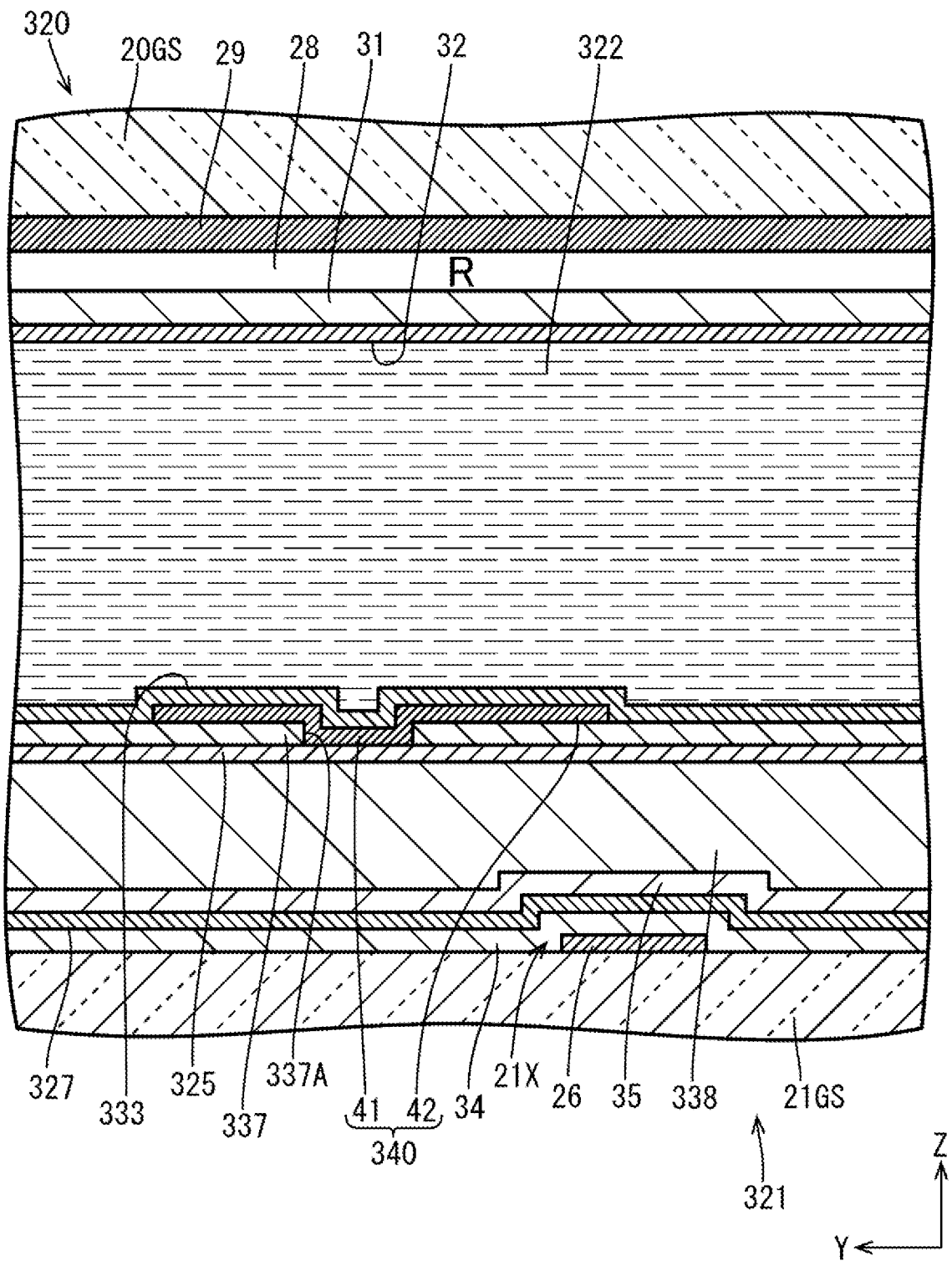
FIG. 21 is a cross-sectional view of a liquid crystal panel taken along line xxi-xxi in FIG. 20.
Figure 22:
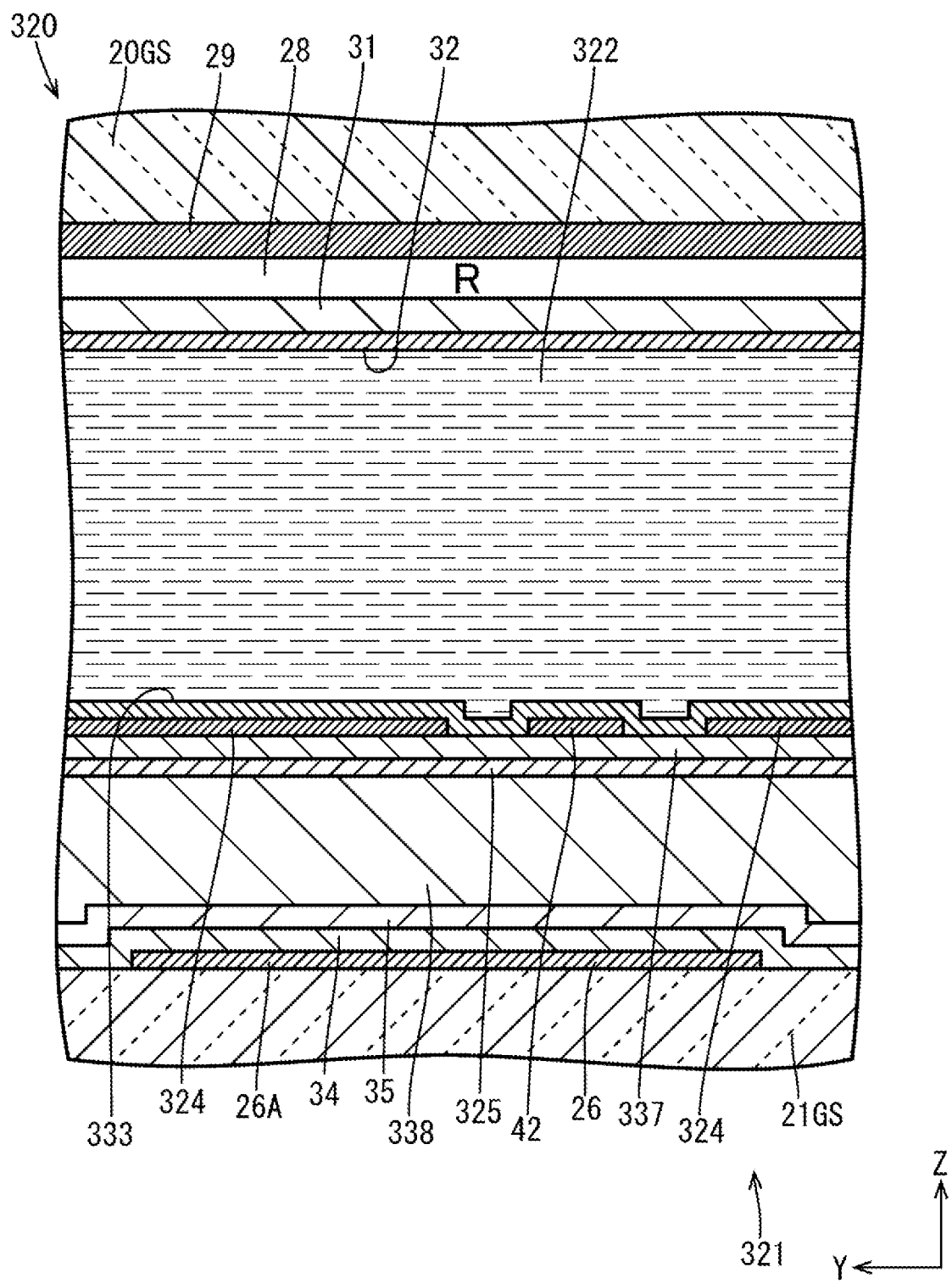
FIG. 22 is a cross-sectional view of the liquid crystal panel taken along line xxii-xxii in FIG. 20.
Figure 23:
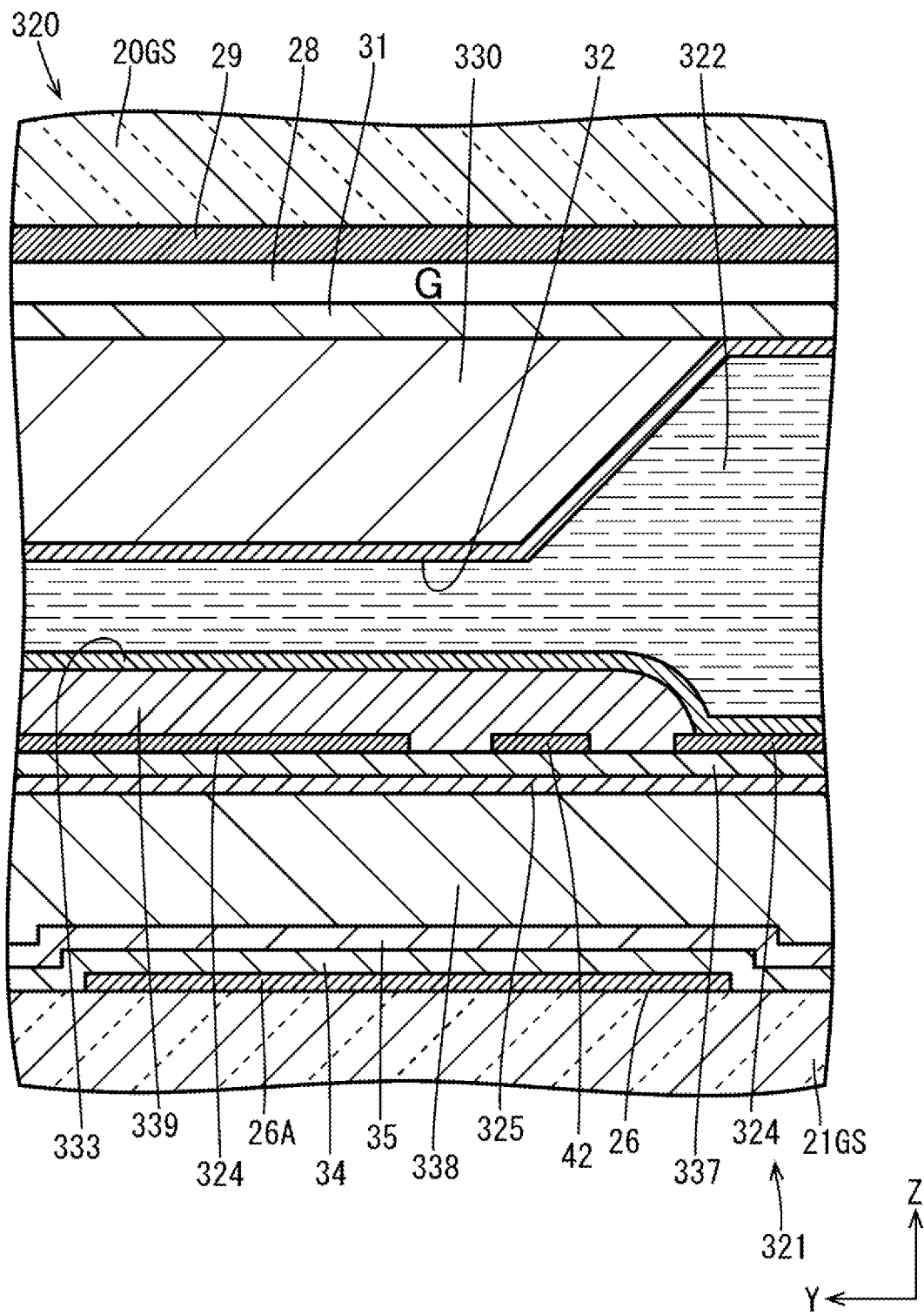
FIG. 23 is a cross-sectional view of the liquid crystal panel taken along line xxiii-xxiii in FIG. 20.

FIG. 20 is an enlarged plan view of the vicinity of a TFT 323 (the same range as in FIG. 11) of an array substrate 321, and is a plan view illustrating a first transparent electrode film (a common electrode 325 and the like) and second transparent electrode films (pixel electrodes 324 and the like) with different levels of shading. FIG. 21 is a cross-sectional view of the liquid crystal panel 211 taken along line xxi-xxi in FIG. 20. FIG. 22 is a cross-sectional view of the liquid crystal panel 211 taken along line xxii-xxii in FIG. 20. FIG. 23 is a cross-sectional view of the liquid crystal panel 211 taken along line xxiii-xxiii in FIG. 20.

As illustrated in FIG. 20, the connection electrode 340 according to the present embodiment includes an electrode main body 41 connected to the common electrode 325 through an opening 337A, and an extending portion 42 extending from the electrode main body 41. The electrode main body 41 is positioned between two pixel electrodes 324 adjacent to each other in the X-axis direction, and is disposed to overlap the opening 337A of a second interlayer insulating film 337. As illustrated in FIG. 20 and FIG. 21, the electrode main body 41 is disposed not to overlap the second flattening film 239 and the spacer 230 and is disposed to overlap a source wiring line 327 and a source electrode 323B. That is, the electrode main body 41 is disposed in substantially the same manner as the connection electrode 40 (see FIG. 18) described above in the third embodiment. The electrode main body 41 has a rectangular shape when viewed in a plan view, and dimensions thereof in the X-axis direction and the Y-axis direction (formation range when viewed in a plan view) are larger than dimensions of the connection electrode 40 in the X-axis direction and the Y-axis direction described above in the third embodiment.

As illustrated in FIG. 20, the extending portion 42 is disposed between two pixel electrodes 324 adjacent to each other in the Y-axis direction and has a band shape that extends in the X-axis direction. The extending portion 42 has a length that intersects the plurality of source wiring lines 327. That is, the extending portion 42 intersects both the source wiring line 327 that overlaps the electrode main body 41 (opening 337A) and the source wiring line 327 that overlaps a spacer 330. As illustrated in FIG. 20 and FIG. 21, a portion of the extending portion 42 which intersects the source wiring line 327 overlapping the electrode main body 41 is connected to the electrode main body 41. In this manner, as illustrated in FIG. 21 and FIG. 22, the connection electrode 340 includes the extending portion 42 extending from the electrode main body 41 connected to the common electrode 325 through the opening 337A, and thus a contact area with an alignment film 333 is expanded as compared to a configuration without the extending portion 42 as in the connection electrode 40 (see FIG. 18) described above in the third embodiment. Thereby, charge is less likely to remain in the alignment film 333 than in the third embodiment. In particular, when the number of spacers 330 installed is increased and the number of openings 337A installed is decreased, a more preferable result than in the third embodiment is obtained. In addition, the electrode main body 41 is positioned between two pixel electrodes 324 adjacent to each other in the X-axis direction, while the extending portion 42 is positioned between two pixel electrodes 324 adjacent to each other in the Y-axis direction. Thus, a short circuit occurring between the connection electrode 340 and the pixel electrode 324, which are both constituted by the same second transparent electrode film, is avoided.

As illustrated in FIG. 20 and FIG. 23, a portion of the extending portion 42 is disposed to overlap the spacer 330 and a second flattening film 339. The second flattening film 339 is positioned on the upper layer side of the pixel electrode 324, and the extending portion 42, which are constituted by the second transparent electrode film, and is positioned on the lower layer side of the alignment film 333. According to such a configuration, when the spacer 330 comes into contact with a portion of the alignment film 333 which overlaps the second flattening film 339, force applied from the spacer 330 can be received by the second flattening film 339 positioned on the upper layer side of the pixel electrode 324 and the extending portion 42. Thereby, the pixel electrode 324, the common electrode 325, and the extending portion 42 can be protected, and thus the pixel electrode 324, the common electrode 325, and the extending portion 42 are less likely to be damaged. In particular, since the extending portion 42 is hardly damaged, the extending portion 42 is less likely to be damaged, and thus a short circuit due to the damaged extending portion 42 is less likely to occur between two pixel electrodes 324 adjacent to each other in the Y-axis direction. In addition, the second interlayer insulating film 337 positioned on the lower layer side of the extending portion 42 is flattened over the entire length of the extending portion 42 by a first flattening film 338 which is the underlayer of the second interlayer insulating film 337. Thus, a step is avoided being generated between a portion of the extending portion 42 which does not overlap the second flattening film 339 but overlaps the first flattening film 338 (see FIG. 22), and a portion of the extending portion 42 that overlaps both the first flattening film 338 and the second flattening film 339 (see FIG. 23). Thereby, the coverage of the extending portion 42 is improved.

As described above, according to the present embodiment, the plurality of pixel electrodes 324 are disposed side by side at intervals in a first direction and a second direction intersecting the first direction. The connection electrode 340 includes the electrode main body 41 and the extending portion 42. The electrode main body 41 is positioned between two pixel electrodes 324 adjacent to each other in one direction of the first direction and the second direction and is connected to the common electrode 325 through the opening 337A. The extending portion 42 is positioned between two pixel electrodes 324 adjacent to each other in the other direction out of the first direction and the second direction and extends from the electrode main body 41. In this manner, the connection electrode 340 includes the extending portion 42 that extends from the electrode main body 41 connected to the common electrode 325 through the opening 337A, and thus a contact area with the alignment film 333 is expanded as compared to a case where the connection electrode is constituted by only the electrode main body 41. Thereby, charge is less likely to remain in the alignment film 333. In addition, the electrode main body 41 is positioned between two pixel electrodes 324 adjacent to each other in one direction of the first direction and the second direction, while the extending portion 42 is positioned between two pixel electrodes 324 adjacent to each other in the other direction out of the first direction and the second direction. The connection electrode 340 constituted by a portion of the second transparent electrode film which is separate from the pixel electrode 324 is disposed as described above, and thus a short circuit to the pixel electrode 324 is avoided.

In addition, the spacer 330 is provided to protrude from a counter substrate 320 to a liquid crystal layer 322 side. The array substrate 321 is provided with the first flattening film 338 disposed on the lower layer side of the common electrode 325 and the second flattening film 339 disposed on the lower layer side of the alignment film 333 and on the upper layer side of the pixel electrode 324 and the connection electrode 340. The first flattening film 338 has a film thickness larger than that of the second interlayer insulating film 337 and is disposed to overlap the spacer 330, the common electrode 325 and the pixel electrode 324. The second flattening film 339 has a film thickness larger than that of the second interlayer insulating film 337 and is disposed to overlap the spacer 330 and the extending portion 42. In this manner, the second flattening film 339 is disposed to overlap the spacers 330, the extending portion 42, and the first flattening film 338. Thus, a portion of the alignment film 333 which overlaps the second flattening film 339 is disposed to protrude to the liquid crystal layer 322 side more than a portion that does not overlap the second flattening film 339 but overlaps the first flattening film 338. The spacer 330 protruding from the counter substrate 320 to the liquid crystal layer 322 side is received by a portion of the alignment film 333, provided in the array substrate 321, which overlaps the second flattening film 339 when external force is applied to the array substrate 321 or the counter substrate 320. Thereby, the deflection of the array substrate 321 or the counter substrate 320 can be regulated. Furthermore, since the second flattening film 339 is disposed on the upper layer side of the pixel electrode 324, the second flattening film 339 can protect the pixel electrode 324, the common electrode 325, and the extending portion 42 from force applied when the spacer 330 comes into contact with the portion of the alignment film 333 which overlaps the second flattening film 339. Thereby, the pixel electrode 324, the common electrode 325, and the extending portion 42 are less likely to be damaged. In particular, since the extending portion 42 is less likely to be damaged, a short circuit is less likely to occur between two pixel electrodes 324 adjacent to each other in the other direction out of the first direction and the second direction by the extending portion 42. In addition, the flatness of the second flattening film 339 overlapping the spacer 330 is high as compared to a case where the film thickness of one flattening film is partially different. Thereby, the spacer 330 can be stably received by the second flattening film 339.

Fifth Embodiment

A fifth embodiment will be described with reference to FIG. 24. In the fifth embodiment, changes of arrangement of a spacer 430 and the like and a configuration of a connection electrode 440 from the above-described fourth embodiment are described. Note that redundant descriptions of structures, actions, and effects similar to those of the second to fourth embodiments described above will be omitted.

Figure 24:
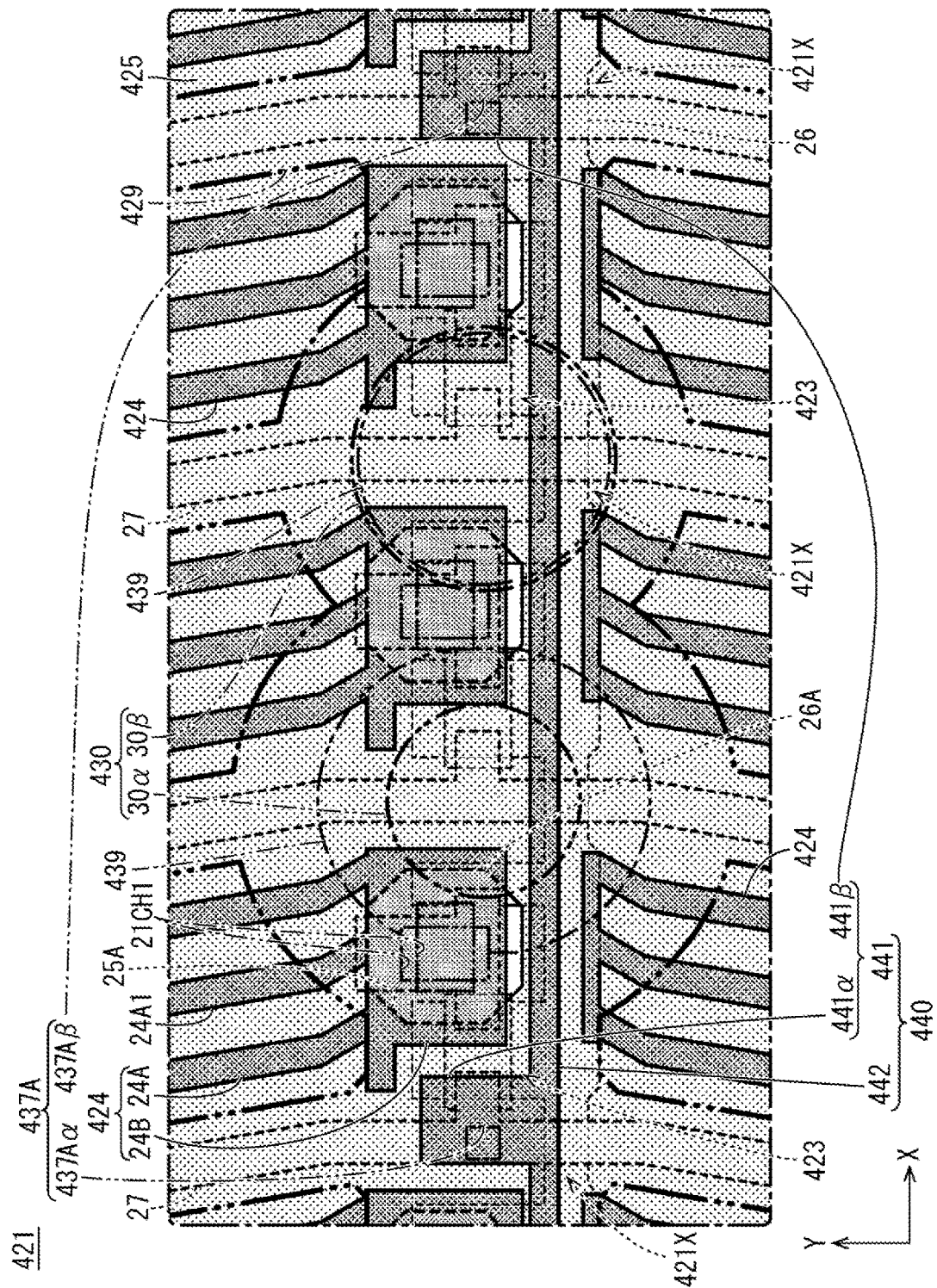
FIG. 24 is an enlarged plan view of the vicinity of a TFT (the same range as in FIG. 11) of an array substrate according to a fifth embodiment, and is a plan view illustrating a first transparent electrode film and second transparent electrode films with different levels of shading.

FIG. 24 is an enlarged plan view of the vicinity of a TFT 423 of an array substrate 421 (the same range as in FIG. 11), and is a plan view illustrating a first transparent electrode film (a common electrode 425 and the like) and second transparent electrode films (pixel electrodes 424 and the like) with different levels of shading. Further, in FIG. 24, a light blocking portion 429 and the spacer 430 are illustrated by a thick alternating two dots-dashed line, and the formation range of a second flattening film 439 is illustrated by a thin alternating two dots-dashed line.

As illustrated in FIG. 24, the plurality of spacers 430 according to the present embodiment include two spacers 430 disposed to overlap two intersections 421X that sandwich the pixel electrode 424 therebetween in the X-axis direction among the plurality of intersections 421X aligned in the X-axis direction. The two spacers 430 include one first spacer 430a and one second spacer 430B. In a second interlayer insulating film, two openings 437A are provided to overlap two intersections 421X that sandwich two intersections 421X overlapping the above-described two spacers 430 among the plurality of intersections 421X aligned in the X-axis direction. The two openings 437A include a first opening 437Aa positioned between two pixel electrodes 424 adjacent to each other in the X-axis direction and a second opening 437Aβ positioned between two pixel electrodes 424 adjacent to each other in the X-axis direction and disposed at a position spaced apart from the first opening 437Aa in the X-axis direction. Note that, in the following description, when the two openings 437A are distinguished from each other, a suffix "a" is appended to the reference numeral of the first opening, and a suffix "B" is appended to the reference numeral of the second opening, and when the openings 437A are collectively referred to without distinction, a suffix is not appended to a reference numeral.

The connection electrode 440 includes two electrode main bodies 441 disposed to respectively overlap the two openings 437A described above. The two electrode main bodies 441 include a first electrode main body 441a disposed to overlap the first opening 437Aa and a second electrode main body 441β disposed to overlap the second opening 437AB. Note that, in the following description, when the electrode main bodies 441 are distinguished from each other, a suffix "a" is appended to the reference numeral of the first electrode main body, and a suffix "B" is appended to the reference numeral of the second electrode main body, and when the electrode main bodies 441 are collectively referred to without distinction, a suffix is not appended to a reference numeral. The first electrode main body 441a is connected to the common electrode 425 through the overlapping first opening 437Aa. The second electrode main body 441B is connected to the common electrode 425 through the overlapping second opening 437AB. In addition, a common extending portion 442 is connected to the first electrode main body 441a and the second electrode main body 441B. In this manner, even when a connection failure occurs between one of the first electrode main body 441a and the second electrode main body 441B and the common electrode 425, the connection electrode 440 and the common electrode 425 are maintained in a connected state. That is, the redundancy of the connection electrode 440 is secured. Thereby, certainty that the function of the connection electrode 440 is exhibited is improved.

As described above, according to the present embodiment, the second interlayer insulating film includes the first opening 437Aa positioned between two pixel electrodes 424 adjacent to each other in one direction of the first direction and the second direction, and the second opening 437AB positioned between two pixel electrodes 424 adjacent to each other in one direction of the first direction and the second direction and disposed at a position spaced apart from the first opening 437Aa in one direction of the first direction and the second direction as the openings 437A. The connection electrode 440 includes the first electrode main body 441a disposed to overlap the first opening 437Aa and connected to the common electrode 425 through the first opening 437Aa, and the second electrode main body 441β disposed to overlap the second opening 437AB and connected to the common electrode 425 through the second opening 437AB as the electrode main bodies 441. The extending portion 442 is connected to the first electrode main body 441a and the second electrode main body 441B. In this manner, since the connection electrode 440 includes the first electrode main body 441a and the second electrode main body 441B connected to the extending portion 442, the connection electrode 440 and the common electrode 425 can be maintained in a connected state even when a connection failure occurs between any one of the first electrode main body 441a or the second electrode main body 441 and the common electrode 425. Thereby, certainty that the function of the connection electrode 440 is exhibited is improved.

Sixth Embodiment

A sixth embodiment will be described with reference to FIG. 25 to FIG. 28. In the sixth embodiment, changes of a configuration of a common electrode 525, and the like from the above-described fourth embodiment is described. Note that redundant descriptions of structures, actions, and effects similar to those of the second to fourth embodiments described above will be omitted.

Figure 25:
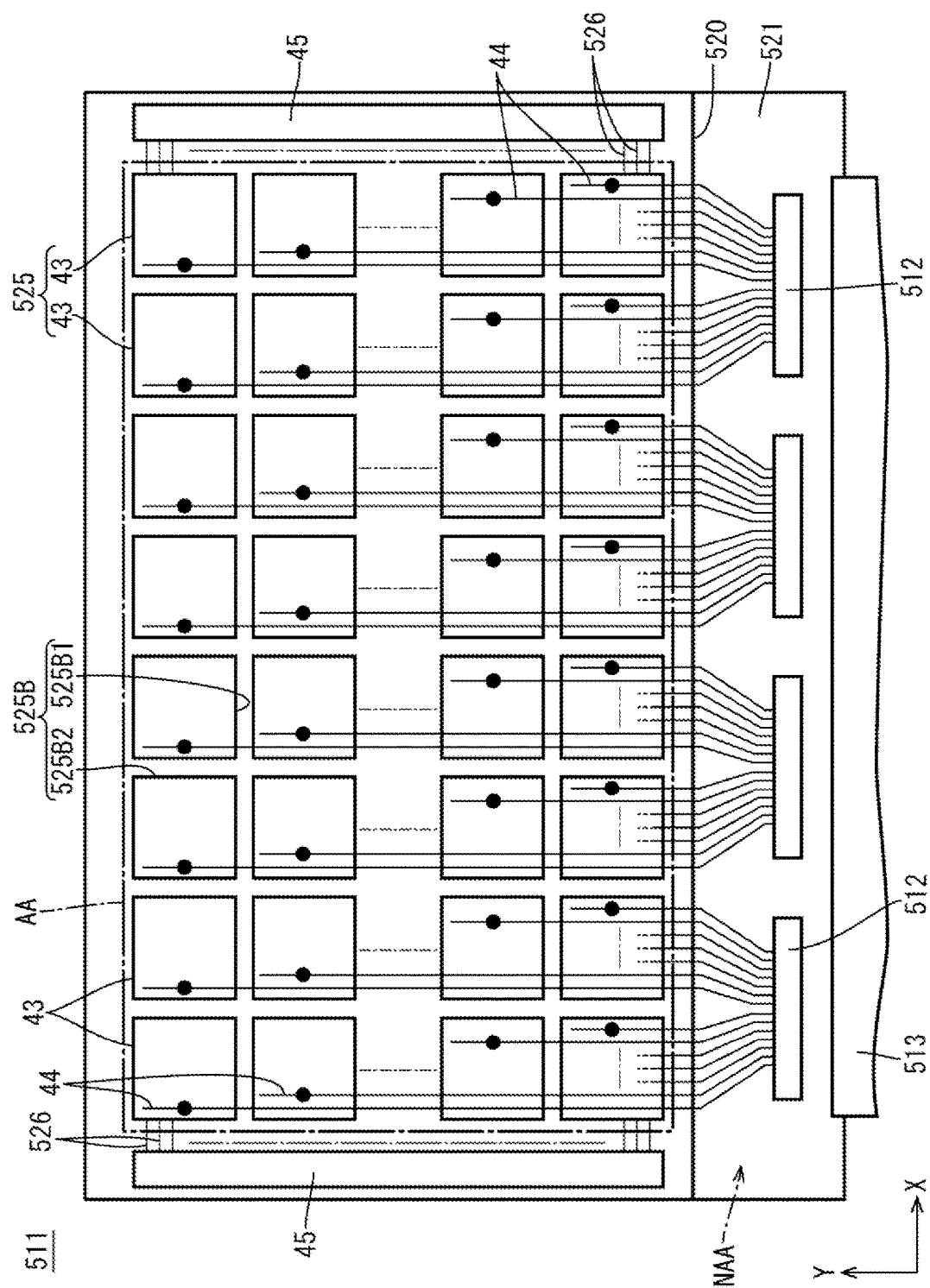
FIG. 25 is a plan view illustrating touch electrodes, touch wiring lines, and the like of a liquid crystal panel according to a sixth embodiment.

FIG. 25 is a plan view illustrating touch electrodes 43, touch wiring lines 44, and the like of a liquid crystal panel 511. As illustrated in FIG. 25, the liquid crystal panel 511 according to the present embodiment has a planar shape being a substantially rectangular shape which is horizontally long as a whole, and has a touch panel function (position detection function) of detecting a position where a user performs an input (input position) based on a displayed image, in addition to a display function of displaying an image. In the liquid crystal panel 511, a touch panel pattern for exhibiting the touch panel function is integrated (made in an in-cell form). The touch panel pattern is a so-called projected capacitance type, and the detection type thereof is a self-capacitance type. The touch panel pattern is constituted by a plurality of touch electrodes (position detection electrodes) 43 disposed side by side in a matrix in the plate surface of the liquid crystal panel 511. The touch electrodes 43 are disposed in the display region AA of the liquid crystal panel 511. Thus, the display region AA of the liquid crystal panel 511 substantially matches a touch region (position input region) in which an input position can be detected. Note that the non-display region NAA substantially matches a non-touch region (non-position input region) in which an input position cannot be detected. Then, when the user brings a position input member, which is a conductor such as a finger of the user or a touch pen operated by the user, close to the surface (display surface) of the liquid crystal panel 511 based on an image displayed in the display region AA of the liquid crystal panel 511, capacitance is formed between the position input member and the touch electrode 43. Thereby, the capacitance detected with the touch electrode 43 being close to the position input member changes as the position input member approaches thereto, and is different from the capacitance of the touch electrode 43 being far from the position input member. Based on the difference in capacitance, a detection circuit to be described below can detect an input position.

As illustrated in FIG. 25, the plurality of touch electrodes 43 are disposed side by side at intervals in the X-axis direction and the Y-axis direction in the display region AA. The touch electrode 43 has a substantially rectangular shape when viewed in a plan view, and one side thereof has a dimension of approximately several millimeters. The touch electrode 43 is much larger than the pixel PX described later when viewed in a plan view, and is disposed in a range over a plurality of (approximately several tens to several hundreds) pixels PX in the X-axis direction and the Y-axis direction. Note that specific numerical values such as the dimension of one side of the touch electrode 43 and the number of touch electrodes 43 installed in a touch region can be appropriately changed. Further, in the non-display region NAA of an array substrate 521, a pair of gate circuit portions 45 are provided to sandwich the display region AA therebetween from both sides in the X-axis direction. The gate circuit portion 45 supplies a scanning signal to a gate wiring line 526 and is monolithically provided in the array substrate 521.

As illustrated in FIG. 25, a plurality of touch wiring lines (position detection wiring lines) 44 provided in the liquid crystal panel 511 are selectively connected to the plurality of touch electrodes 43. The touch wiring lines 44 extend generally in the Y-axis direction. One end side portion of the touch wiring line 44 in the Y-axis direction is connected to a driver 512 in the non-display region NAA. The other end side portion of the touch wiring line 44 in the Y-axis direction is connected to a specific touch electrode 43 among the plurality of touch electrodes 43 aligned in the Y-axis direction in the display region AA. The formation range of the touch wiring line 44 in the Y-axis direction is limited to a range from the driver 512 to the touch electrode 43 to be connected thereto, and the touch wiring line 44 is not disposed on a side (the upper side in FIG. 1) opposite to the driver 512 side (the lower side in FIG. 1) of the touch electrode 43 to be connected thereto. Note that only one touch wiring line 44 may be connected to one touch electrode 43 depending on the number of touch wiring lines 44 installed, but a plurality of touch wiring lines 44 may be connected to one touch electrode 43. In addition, the number of touch wiring lines 44 connected to one touch electrode 43 may vary depending on the position of the touch electrode 43. In this case, for example, it is preferable that the number of touch wiring lines 44 connected to the touch electrode 43 far from the driver 512 be set to be larger than the number of touch wiring lines 44 connected to the touch electrode 43 close to the driver 512, but is not necessarily limited thereto.

Note that, in FIG. 25, connection points between the touch electrodes 43 and the touch wiring lines 44 are illustrated as black dots. Furthermore, the touch wiring lines 44 are connected to a detection circuit. The detection circuit may be provided in the driver 512, but may be provided outside the liquid crystal panel 511 through a flexible substrate 513.

The touch electrode 43 described above is constituted by the common electrode 525 as illustrated in FIG. 25. A slit 525B disposed to separate the adjacent touch electrodes 43 is formed in the common electrode 525. The slit 525B has a substantially lattice pattern as a whole when viewed in a plan view. The slit 525B is constituted by a first slit 525B1 that crosses the common electrode 525 over the entire length in substantially X-axis direction and a second slit 525B2 that crosses the common electrode 525 over the entire length in substantially Y-axis direction. The common electrode 525 is constituted by the plurality of touch electrodes 43 that are partitioned by the slit 525B in a substantially grid pattern when viewed in a plan view and are each electrically independent of the other. The touch electrodes 43 aligned in the Y-axis direction are partitioned by the first slit 525B1. The touch electrodes 43 aligned in the X-axis direction are partitioned by the second slit 525B2. Note that the first slit 525B1 is disposed to overlap the gate wiring line 526 to be described below. Additionally, the second slit 525B2 is disposed to overlap a source wiring line 527. A common potential signal related to the image display function and a touch signal (position detection signal) related to the touch panel function are supplied to the touch wiring line 44 connected to such a touch electrode 43 from the driver 512 in a time division manner. Timing at which the common potential signal is supplied from the driver 512 to the touch wiring line 44 is a display period. Timing at which the touch signal is supplied from the driver 512 to the touch wiring line 44 is a sensing period (position detection period). The common potential signal is transmitted to all of the touch wiring lines 44 at the same timing (display period), and thus all of the touch electrodes 43 are at the reference potential based on the common potential signal and thus function as the common electrode 525.

Figure 26:
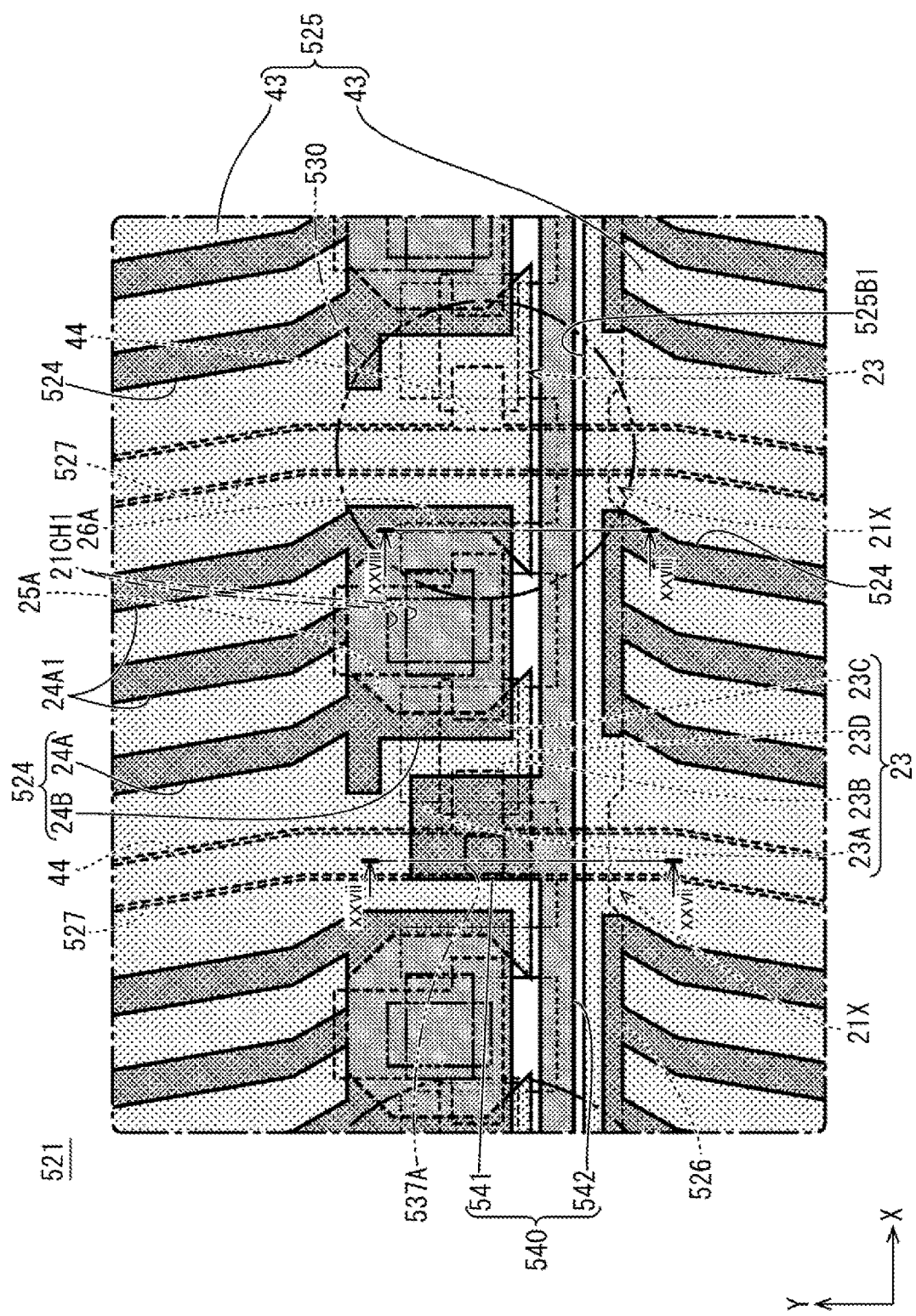
FIG. 26 is an enlarged plan view of the vicinity of a boundary between two touch electrodes adjacent to each other in a Y-axis direction in an array substrate, and is a plan view illustrating first transparent electrode films and second transparent electrode films with different levels of shading.
Figure 27:
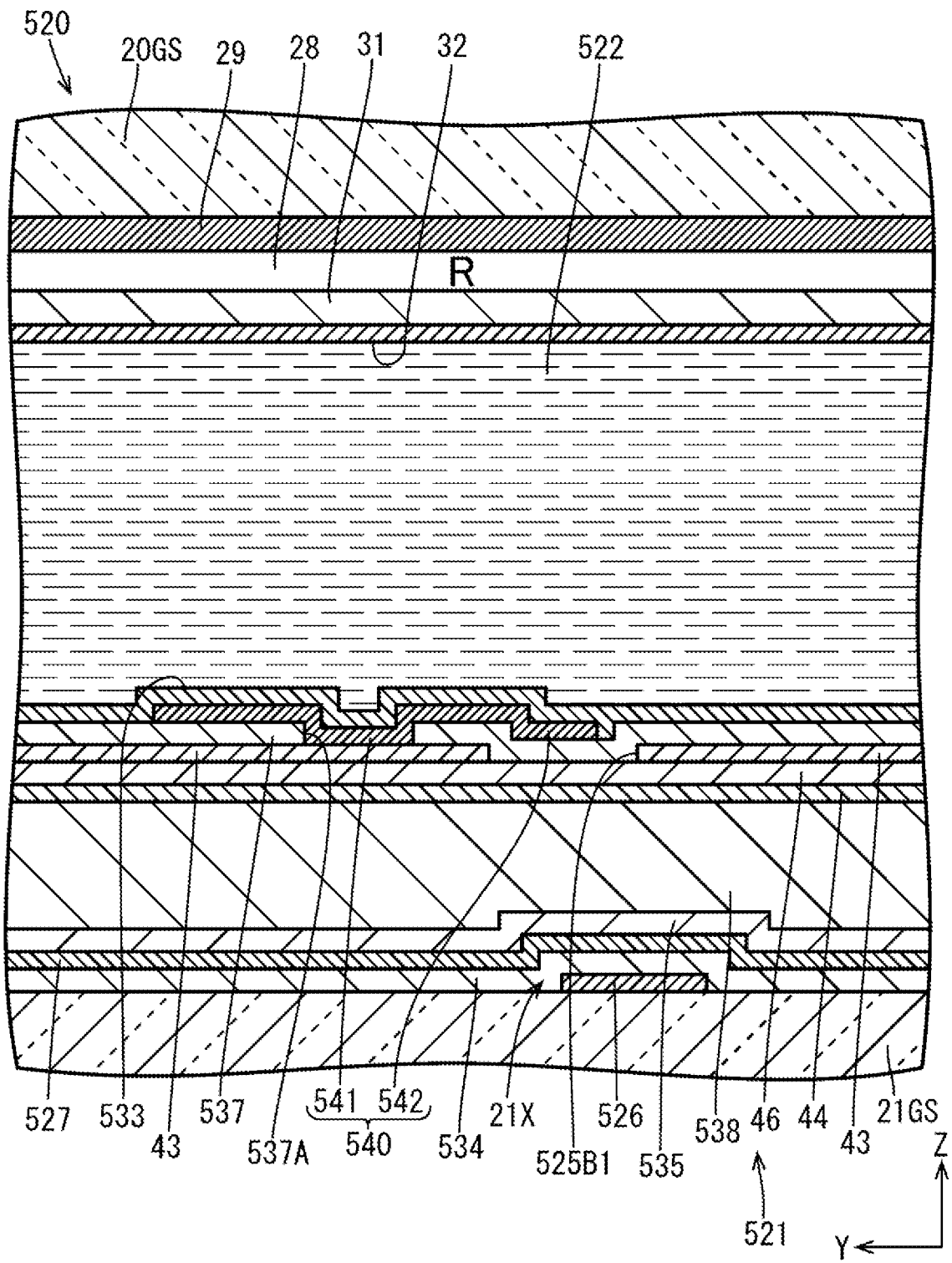
FIG. 27 is a cross-sectional view of a liquid crystal panel taken along line xxvii-xxvii in FIG. 26.
Figure 28:
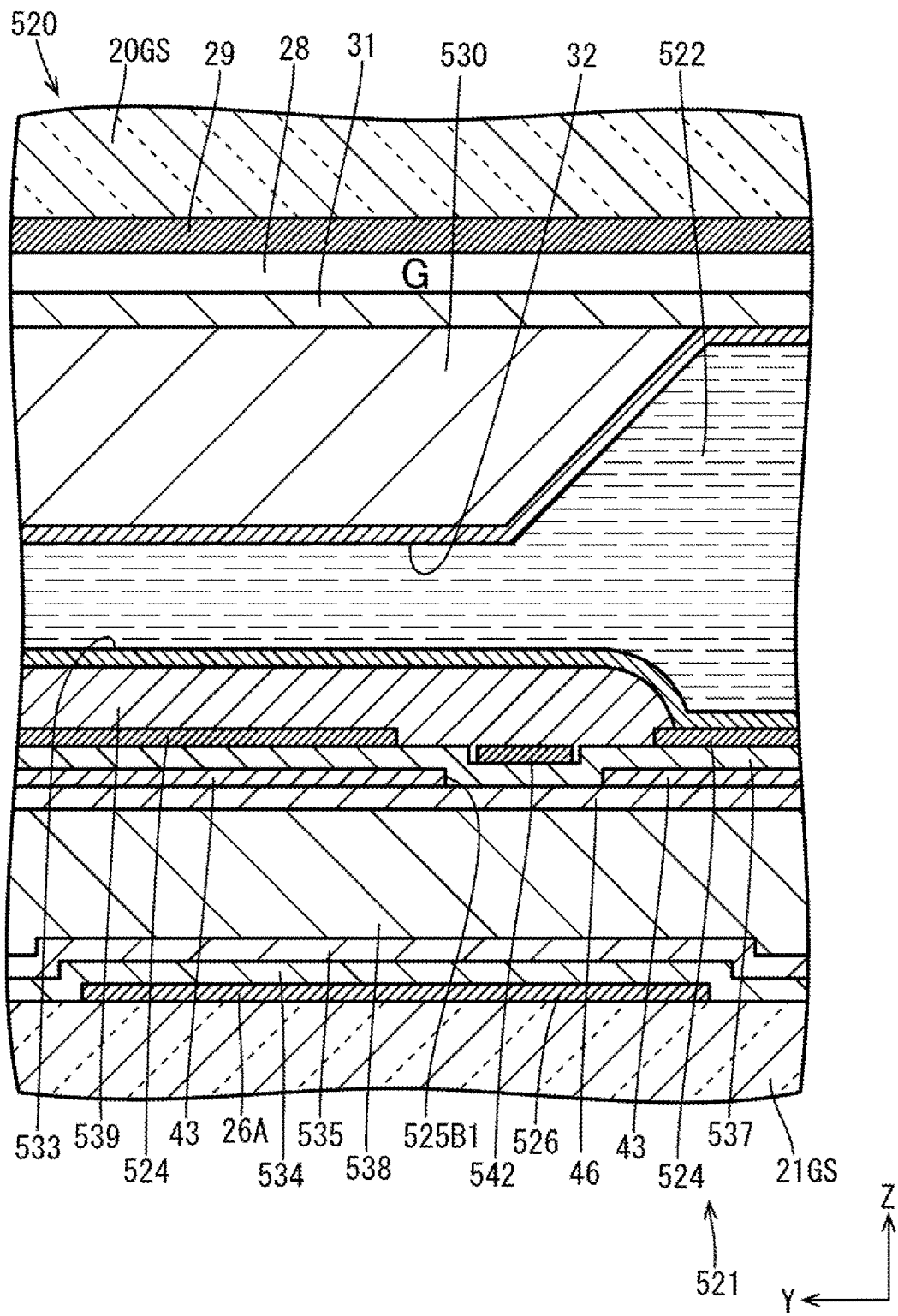
FIG. 28 is a cross-sectional view of the liquid crystal panel taken along line xxviii-xxviii in FIG. 26.

FIG. 26 is an enlarged plan view of the vicinity of a boundary between two touch electrodes 43 adjacent to each other in the Y-axis direction in the array substrate 521, and is a plan view illustrating first transparent electrode films (the common electrode 525 and the like) and second transparent electrode film (pixel electrodes 524 and the like) with different levels of shading. FIG. 27 is a cross-sectional view of the liquid crystal panel 511 taken along line xxvii-xxvii in FIG. 26. FIG. 28 is a cross-sectional view of the liquid crystal panel 511 taken along line xxviii-xxviii in FIG. 26. As illustrated in FIG. 26 and FIG. 27, the plurality of gate wiring lines 526 according to the present embodiment include the gate wiring line 526 disposed to overlap the first slit 525B1 separating two touch electrodes 43 adjacent to each other in the Y-axis direction. In the gate wiring line 526 overlapping the first slit 525B1, a minimum value of the line width thereof is greater than the width of the first slit 525B1. A plurality of connection electrodes 540 disposed in the plane of the array substrate 521 include the connection electrode 540 including an extending portion 542 positioned between two touch electrodes 43 adjacent to each other in the Y-axis direction. The extending portion 542 positioned between the two touch electrodes 43 adjacent to each other in the Y-axis direction is disposed to overlap each of the first slit 525B1 and the gate wiring line 526. The width of the extending portion 542 is smaller than the width of the first slit 525B1. The extending portion 542 is disposed such that the entire region thereof overlaps the first slit 525B1. An interval between one side edge portion out of a pair of side edge portions in the extending portion 542 and an edge portion facing the first slit 525B1 in one of the two touch electrodes 43 adjacent to each other in the Y-axis direction is substantially equal to an interval between the other side edge portion and an edge portion facing the first slit 525B1 in the other touch electrode 43.

Incidentally, as illustrated in FIG. 27, the gate wiring line 526 is constituted by a first metal film, and is thus disposed on the lower layer side than the common electrode 525 constituted by a first transparent electrode film. In the present embodiment, the first slit 525B 1 disposed to overlap the gate wiring line 526 is formed in the common electrode 525 positioned to be sandwiched between the gate wiring line 526 and the pixel electrode 524 in the Z-axis direction. For this reason, there is a possibility that an electrical field (parasitic capacitance) will be generated between the gate wiring line 526 positioned between two touch electrodes 43 adjacent to each other in the Y-axis direction and two pixel electrodes 524 adjacent to each other in the Y-axis direction through the first slit 525B1 of the common electrode 525. In this regard, the extending portion 542 of the connection electrode 540 constituted by a portion of the second transparent electrode film which is separate from the pixel electrode 524 is positioned between two touch electrodes 43 adjacent to each other in the Y-axis direction (first slit 525B1) and is disposed to overlap the gate wiring line 526. Thus, it is possible to block an electrical field that may be generated between the gate wiring line 526 and two pixel electrodes 524 adjacent to each other in the Y-axis direction. Thereby, disturbance of the alignment of the liquid crystal molecules contained in a liquid crystal layer 522 due to the electrical field described above is less likely to occur. In particular, in the present embodiment, a second flattening film 539 disposed at a position overlapping a spacer 530 is disposed to be sandwiched between the second transparent electrode film and an alignment film 533. Thus, the second flattening film 539 is positioned not to be sandwiched between the gate wiring line 526 constituted by a first metal film and the extending portion 542 of the connection electrode 540 constituted by a second transparent electrode film. According to this positional relationship, as compared to a configuration in which the second flattening film 539 is not provided, and the second thick film portion 36B of the flattening film 36 is disposed at a position overlapping the spacer 530 (see FIG. 7) as in the first embodiment, the extending portion 542 is disposed closer to the gate wiring line 526 by the film thickness of the second flattening film 539. Thereby, an electrical field that may be generated between the gate wiring line 526 and two pixel electrodes 524 adjacent to each other in the Y-axis direction can be favorably blocked by the extending portion 542.

Next, various films layered on the inner surface side of the array substrate 521 according to the present embodiment will be described with reference to FIG. 27 and FIG. 28. As illustrated in FIG. 27 and FIG. 28, in the array substrate 521, a third metal film is disposed on the upper layer side of a first flattening film 538. In addition, a third interlayer insulating film 46 is disposed on the lower layer side of a first transparent electrode film and on the upper layer side of the third metal film. Similarly to the first metal film and the second metal film, the third metal film is constituted by a single-layered film formed of one type of metal material selected from copper, titanium, aluminum, molybdenum, tungsten, and the like, or a layered film or an alloy formed of different types of metal materials. The third metal film constitutes the above-described touch wiring line 44 and the like. The touch wiring line 44 is disposed to overlap the source wiring line 527. Thereby, a decrease in the aperture ratio of the pixel PX associated with the installation of the touch wiring line 44 is suppressed.

As illustrated in FIG. 27 and FIG. 28, the third interlayer insulating film 46 is formed of an inorganic material such as silicon nitride ($SiN_x$) or silicon oxide ($SiO_2$), similarly to a gate insulating film 534, a first interlayer insulating film 535, and a second interlayer insulating film 537. The third interlayer insulating film 46 is sandwiched between the common electrode 525 constituted by the first transparent electrode film on the upper layer side and the touch wiring line 44 constituted by the third metal film on the lower layer side, and prevents an unintended short-circuit thereof. Note that a partial opening is provided in a region overlapping both the touch wiring line 44 and the touch electrode 43 to be connected to the touch wiring line 44 in the third interlayer insulating film 46. The touch wiring line 44 is connected to the touch electrode 43 to be connected thereto through the opening of the third interlayer insulating film 46.

As illustrated in FIG. 26 and FIG. 27, the extending portion 542 constituting the connection electrode 540 according to the present embodiment does not overlap any of the touch electrodes 43. On the other hand, an electrode main body 541 overlaps the touch electrodes 43 adjacent to the extending portion 542 connected to the electrode main body 541 on the upper side in FIG. 26, but does not overlap the touch electrodes 43 adjacent to the extending portion 542 on the lower side in FIG. 26. In the second interlayer insulating film 537, an opening 537A is provided at a position overlapping both the electrode main body 541 and the touch electrode 43 overlapping the electrode main body 541. In this manner, the electrode main body 541 overlaps the touch electrode 43 to be connected to the connection electrode 540, but the electrode main body 541 is disposed not to overlap the touch electrode 43 which is not to be connected to the connection electrode 540. Thereby, parasitic capacitance that may be generated between the connection electrode 540 and the touch electrode 43, which is not to be connected, is reduced, and thus an improvement in position detection sensitivity is achieved.

As described above, according to the present embodiment, the common electrode 525 includes a plurality of touch electrodes (position detection electrodes) 43 arranged side by side at intervals in the first direction and the second direction. The array substrate 521 is provided with the gate wiring line 526 which is positioned between two pixel electrodes 524 adjacent to each other in the second direction and extends in the first direction. The gate wiring line 526 is disposed on the lower layer side than the common electrode 525 and is positioned between two touch electrodes 43 adjacent to each other in the second direction. The extending portion 542 is positioned between two touch electrodes 43 adjacent to each other in the second direction and is disposed to overlap the gate wiring line 526. Since the gate wiring line 526 disposed on the lower layer side than the common electrode 525 is positioned between two touch electrodes 43 adjacent to each other in the second direction, there is a possibility that an electrical field will be generated between the gate wiring line 526 and two pixel electrodes 524 adjacent to each other in the second direction. In this regard, the extending portion 542 of the connection electrode 540 constituted by a portion of the second transparent electrode film which is separate from the pixel electrode 524 is positioned between two touch electrodes 43 adjacent to each other in the second direction and is disposed to overlap the gate wiring line 526. Thus, it is possible to block an electrical field that may be generated between the gate wiring line 526 and the two pixel electrodes 524 adjacent to each other in the second direction. Thereby, disturbance of the alignment of the liquid crystal molecules contained in the liquid crystal layer 522 due to the electrical field described above is less likely to occur.

In addition, the electrode main body 541 is disposed not to overlap one of the two touch electrodes 43 adjacent to each other in the second direction, is disposed to overlap the other touch electrode 43, and is connected to the other touch electrode 43. In this manner, the electrode main body 541 constituting the connection electrode 540 is disposed to overlap the other touch electrode 43 to be connected to the connection electrode 540 out of the two touch electrodes 43 adjacent to each other in the second direction, but is disposed not to overlap one touch electrode 43 which is not to be connected. Thereby, parasitic capacitance that may be generated between the connection electrode 540 and one touch electrode 43, which is not to be connected, is reduced, and thus an improvement in position detection sensitivity is achieved.

In addition, the spacer 530 is provided to protrude to the liquid crystal layer 522 side from a counter substrate 520. The array substrate 521 is provided with the first flattening film 538 disposed on the lower layer side of the common electrode 525, and the second flattening film 539 disposed on the lower layer side of the alignment film 533 and on the upper layer side of the pixel electrode 524 and the connection electrode 540. The first flattening film 538 has a film thickness larger than that of the second interlayer insulating film 537, is disposed to overlap the spacer 530, the common electrode 525, and the pixel electrode 524. The second flattening film 539 has a film thickness larger than that of the second interlayer insulating film 537 and is disposed to overlap the spacer 530 and the extending portion 542. The gate wiring line 526 is disposed on the lower layer side than the first flattening film 538. In this manner, the second flattening film 539 is disposed to overlap the spacer 530, the extending portion 542, and the first flattening film 538. Thus, a portion of the alignment film 533 which overlaps the second flattening film 539 is disposed to protrude to the liquid crystal layer 522 side more than the portion that does not overlap the second flattening film 539 but overlaps the first flattening film 538. The spacer 530 protruding to the liquid crystal layer 522 side from the counter substrate 520 is received by a portion of the alignment film 533, provided in the array substrate 521, which overlaps the second flattening film 539 when external force is applied to the array substrate 521 or the counter substrate 520. Thereby, the deflection of the array substrate 521 or the counter substrate 520 can be regulated. Furthermore, since the second flattening film 539 is disposed on the upper layer side of the pixel electrode 524, the second flattening film 539 can protect the pixel electrode 524, the common electrode 525, and the extending portion 542 from force applied when the spacer 530 comes into contact with a portion of the alignment film 533 which overlaps the second flattening film 539. Thereby, the pixel electrode 524, the common electrode 525, and the extending portion 542 are less likely to be damaged. In particular, since the extending portion 542 is less likely to be damaged, a short circuit is less likely to occur between two pixel electrodes 524 adjacent to each other in the other direction out of the first direction and the second direction by the extending portion 542. In addition, the flatness of the second flattening film 539 overlapping the spacer 530 is high as compared to a case where the film thickness of one flattening film is partially different. Thereby, the spacer 530 can be stably received by the second flattening film 539. In particular, since the second flattening film 539 is positioned not to be sandwiched between the gate wiring line 526, which is disposed on the lower layer side than the first flattening film 538, and the extending portion 542 of the connection electrode 540, and thus an electrical field that may be generated between the gate wiring line 526 and the two pixel electrodes 524 adjacent to each other in the second direction can be favorably blocked by the extending portion 542.

Seventh Embodiment

A seventh embodiment will be described with reference to FIG. 29 or FIG. 30. In the seventh embodiment, a configuration obtained by adding a connection electrode 640 described above in the fourth embodiment to the configuration described above in the first embodiment is described. Note that redundant descriptions of structures, actions, and effects similar to those of the first and fourth embodiments described above will be omitted.

Figure 29:
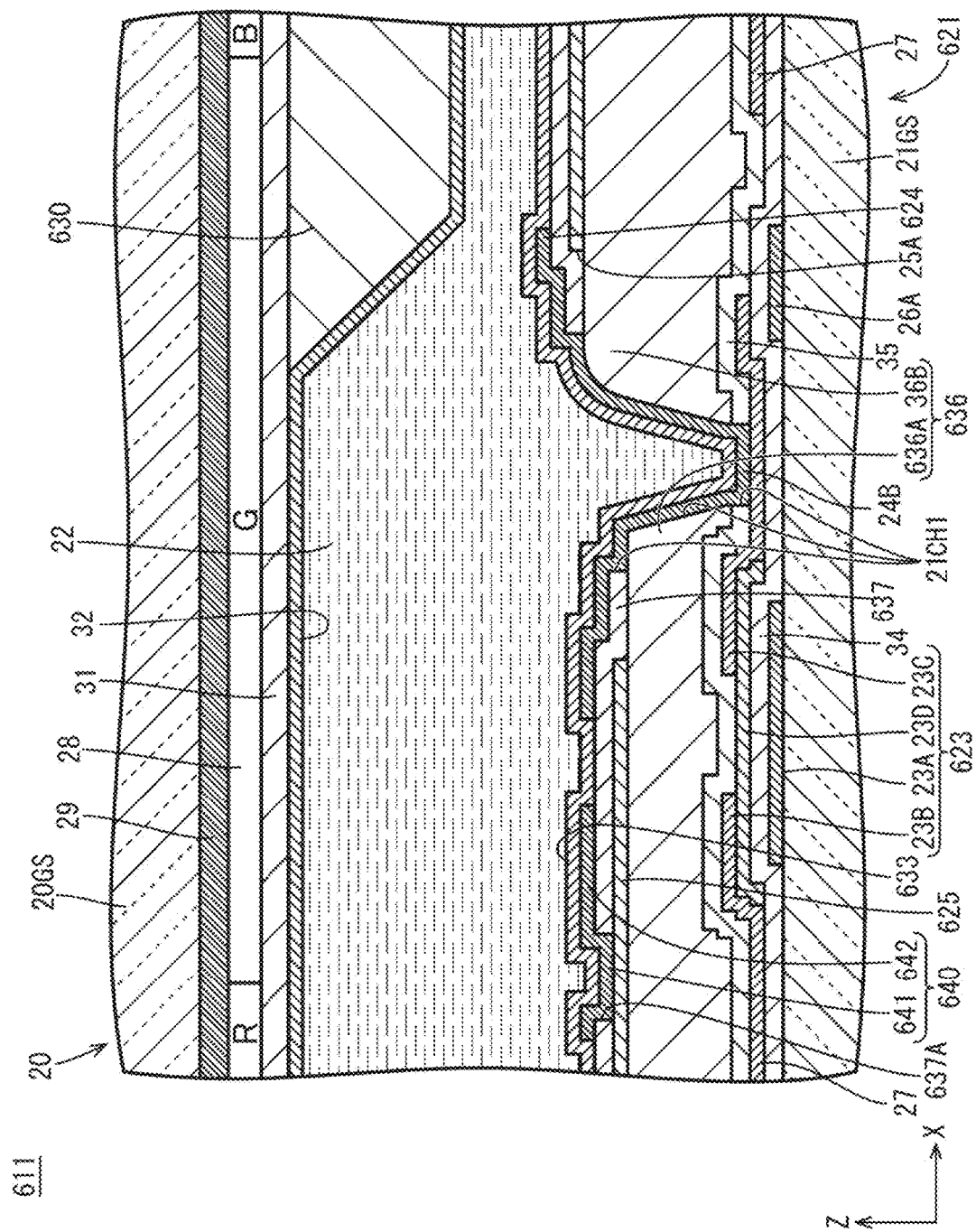
FIG. 29 is a cross-sectional view of a TFT and the vicinity of a second spacer (the same position as in FIG. 7) in a liquid crystal panel according to a seventh embodiment.
Figure 30:
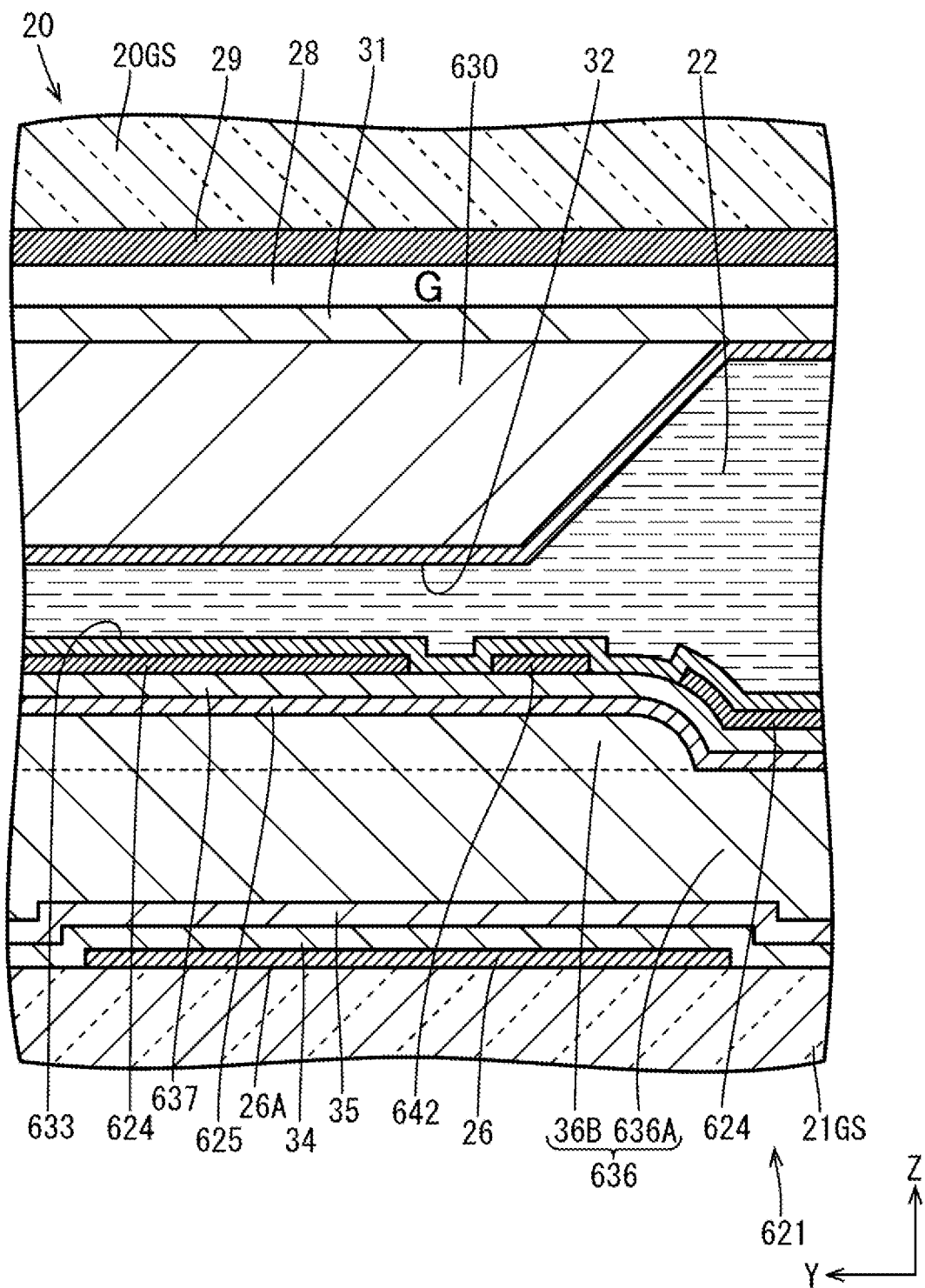
FIG. 30 is a cross-sectional view of pixel electrodes and the vicinity of an extending portion (the same position as in FIG. 23) in the liquid crystal panel.

FIG. 29 is a cross-sectional view of the vicinity of a TFT 623 and a second spacer 630β (the same position as in FIG. 7) in a liquid crystal panel 611. FIG. 30 is a cross-sectional view of the vicinity of pixel electrodes 624 and an extending portion 642 (the same position as in FIG. 23) in the liquid crystal panel 611. As illustrated in FIG. 29, an array substrate 621 according to the present embodiment is provided with a connection electrode 640 constituted by a second transparent electrode film. The connection electrode 640 is in contact with an alignment film 633 on the upper layer side. An electrode main body 641 constituting the connection electrode 640 is connected to a common electrode 625 through an opening 637A of a second interlayer insulating film 637 on the lower layer side. Thereby, charge on the surface and inside the alignment film 633 can be allowed to flow to the common electrode 625 through the connection electrode 640. The electrode main body 641 is disposed not to overlap a spacer 630, but is disposed to overlap a first thick film portion 636A of a flattening film 636.

In the present embodiment, a second flattening film 39 (see FIG. 16) is not sandwiched between the alignment film 633 and the second transparent electrode film, as in the second to sixth embodiments described above. Thus, as illustrated in FIG. 30, the extending portion 642 constituting the connection electrode 640 according to the present embodiment is brought into contact with the alignment film 633 even at a position overlapping the spacer 630. The extending portion 642 is in contact with the alignment film 633 over the entire length, and a contact area with the alignment film 633 is maximized. Thereby, charge is less likely to remain in the alignment film 633.

Other Embodiments

The techniques disclosed in the present specification are not limited to the embodiments described above and illustrated in the drawings, and the following embodiments, for example, are also included within the technical scope.

(1) specific planar arrangements (array patterns) of the openings 37A, 237A, 337A, 437A, 537A, and 637A of the second interlayer insulating films 37, 137, 237, 337, 537, and 637, and the spacers 30, 130, 230, 330, 430, 530, and 630, the number of openings installed, the number of spacers installed, and the like can be appropriately changed other than those illustrated in the drawings. For example, the intersections 21X and 421X between the gate wiring lines 26 and 526 and the source wiring lines 27, 227, 327, and 527 may include intersections 21X and 421X that do not overlap the spacers 30, 130, 230, 330, 430, 530, and 630 and do not have the openings 37A, 237A, 337A, 437A, 537A, and 637A of the second interlayer insulating films 37, 137, 237, 337, 537, and 637 provided in the vicinities thereof.

(2) The openings 37A, 237A, 337A, 437A, 537A, and 637A of the second interlayer insulating films 37, 137, 237, 337, 537, and 637 may be disposed at positions overlapping the intersections 21X and 421X between the gate wiring lines 26 and 526 and the source wiring lines 27, 227, 327, and 527 (intersections between the first light blocking portion 29A and the second light blocking portion 29B).

(3) The openings 37A, 237A, 337A, 437A, 537A, and 637A of the second interlayer insulating films 37, 137, 237, 337, 537, and 637 may be disposed at positions that do not overlap the second light blocking portion 29B but overlap the first light blocking portion 29A. In addition, the openings 37A, 237A, 337A, 437A, 537A, and 637A of the second interlayer insulating films 37, 137, 237, 337, 537, and 637 may be disposed at positions that do not overlap the first light blocking portion 29A but overlap the second light blocking portion 29B. In addition, the openings 37A, 237A, 337A, 437A, 537A, and 637A of the second interlayer insulating films 37, 137, 237, 337, 537, and 637 may be disposed at positions that do not overlap the first light blocking portion 29A and the second light blocking portion 29B but overlap the third light blocking portion 29C.

(4) The light blocking portions 29 and 429 may be disposed such that the entire region of the third light blocking portion 29C does not overlap the spacers 30, 130, 230, 330, 430, 530, and 630.

(5) The light blocking portions 29 and 429 may be provided in the array substrates 21, 121, 221, 321, 421, 521, and 621. Furthermore, the light blocking portions 29 and 429 may be provided on both the counter substrates 20, 120, 320, and 520 and the array substrates 21, 121, 221, 321, 421, 521, and 621.

(6) As described above in (5), when at least parts of the light blocking portions 29 and 429 are provided in the array substrates 21, 121, 221, 321, 421, 521, and 621, the color filter 28 may also be provided in the array substrates 21, 121, 221, 321, 421, 521, and 621.

(7) The light blocking portions 29 and 429 may not include the third light blocking portion 29C. Further, the light blocking portions 29 and 429 may not include the second light blocking portion 29B.

(8) The ratio of the number of first spacers 30 to the number of second spacers 30β, 130β, and 230β included in the spacers 30, 130, 230, 330, 430, 530, and 630 can be appropriately changed other than those illustrated in the drawings.

(9) The spacers 30, 130, 230, 330, 430, 530, and 630 may include only the first spacer 30α without including the second spacers 30β, 130β, and 230β. In contrast, the spacers 30, 130, 230, 330, 430, 530, and 630 may include only the second spacers 30β, 130β, and 230β without including the first spacer 30α.

(10) The spacers 30, 130, 230, 330, 430, 530, and 630 may be provided in the array substrates 21, 121, 221, 321, 421, 521, and 621.

(11) In the photomask 10P used at the time of exposing the flattening film 36, the semi-transmissive film 10P3 may not be formed in a range where the semi-transmissive film 10P3 overlaps the light blocking film 10P2.

(12) The photomask 10P used at the time of exposing the flattening film 36 may be a so-called gray tone mask. The gray tone mask includes the semi-transmissive region 10HTA by forming a slit having a width equal to or less than the resolution of the exposure device in a portion of a light blocking film formed on a plate surface of a transparent substrate.

(13) A negative photosensitive material can also be used as the materials of the flattening films 36 and 636. Similarly, a negative photosensitive material can be used as the materials of the first flattening films 38, 338, and 538 and the second flattening films 39, 239, 339, 439, and 539.

(14) The connection electrodes 40, 440, and 540 described in the third, fifth, and sixth embodiments can also be added to the configuration described in the first embodiment. In particular, when the connection electrodes 440 and 540 described in the fifth and sixth embodiments are added to the configuration described in the first embodiment, an effect of increasing contact areas between the connection electrodes 440 and 540 and the alignment film 533 can be obtained.

(15) specific planar arrangements (array patterns) of the connection electrodes 40, 340, 440, 540, and 640 described in the third to seventh embodiments, the number of connection electrodes installed, and the like can be appropriately changed other than those illustrated in the drawings. In short, planar arrangements of the connection electrodes 40, 340, 440, 540, and 640, the number of connection electrodes installed, and the like can be changed in accordance with the planar arrangements of the openings 237A, 337A, 437A, 537A, and 637A of the second interlayer insulating films 237, 337, 537, and 637, the number of openings installed, and the like.

(16) In the configurations described in the third to seventh embodiments, the second interlayer insulating films 237, 337, 537, and 637 may include the openings 237A, 337A, 437A, 537A, and 637A that are disposed not to overlap the connection electrodes 40, 340, 440, 540, and 640.

(17) As a modification example of the fourth and fifth embodiments, the extending portions 42 and 442 of the connection electrodes 340 and 440 may be disposed to overlap the source wiring line 327. Additionally, the connection electrodes 340 and 440 may include a first extending portion that overlaps the gate wiring line 526 and a second extending portion that overlaps the source wiring line 327 as the extending portions 42 and 442.

(18) As a modification example of the fifth embodiment, the connection electrode 440 may include three or more electrode main bodies 41, 441, 541, and 641. In this case, three or more electrode main bodies 41, 441, 541, and 641 may be connected to the common extending portion 442.

(19) The arrangement of the spacer 430 described in the fifth embodiment can also be applied to the configurations described in the first, second, third, fourth, sixth, and seventh embodiments. In contrast, the arrangement of the spacers 30, 130, 230, 330, 530, and 630 described in the first, second, third, fourth, sixth, and seventh embodiments can also be applied to the configuration described in the fifth embodiment.

(20) The touch electrode 43 and the touch wiring line 44 described in the sixth embodiment can also be added to the configurations described in the first and seventh embodiments.

(21) As a modification example of the sixth embodiment, all of the touch wiring lines 44 may extend to the touch electrode 43 furthest from the driver 512 in the Y-axis direction. In this case, all of the touch wiring lines 44 may have equal lengths.

(22) As a modification example of the sixth embodiment, the touch electrode 43 may be provided with an opening at a position overlapping the touch wiring line 44. Thereby, a decrease in parasitic capacitance that may be generated between the touch electrode 43 and the touch wiring line 44 that is not connected to the touch electrode 43 is achieved.

(23) The second flattening films 239, 339, 439, and 539 described in the second to sixth embodiments may be positioned on the lower layer side of the first transparent electrode film and on the upper layer sides of the first flattening films 338 and 538.

(24) A positional relationship between the TFTs 23, 123, 223, 323, 423, and 623, the pixel electrodes 24, 124, 224, 324, 424, 524, and 624, and the gate wiring lines 26 and 526 in the Y-axis direction can be appropriately changed other than those illustrated in the drawings. For example, the TFTs 23, 123, 223, 323, 423, and 623 may be positioned to overlap the gate wiring lines 26 and 526 in the Y-axis direction.

(25) The alignment films 33, 133, 233, 333, 533, and 633 are not limited to a type in which photo-alignment treatment is performed, and may be a type in which rubbing treatment is performed.

(26) Specific planar shapes of the pixel electrodes 24, 124, 224, 324, 424, 524, and 624 can be appropriately changed other than those illustrated in the drawings. The planar shapes of the pixel electrode main bodies 24A of the pixel electrodes 24, 124, 224, 324, 424, 524, and 624 may be, for example, a rectangle, a parallelogram, or the like.

(27) The patterns of the gate wiring lines 26 and 526 and the source wiring lines 27, 227, 327, and 527 when viewed in a plan view can be appropriately changed. For example, the gate wiring lines 26 and 526 may extend obliquely to be repeatedly bent in the middle without extending linearly. In addition, the source wiring lines 27, 227, 327, and 527 may extend linearly in the Y-axis direction. In addition, the gate wiring lines 26 and 526, and the source wiring lines 27, 227, 327, and 527 may all extend obliquely to be repeatedly bent in the middle without extending linearly. Further, the gate wiring lines 26 and 526, and the source wiring lines 27, 227, 327, and 527 may extend linearly.

(28) The common electrodes 25, 125, 225, 325, 425, 525, and 625 may be positioned on the upper layer sides of the second interlayer insulating films 37, 137, 237, 337, 537, and 637, and the pixel electrodes 24, 124, 224, 324, 424, 524, and 624 may be positioned on the lower layer sides of the second interlayer insulating films 37, 137, 237, 337, 537, and 637. In other words, the first transparent electrode film may constitute the pixel electrodes 24, 124, 224, 324, 424, 524, and 624, and the second transparent electrode film may constitute the common electrodes 25, 125, 225, 325, 425, 525, and 625. In this case, the array substrates 21, 121, 221, 321, 421, 521, and 621 are provided with insulating films positioned on the upper layer sides of the common electrodes 25, 125, 225, 325, 425, 525, and 625 and on the lower layer sides of the alignment films 33, 133, 233, 333, 533, and 633, and the insulating films are provided with openings for connecting the common electrodes 25, 125, 225, 325, 425, 525, and 625 to the alignment films 33, 133, 233, 333, 533, and 633 directly or via other members.

(30) The TFTs 23, 123, 223, 323, 423, and 623 may be a bottom gate type in addition to a top gate type.

(31) The semiconductor film may be an amorphous silicon thin film, an oxide semiconductor thin film, or the like.

(32) The plate surfaces of the liquid crystal panels 11, 111, 211, 511, and 611 may be curved.

(33) The display modes of the liquid crystal panels 11, 111, 211, 511, and 611 may be an IPS mode or the like.

(34) The planar shapes of the liquid crystal panels 11, 111, 211, 511, and 611 may be square, circular, semi-circular, elliptical, oval, trapezoidal, or the like.

(35) The liquid crystal panels 11, 111, 211, 511, and 611 may be a reflective type or a semi-transmissive type, in addition to a transmissive type.

(36) Conductive films sandwiched between the common electrodes 25, 125, 225, 325, 425, 525, and 625 (first transparent electrode films) and the second interlayer insulating films 37, 137, 237, 337, 537, and 637 can be provided, and other members disposed to overlap the openings 37A, 237A, 337A, 437A, 537A, and 637A of the second interlayer insulating films 37, 137, 237, 337, 537, and 637 can also be constituted by the conductive films. The entire region of the other members is in contact with the common electrodes 25, 125, 225, 325, 425, 525, and 625. The alignment films 33, 133, 233, 333, 533, and 633 on the upper layer sides are connected to the other members through the openings 37A, 237A, 337A, 437A, 537A, and 637A of the second interlayer insulating films 37, 137, 237, 337, 537, and 637. The alignment films 33, 133, 233, 333, 533, and 633 are indirectly connected to the common electrodes 25, 125, 225, 325, 425, 525, and 625 through the other members.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A liquid crystal panel comprising:
an array substrate;
a counter substrate disposed facing the array substrate; and
a liquid crystal layer sandwiched between the array substrate and the counter substrate,
wherein:
the array substrate is provided with a plurality of pixel electrodes aligned at intervals in a plane of the array substrate, a common electrode disposed such that to overlap the plurality of pixel electrodes, an insulating film disposed on an upper layer side of the common electrode, and an alignment film disposed on an upper layer side of the insulating film,
a light blocking portion and a spacer are provided in at least one of the array substrate and the counter substrate, the light blocking portion separating the plurality of pixel electrodes, the spacer being disposed such that to overlap the light blocking portion and protruding toward a liquid crystal layer side from the at least one of the array substrate and the counter substrate,
the alignment film is connected to the common electrode directly or via another member through an opening provided in the insulating film,
the opening is disposed at a position that does not overlap the spacer and that overlaps the light blocking portion in the insulating film,
each of the plurality of pixel electrodes is disposed on a lower layer side of the alignment film and on the upper layer side of the insulating film,
each of the plurality of pixel electrodes includes a first portion of a transparent electrode film,
the array substrate is further provided with a connection electrode as the other member, the connection electrode including a second portion of the transparent electrode film which is separate from each of the plurality of pixel electrodes, the connection electrode is in contact with the alignment film and is connected to the common electrode through the opening,
the plurality of pixel electrodes is disposed side by side, at intervals, in a first direction and a second direction intersecting the first direction, and
the connection electrode further includes an electrode main body positioned between two pixel electrodes of the plurality of pixel electrodes adjacent to each other in one direction of the first direction and the second direction and connected to the common electrode through the opening, and an extending portion positioned between another two pixel electrodes of the plurality of pixel electrodes adjacent to each other in the other direction of the first direction and the second direction and extending from the electrode main body.

2. The liquid crystal panel according to claim 1,
wherein:
the array substrate is further provided with a plurality of thin film transistors aligned at intervals in the first direction and the second direction, a plurality of first wiring lines extending in the first direction and aligned at intervals in the second direction, and a plurality of second wiring lines extending in the second direction to intersect each of the plurality of first wiring lines and aligned at intervals in the first direction,
the plurality of pixel electrodes is connected to the plurality of thin film transistors,
each of the plurality of first wiring lines is connected to a first portion of the plurality of thin film transistors aligned in the first direction,
each of the plurality of second wiring lines are connected to a second portion of the plurality of thin film transistors aligned in the second direction,
each of a plurality of spacers, including the spacer, is disposed such that to overlap an intersection of a plurality of intersections between a first wiring line of the plurality of first wiring lines and a second wiring line of the plurality of second wiring lines, and a number of the plurality of spacers is smaller than a number of the plurality of intersections, and
each of a plurality of openings, including the opening, overlapping at least one of the first wiring line and the second wiring line, is disposed such that to be aligned with the spacer in at least one of the first direction and the second direction, and a number of the plurality of openings is equal to or less than a number obtained by subtracting the number of the plurality of spacers from the number of the plurality of intersections.

3. The liquid crystal panel according to claim 2,
wherein the number of the plurality of openings is equal to the number obtained by subtracting the number of the plurality of spacers from the number of the plurality of intersections.

4. The liquid crystal panel according to claim 2,
wherein each of the plurality of spacers is disposed for the intersection, among the plurality of intersections, aligned in the first direction, and is disposed for the intersection, among the plurality of intersections, aligned in the second direction.

5. The liquid crystal panel according to claim 2,
wherein the light blocking portion includes:

a first light blocking portion extending in the first direction and overlapping a thin film transistor of the plurality of thin film transistors, the first wiring line, the spacer, and the opening, and a second light blocking portion extending in the second direction, overlapping the second wiring line, and having a width smaller than a width of the first light blocking portion.

6. The liquid crystal panel according to claim 1, wherein the opening includes a first opening and a second opening, the first opening being positioned between the two pixel electrodes adjacent to each other in the one direction of the first direction and the second direction, the second opening being positioned between the two pixel electrodes adjacent to each other in the one direction of the first direction and the second direction and disposed at a position spaced apart from the first opening in the one direction of the first direction and the second direction, the electrode main body includes a first electrode main body and a second electrode main body, the first electrode main body being disposed such that to overlap the first opening and connected to the common electrode through the first opening, the second electrode main body being disposed such that to overlap the second opening and connected to the common electrode through the second opening, and the extending portion is connected to the first electrode main body and the second electrode main body.

7. The liquid crystal panel according to claim 1, wherein the spacer is provided to protrude toward the liquid crystal layer side from the counter substrate, the array substrate is further provided with a first flattening film disposed on a lower layer side of the common electrode, and a second flattening film disposed on the lower layer side of the alignment film and on upper layer sides of each of the plurality of pixel electrodes and the connection electrode, the first flattening film has a film thickness larger than a film thickness of the insulating film and the first flattening film is disposed such that to overlap the spacer, the common electrode, and each of the plurality of pixel electrodes, and the second flattening film has a film thickness larger than the film thickness of the insulating film and the second flattening film is disposed such that to overlap the spacer and the extending portion.

8. The liquid crystal panel according to claim 1, wherein the common electrode includes a plurality of position detection electrodes disposed side by side at intervals in the first direction and the second direction, the array substrate is further provided with a first wiring line, positioned between the other two pixel electrodes adjacent to each other in the second direction, extending in the first direction, the first wiring line is disposed on a lower layer side than the common electrode and positioned between two position detection electrodes of the plurality of position detection electrodes adjacent to each other in the second direction, and the extending portion is further positioned between the two position detection electrodes adjacent to each other in the second direction and disposed such that to overlap the first wiring line.

9. The liquid crystal panel according to claim 8, wherein the electrode main body is disposed not to overlap one of the two position detection electrodes adjacent to each other in the second direction, is disposed such that to overlap the other position detection electrode of the two position detection electrodes, and is connected to the other position detection electrode of the two position detection electrodes.

10. The liquid crystal panel according to claim 8, wherein the spacer is provided to protrude toward the liquid crystal layer side from the counter substrate, the array substrate is further provided with a first flattening film disposed on a lower layer side of the common electrode, and a second flattening film disposed on the lower layer side of the alignment film and on upper layer sides of each of the plurality of pixel electrodes and the connection electrode, the first flattening film has a film thickness larger than a film thickness of the insulating film and the first flattening film is disposed such that to overlap the spacer, the common electrode, and each of the plurality of pixel electrodes, the second flattening film has a film thickness larger than the film thickness of the insulating film and the second flattening film is disposed such that to overlap the spacer and the extending portion, and the first wiring line is further disposed on a lower layer side than the first flattening film.

11. The liquid crystal panel according to claim 1, wherein the spacer is provided to protrude toward the liquid crystal layer side from the counter substrate, the array substrate is further provided with a first flattening film disposed on a lower layer side of the common electrode, and a second flattening film disposed on the lower layer side of the alignment film and on an upper layer side of each of the plurality of pixel electrodes, the first flattening film has a film thickness larger than a film thickness of the insulating film and the first flattening film is disposed such that to overlap the spacer, the common electrode, and each of the plurality of pixel electrodes, and the second flattening film has a film thickness larger than the film thickness of the insulating film and the second flattening film is disposed such that to overlap the spacer.

12. A liquid crystal panel comprising:

an array substrate;

a counter substrate disposed facing the array substrate; and a liquid crystal layer sandwiched between the array substrate and the counter substrate, wherein:

the array substrate is provided with a plurality of pixel electrodes aligned at intervals in a plane of the array substrate, a common electrode disposed such that to overlap the plurality of pixel electrodes, an insulating film disposed on an upper layer side of the common electrode, and an alignment film disposed on an upper layer side of the insulating film, a light blocking portion and a spacer are provided in at least one of the array substrate and the counter substrate, the light blocking portion separating the plurality of pixel electrodes, the spacer being disposed such that to overlap the light blocking portion and protruding toward a liquid crystal layer side from the counter substrate, the alignment film is connected to the common electrode directly or via another member through an opening provided in the insulating film, the opening is disposed at a position that does not overlap the spacer and that overlaps the light blocking portion in the insulating film, each of the plurality of pixel electrodes is disposed on a lower layer side of the alignment film and on the upper layer side of the insulating film, the array substrate is further provided with a flattening film disposed on a lower layer side of the common electrode, the flattening film includes a first thick film portion and a second thick film portion, the first thick film portion has a film thickness larger than a film thickness of the insulating film, being disposed not to overlap the spacer, and being disposed such that to overlap the common electrode and each of the plurality of pixel electrodes, and the second thick film portion has a film thickness larger than the film thickness of the first thick film portion and being disposed such that to overlap the spacer.

* * * * *